(12) United States Patent
Seaman et al.

(10) Patent No.: US 7,855,448 B2
(45) Date of Patent: *Dec. 21, 2010

(54) OPTIMIZATION OF ROUTING LAYERS AND BOARD SPACE REQUIREMENTS FOR BALL GRID ARRAY PACKAGE IMPLEMENTATIONS INCLUDING ARRAY CORNER CONSIDERATIONS

(75) Inventors: Kevin L. Seaman, Santa Margarita, CA (US); Vernon M. Wnek, Yorba Linda, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/951,914

(22) Filed: Sep. 29, 2004

(65) Prior Publication Data

US 2005/0044517 A1 Feb. 24, 2005

Related U.S. Application Data

(62) Division of application No. 10/650,975, filed on Aug. 29, 2003.

(60) Provisional application No. 60/449,562, filed on Feb. 25, 2003.

(51) Int. Cl.
*H01L 23/48* (2006.01)

(52) U.S. Cl. .................. 257/692; 257/690; 257/698; 257/738; 257/780

(58) Field of Classification Search ......... 438/611–614; 257/690, 692, 698, 738, 780; 174/261; 361/792
See application file for complete search history.

(56) References Cited

U.S. PATENT DOCUMENTS 5,729,894 A 3/1998 Fulcher et al.

(Continued)

FOREIGN PATENT DOCUMENTS

EP 0 100 657 2/1984

(Continued)

OTHER PUBLICATIONS

"V54C3256164VBUC/T Low Power 256Mbit SDRAM 3.3 Volt, 54-Ball SOC BGA 43-PIN TSOPII X 16," *Mosel Vitelic Corp.*, Rev. 1.1 Feb. 2003, pp. 1-45.

(Continued)

*Primary Examiner*—Ori Nadav
(74) *Attorney, Agent, or Firm*—Sterne, Kessler, Goldstein & Fox P.L.L.C.

(57) ABSTRACT

A method and apparatus for improved contact pad arrays and land patterns for integrated circuit packages are presented. A plurality of conductive pads are arranged in an array of rows and columns. At least one edge of a perimeter of the array is not fully populated with conductive pads. Spaces created in the edge by missing conductive pads create additional routing channels for signals from conductive pads within the array to be routed external to the array through the edge. A land pattern may have routing channels on one or more layers of a printed circuit board. In such a multi-layer land pattern, spaces can be created in edges on any number of the layers. Furthermore, corner pad arrangements having known routing channel characteristics can be used in any number of corners of a land pattern that incorporates spaces in an edge.

18 Claims, 50 Drawing Sheets

U.S. PATENT DOCUMENTS

| | | | |
|---|---|---|---|
| 6,150,729 | A | 11/2000 | Ghahghahi |
| 6,194,668 | B1 | 2/2001 | Horiuchi et al. |
| 6,229,099 | B1 * | 5/2001 | Horiuchi et al. ............ 174/261 |
| 6,285,560 | B1 | 9/2001 | Lyne |
| 6,323,434 | B1 | 11/2001 | Kurita et al. |
| 6,489,574 | B1 | 12/2002 | Otaki et al. |
| 6,545,876 | B1 | 4/2003 | Kwong et al. |
| 6,689,634 | B1 | 2/2004 | Lyne |
| 6,762,366 | B1 | 7/2004 | Miller et al. |
| 6,916,995 | B2 | 7/2005 | Seaman et al. |
| 7,005,753 | B2 | 2/2006 | Seaman et al. |
| 7,009,115 | B2 | 3/2006 | Seaman et al. |
| 2004/0164427 | A1 | 8/2004 | Seaman et al. |

FOREIGN PATENT DOCUMENTS

| | | |
|---|---|---|
| EP | 0 883 182 | 12/1998 |
| EP | 0 928 029 | 7/1999 |
| EP | 1 085 571 | 3/2001 |
| EP | 1 087 440 | 3/2001 |

OTHER PUBLICATIONS

Vern Solberg, "Design for BGA and CSP, Component Standards and PCB Design Guidelines," *Tessera Technologies, Inc.* San Jose, CA, (Date unknown), 22 pages.

Intel Flash Memory Chip Scale Package User's Guide, "Manufacturing Considerations," Intel Corporation, (1999) pp. 21-30.

"JEDEC Design Standard, Design Requirements for Outlines of Solid State and Related Products," JEDEC Publication 95, Design Guide 4.5, JEDEC Solid State Technology Association, Aug. 2001, 19 pages.

"Altera Device Package Information," Altera Corporation, May 2001, version 9.1, pp. 1-69.

Kuzawinski, Mark et al. "Effects of Fine Pitch BGA Grids on Module and Card Design," *IBM Corporation*, Endicott, NY, pp. 91-99.

"Programming Adapter Specification," Emulation Technology, Inc., Santa Clara, CA, Item 65400014BG9X86YA, May 3, 2000, one page.

Tom Hausherr, "Metric Via Fanout BGA's," *IPC Designers Council*, (date unknown) 18 pages.

"PowerPC 750FX-IBM's 1 Ghz PowerPC Microprocessor," IBM Power PC Processor News, IBM Corporation, Oct. 2001, 4 pages.

Joseph Fjelstad, "Exploiting the Opportunity of Area Array Packaging" Tessera Technologies, Inc., first published in *Semiconductor International*, 1998, 6 pages.

"TVM-288F uZ™ Fold-Over Test Vehicle with DRAM Interface," Tessera Technologies, Inc., 2 pages (2002).

"MTXC Package Information," Intel Corporation, pp. 392-394 (date unknown).

Toshiba MOS Digital Integrated Circuit (Tentative), TC59M818DMB-30,-33,-40, Toshiba Corporation, Feb. 28, 2003, 55 pages.

European Search Report for International Application No. 04002178.4 mailed on May 17, 2004.

Mechanical Data, GHK (S-PBGA-N209), Plastic Ball Grid Array, Oct. 2003, Copyright 2003, Texas Instruments Incorporation, 2 pages.

U.S. Appl. No. 10/651,164, filed Oct. 29, 2003, Seaman et al.
U.S. Appl. No. 10/921,134, filed Aug. 19, 2004, Seaman et al.
U.S. Appl. No. 10/921,181, filed Aug. 19, 2004, Seaman et al.
U.S. Appl. No. 10/921,225, filed Aug. 19, 2004, Seaman et al.

Mechanical Data, GHK (S-PBGA-N257), Plastic Ball Grid Array, Oct. 2003, Copyright 2003, Texas Instruments, 2 pages.

Mechanical Data, (MPBG091B—Dec. 1998—Revised Aug. 2002), GJG (S-PBGA-N257), Plastic Ball Grid Array, Aug. 2002, Copyright 2002, Texas Instruments Incorporated, 2 pages.

Mechanical Data, (MPBG092B—Apr. 1998—Revised Jun. 2002), GHZ (S-PBGA-N151), Plastic Ball Grid Array, Dec. 2001, Copyright 2002, Texas Instruments Incorporated, 2 pages.

Mechanical Data, GHK (S-PBGA-N288), Plastic Ball Grid Array, Oct. 2003, Copyright 2003, Texas Instruments Incorporated, 2 pages.

Mechanical Data, GZA (S-PBGA-N257), Plastic Ball Grid Array, Jan. 2004, Copyright 2004, Texas Instruments Incorporated, 2 pages.

Mechanical Data, (MPBG169B—Oct. 2000—Revised Aug. 2002), GPH (S-PBGA-N181), Plastic Ball Grid Array, Aug. 2002, Copyright 2002, Texas Instruments Incorporated, 2 pages.

Mechanical Data, (MPBG170B—Oct. 2000—Revised Aug. 2002), GPH (S-PBGA-N205), Plastic Ball Grid Array, Aug. 2002, Copyright 2002, Texas Instruments Incorporated, 2 pages.

Mechanical Data, (MPBG171B—Oct. 2000—Revised Aug. 2002), GPH (S-PBGA-N241), Plastic Ball Grid Array, Aug. 2002, Copyright 2002, Texas Instruments Incorporated, 2 pages.

Mechanical Data, (MPBG179A—Feb. 2001—Revised Jan. 2002), GZG (S-PBGA-N289), Plastic Ball Grid Array, Nov. 2001, Copyright 2002, Texas Instruments Incorporated, 2 pages.

Mechanical Data, (MPBG304—Aug. 2002), GPH (S-PBGA-N173), Plastic Ball Grid Array, Aug. 2002, Copyright 2002, Texas Instruments Incorporated, 2 pages.

Mechanical Data, GVL (S-PBGA-N289), Plastic Ball Grid Array, Oct. 2004, Copyright 2004, Texas Instruments Incorporated, 2 pages.

Mechanical Data, GVM (S-PBGA-N289), Plastic Ball Grid Array, Jul. 2004, Copyright 2004, Texas Instruments Incorporated, 2 pages.

Mechanical Data, GVL (S-PBGA-N318), Plastic Ball Grid Array, Oct. 2004, Copyright 2004, Texas Instruments Incorporated, 2 pages.

Mechanical Data, GZA (S-PBGA-N291), Plastic Ball Grid Array Package, Jan. 2004, Copyright 2004, Texas Instruments Incorporated, 2 pages.

Mecanical Data, GHK (S-PBGA-N306), Plastic Ball Grid Array, Oct. 2003, Copyright 2003, Texas Instruments Incorporated, 2 pages.

Mechanical Data, GWE (S-PBGA-N289), Plastic Ball Grid Array, Jun. 2004, Copyright 2004, Texas Instruments Incorporated, 2 pages.

Mechanical Data, GWG (S-PBGA-N241), Plastic Ball Grid Array, Aug. 2004, Copyright 2004, Texas Instruments Incorporated, 2 pages.

Mechanical Data, (MPBG063C—Mar. 1998—Revised Jan. 2002), GZG (S-PBGA-N176), Plastic Ball Grid Array, Nov. 2001, Copyright 2002, Texas Instruments Incorporated, 2 pages.

Mechanical Data, GVL (S-PBGA-N293), Plastic Ball Grid Array, Oct. 2004, Copyright 2004, Texas Instruments Incorporated, 2 pages.

Mechanical Data, (MPBG087B—Dec. 1998—Revised Aug. 2002), GJG (S-PBGA-N209), Plastic Ball Grid Array, Aug. 2002, Copyright 2002, Texas Instruments Incorporated, 2 pages.

Preliminary Amendment filed Aug. 19, 2004 in U.S. Appl. No. 10/921,134 (Ref. AC2).

Preliminary Amendment filed Aug. 19, 2004 in U.S. Appl. No. 10/921,181 (Ref. AD2).

Preliminary Amendment filed Aug. 19, 2004 in U.S. Appl. No. 10/921,225 (Ref. AE2).

U.S. Appl. No. 10/650,975, filed Aug. 29, 2003, Seaman et al.

* cited by examiner

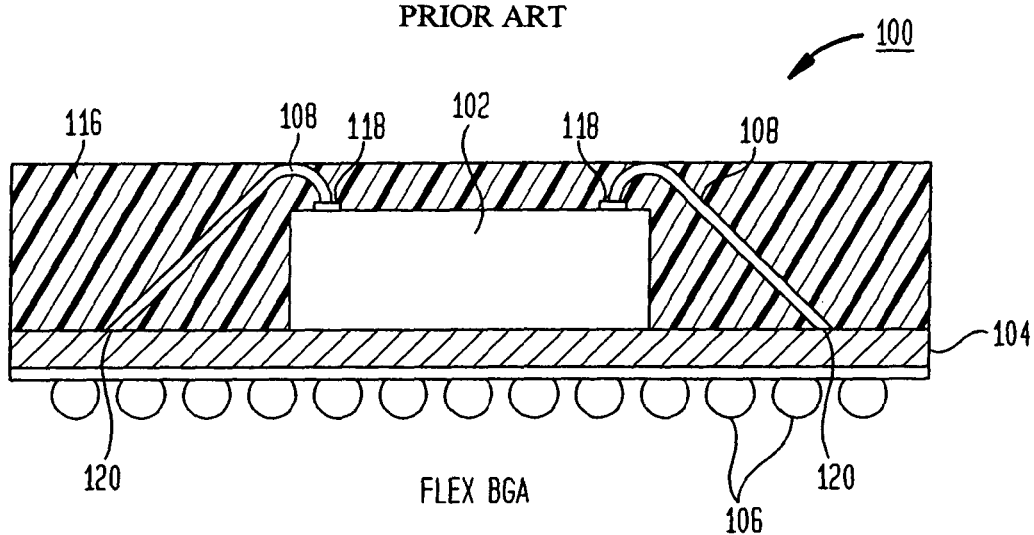
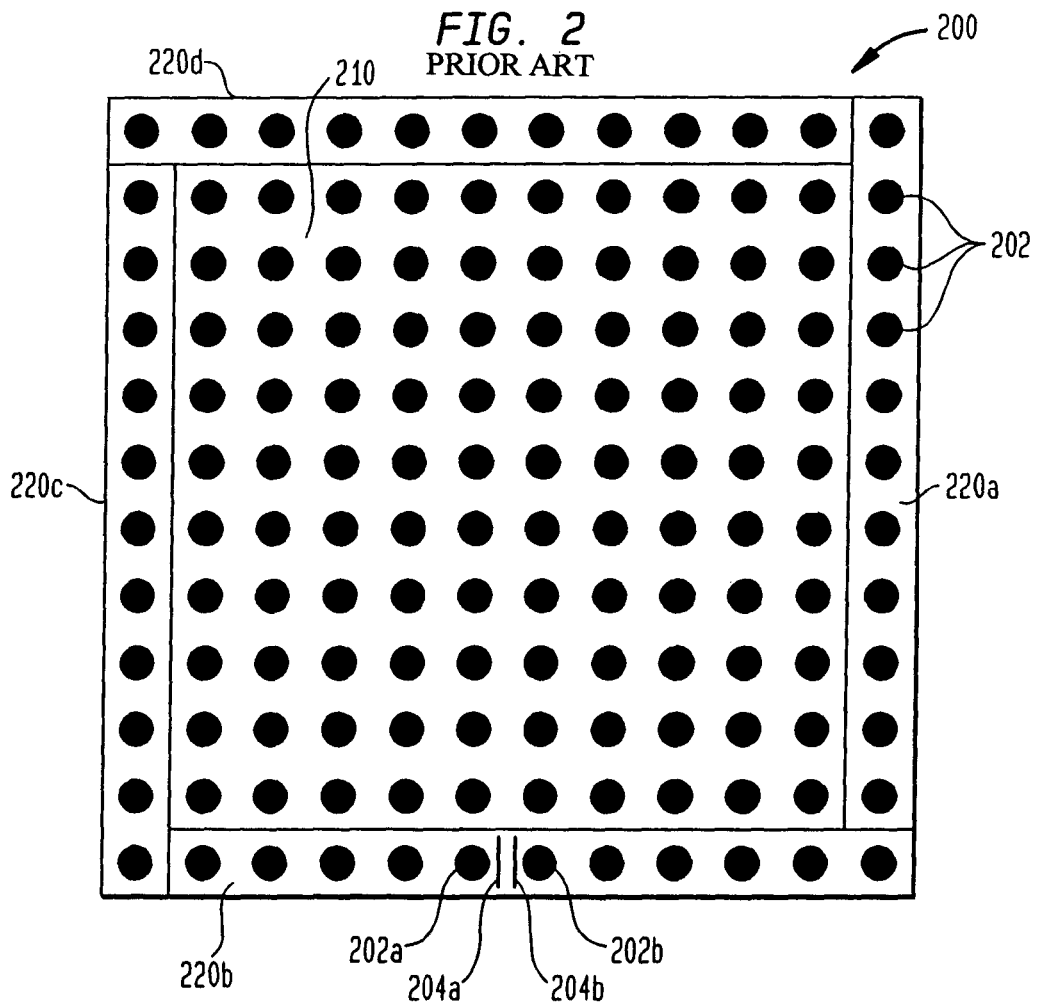

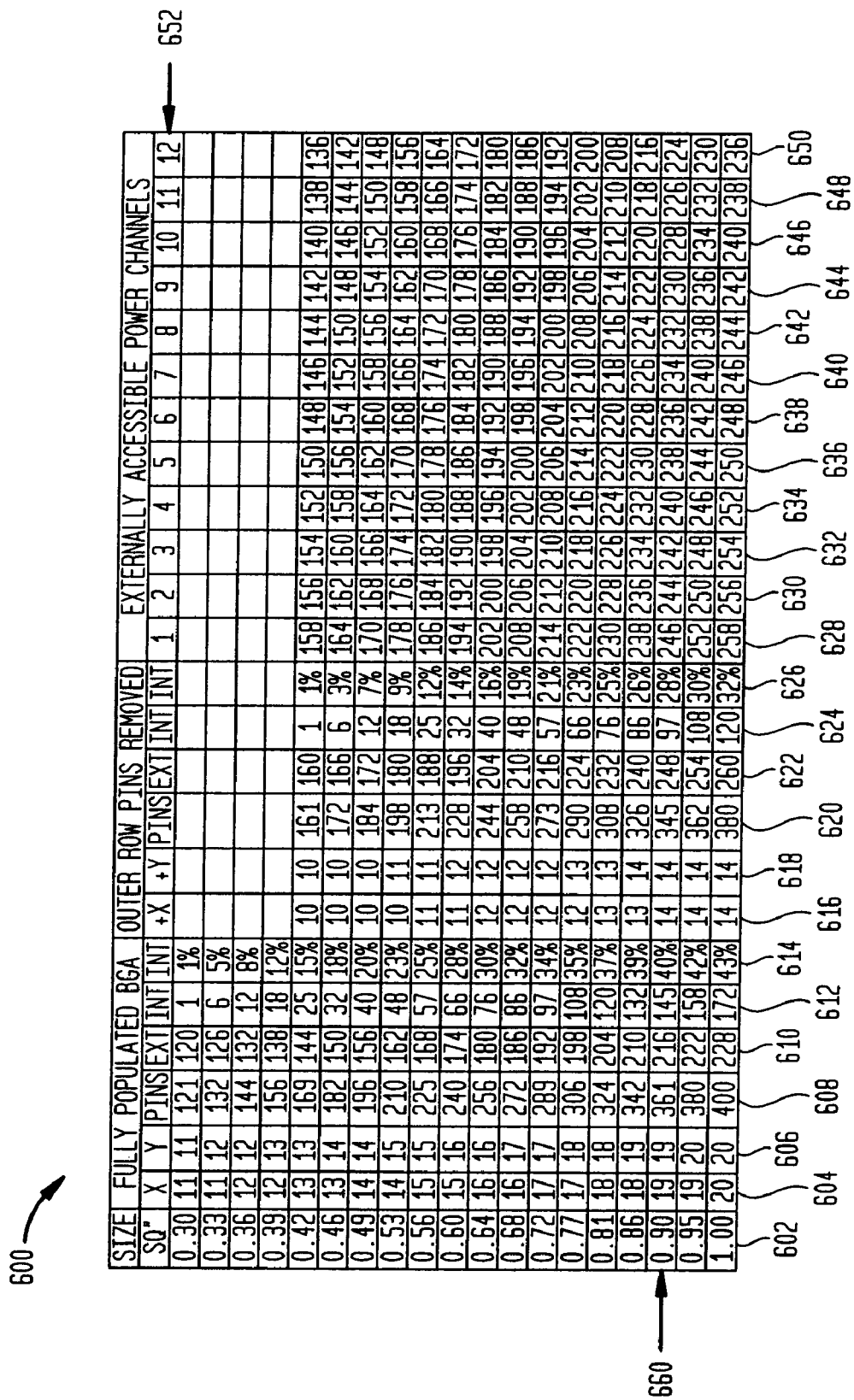

FIG. 6B

| SIZE SQ" | FULLY POPULATED BGA | | | | | | OUTER ROW PINS REMOVED | | | | | | EXTERNALLY ACCESSIBLE POWER CHANNELS | | | | | | | | | | | |
|---|---|---|---|---|---|---|---|---|---|---|---|---|---|---|---|---|---|---|---|---|---|---|---|---|
| | X | Y | PINS | EXT | INT | INT% | +X | +Y | PINS | EXT | INT | INT% | 1 | 2 | 3 | 4 | 5 | 6 | 7 | 8 | 9 | 10 | 11 | 12 |
| 1.05 | 20 | 21 | 420 | 234 | 186 | 44% | 14 | 15 | 400 | 268 | 132 | 33% | 266 | 264 | 262 | 260 | 258 | 256 | 254 | 252 | 250 | 248 | 246 | 244 |
| 1.10 | 21 | 21 | 441 | 240 | 201 | 46% | 15 | 15 | 421 | 276 | 145 | 34% | 274 | 272 | 270 | 268 | 266 | 264 | 262 | 260 | 258 | 256 | 254 | 252 |
| 1.16 | 21 | 22 | 462 | 246 | 216 | 47% | 15 | 16 | 442 | 284 | 158 | 35% | 282 | 280 | 278 | 276 | 274 | 272 | 270 | 268 | 266 | 264 | 262 | 260 |
| 1.21 | 22 | 22 | 484 | 252 | 232 | 48% | 16 | 16 | 464 | 292 | 172 | 37% | 290 | 288 | 286 | 284 | 282 | 280 | 278 | 276 | 274 | 272 | 270 | 268 |
| 1.27 | 22 | 23 | 506 | 258 | 248 | 49% | 16 | 16 | 484 | 298 | 186 | 38% | 296 | 294 | 292 | 290 | 288 | 286 | 284 | 282 | 280 | 278 | 276 | 274 |
| 1.32 | 23 | 23 | 529 | 264 | 265 | 50% | 16 | 17 | 505 | 304 | 201 | 40% | 302 | 300 | 298 | 296 | 294 | 292 | 290 | 288 | 286 | 284 | 282 | 280 |
| 1.38 | 23 | 24 | 552 | 270 | 282 | 51% | 17 | 17 | 528 | 312 | 216 | 41% | 310 | 308 | 306 | 304 | 302 | 300 | 298 | 296 | 294 | 292 | 290 | 288 |
| 1.44 | 24 | 24 | 576 | 276 | 300 | 52% | 17 | 18 | 552 | 320 | 232 | 42% | 318 | 316 | 314 | 312 | 310 | 308 | 306 | 304 | 302 | 300 | 298 | 296 |
| 1.50 | 24 | 25 | 600 | 282 | 318 | 53% | 18 | 18 | 576 | 328 | 248 | 43% | 326 | 324 | 322 | 320 | 318 | 316 | 314 | 312 | 310 | 308 | 306 | 304 |
| 1.56 | 25 | 25 | 625 | 288 | 337 | 54% | 18 | 18 | 601 | 336 | 265 | 44% | 334 | 332 | 330 | 328 | 326 | 324 | 322 | 320 | 318 | 316 | 314 | 312 |
| 1.63 | 25 | 26 | 650 | 294 | 356 | 55% | 18 | 19 | 624 | 342 | 282 | 45% | 340 | 338 | 336 | 334 | 332 | 330 | 328 | 326 | 324 | 322 | 320 | 318 |
| 1.69 | 26 | 26 | 676 | 300 | 376 | 56% | 19 | 19 | 648 | 348 | 300 | 46% | 346 | 344 | 342 | 340 | 338 | 336 | 334 | 332 | 330 | 328 | 326 | 324 |
| 1.76 | 26 | 27 | 702 | 306 | 396 | 56% | 19 | 19 | 674 | 356 | 318 | 47% | 354 | 352 | 350 | 348 | 346 | 344 | 342 | 340 | 338 | 336 | 334 | 332 |
| 1.82 | 27 | 27 | 729 | 312 | 417 | 57% | 19 | 20 | 701 | 364 | 337 | 48% | 362 | 360 | 358 | 356 | 354 | 352 | 350 | 348 | 346 | 344 | 342 | 340 |
| 1.89 | 27 | 28 | 756 | 318 | 438 | 58% | 20 | 20 | 728 | 372 | 356 | 49% | 370 | 368 | 366 | 364 | 362 | 360 | 358 | 356 | 354 | 352 | 350 | 348 |
| 1.96 | 28 | 28 | 784 | 324 | 460 | 59% | 20 | 20 | 756 | 380 | 376 | 50% | 378 | 376 | 374 | 372 | 370 | 368 | 366 | 364 | 362 | 360 | 358 | 356 |
| 2.03 | 28 | 29 | 812 | 330 | 482 | 59% | 20 | 20 | 782 | 386 | 396 | 51% | 384 | 382 | 380 | 378 | 376 | 374 | 372 | 370 | 368 | 366 | 364 | 362 |
| 2.10 | 29 | 29 | 841 | 336 | 505 | 60% | 20 | 21 | 809 | 392 | 417 | 52% | 390 | 388 | 386 | 384 | 382 | 380 | 378 | 376 | 374 | 372 | 370 | 368 |
| 2.18 | 29 | 30 | 870 | 342 | 528 | 61% | 21 | 21 | 838 | 400 | 438 | 52% | 398 | 396 | 394 | 392 | 390 | 388 | 386 | 384 | 382 | 380 | 378 | 376 |
| 2.25 | 30 | 30 | 900 | 348 | 552 | 61% | 21 | 21 | 868 | 408 | 460 | 53% | 406 | 404 | 402 | 400 | 398 | 396 | 394 | 392 | 390 | 388 | 386 | 384 |
| 2.33 | 30 | 31 | 930 | 354 | 576 | 62% | 21 | 22 | 898 | 416 | 482 | 54% | 414 | 412 | 410 | 408 | 406 | 404 | 402 | 400 | 398 | 396 | 394 | 392 |
| 2.40 | 31 | 31 | 961 | 360 | 601 | 63% | 22 | 22 | 929 | 424 | 505 | 54% | 422 | 420 | 418 | 416 | 414 | 412 | 410 | 408 | 406 | 404 | 402 | 400 |

600 (CONTINUED)

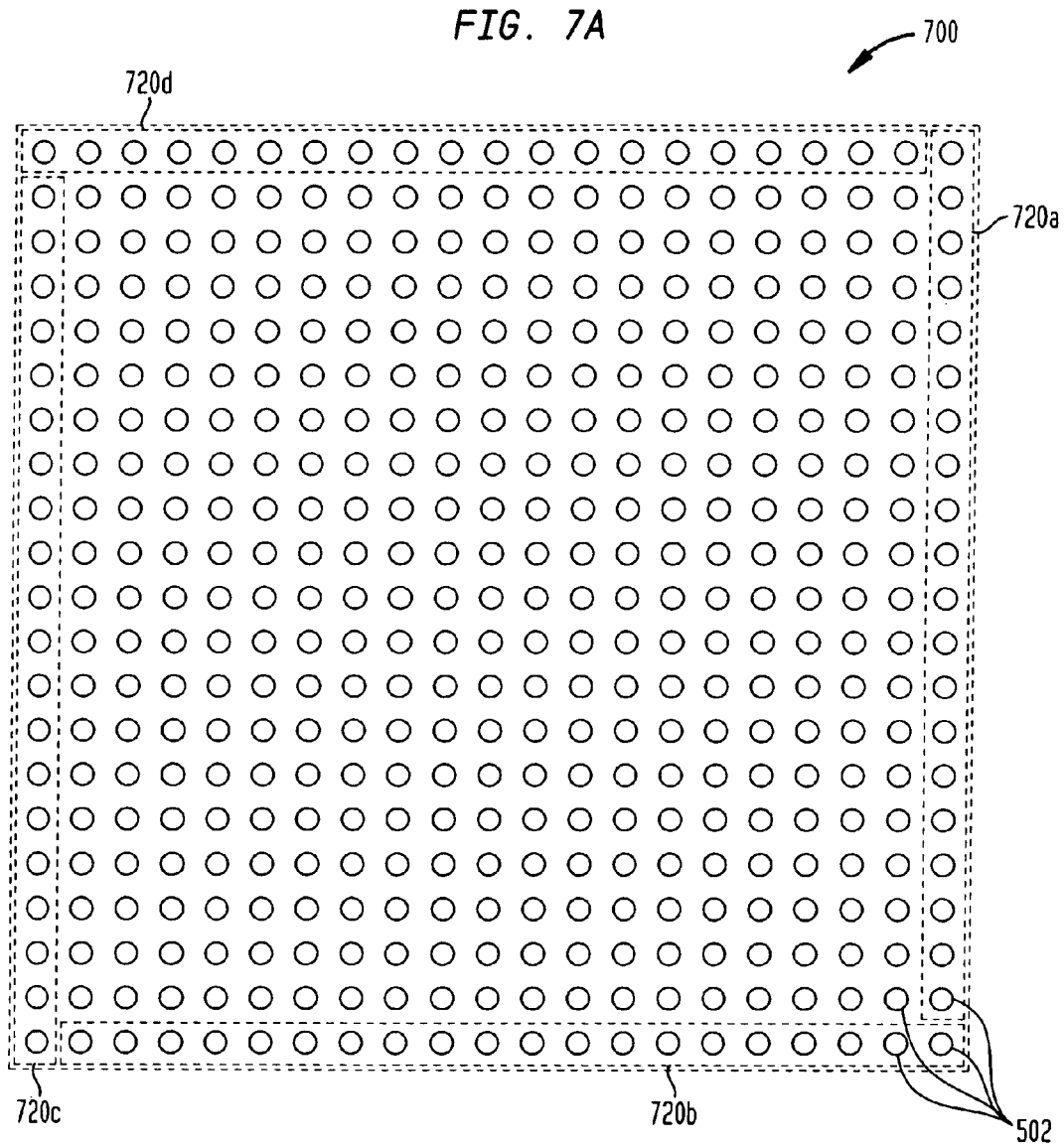

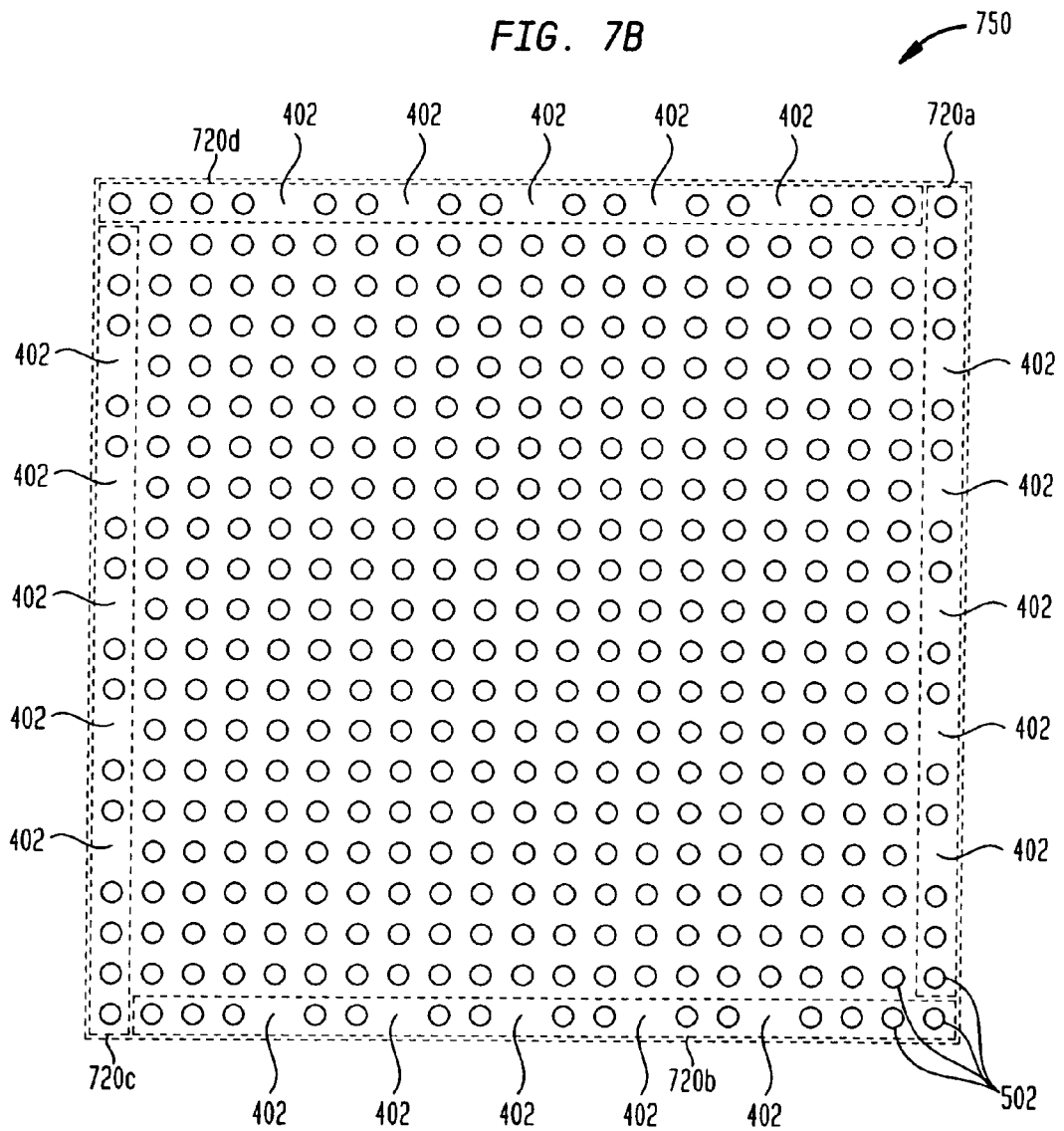

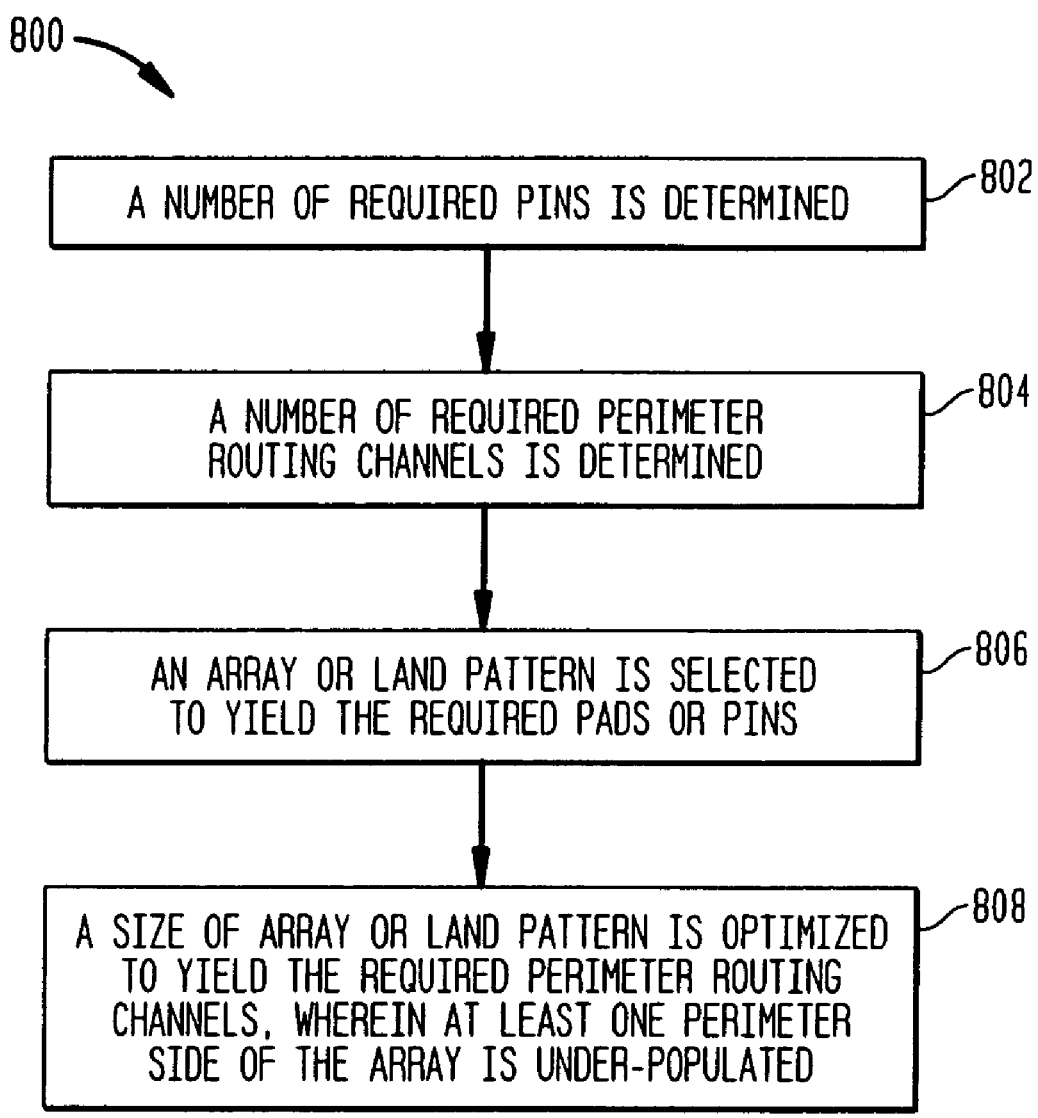

FIG. 9

| | | LINE | 0.005 | 0.005 | 0.006 | 0.006 | 0.007 | 0.007 | 0.008 |
|---|---|---|---|---|---|---|---|---|---|
| | | SPACE | 0.005 | 0.006 | 0.006 | 0.007 | 0.007 | 0.008 | 0.008 |
| | | PAD | 0.024 | 0.027 | 0.029 | 0.032 | 0.034 | 0.037 | 0.039 |
| | | PITCH | 0.050 | 0.056 | 0.060 | 0.066 | 0.070 | 0.076 | 0.080 |
| X | Y | PINS | SQ" | SQ" | SQ" | SQ" | SQ" | SQ" | SQ" |
| 11 | 11 | 121 | 0.30 | 0.38 | 0.44 | 0.53 | 0.59 | 0.70 | 0.77 |
| 11 | 12 | 132 | 0.33 | 0.41 | 0.48 | 0.57 | 0.65 | 0.76 | 0.84 |
| 12 | 12 | 144 | 0.36 | 0.45 | 0.52 | 0.63 | 0.71 | 0.83 | 0.92 |
| 12 | 13 | 156 | 0.39 | 0.49 | 0.56 | 0.68 | 0.76 | 0.90 | 1.00 |
| 13 | 13 | 169 | 0.42 | 0.53 | 0.61 | 0.74 | 0.83 | 0.98 | 1.08 |
| 13 | 14 | 182 | 0.46 | 0.57 | 0.66 | 0.79 | 0.89 | 1.05 | 1.16 |
| 14 | 14 | 196 | 0.49 | 0.61 | 0.71 | 0.85 | 0.96 | 1.13 | 1.25 |
| 14 | 15 | 210 | 0.53 | 0.66 | 0.76 | 0.91 | 1.03 | 1.21 | 1.34 |
| 15 | 15 | 225 | 0.56 | 0.71 | 0.81 | 0.98 | 1.10 | 1.30 | 1.44 |
| 15 | 16 | 240 | 0.60 | 0.75 | 0.86 | 1.05 | 1.18 | 1.39 | 1.54 |
| 16 | 16 | 256 | 0.64 | 0.80 | 0.92 | 1.12 | 1.25 | 1.48 | 1.64 |
| 16 | 17 | 272 | 0.68 | 0.85 | 0.98 | 1.18 | 1.33 | 1.57 | 1.74 |
| 17 | 17 | 289 | 0.72 | 0.91 | 1.04 | 1.26 | 1.42 | 1.67 | 1.85 |
| 17 | 18 | 306 | 0.77 | 0.96 | 1.10 | 1.33 | 1.50 | 1.77 | 1.96 |
| 18 | 18 | 324 | 0.81 | 1.02 | 1.17 | 1.41 | 1.59 | 1.87 | 2.07 |
| 18 | 19 | 342 | 0.86 | 1.07 | 1.23 | 1.49 | 1.68 | 1.98 | 2.19 |
| 19 | 19 | 361 | 0.90 | 1.13 | 1.30 | 1.57 | 1.77 | 2.09 | 2.31 |
| 19 | 20 | 380 | 0.95 | 1.19 | 1.37 | 1.66 | 1.86 | 2.19 | 2.43 |
| 20 | 20 | 400 | 1.00 | 1.25 | 1.44 | 1.74 | 1.96 | 2.31 | 2.56 |
| 20 | 21 | 420 | 1.05 | 1.32 | 1.51 | 1.83 | 2.06 | 2.43 | 2.69 |
| 21 | 21 | 441 | 1.10 | 1.38 | 1.59 | 1.92 | 2.16 | 2.55 | 2.82 |
| 21 | 22 | 462 | 1.16 | 1.45 | 1.66 | 2.01 | 2.26 | 2.67 | 2.96 |
| 22 | 22 | 484 | 1.21 | 1.52 | 1.74 | 2.11 | 2.37 | 2.80 | 3.10 |
| 22 | 23 | 506 | 1.27 | 1.59 | 1.82 | 2.20 | 2.48 | 2.92 | 3.24 |
| 23 | 23 | 529 | 1.32 | 1.66 | 1.90 | 2.30 | 2.59 | 3.06 | 3.39 |
| 23 | 24 | 552 | 1.38 | 1.73 | 1.99 | 2.40 | 2.70 | 3.19 | 3.53 |
| 24 | 24 | 576 | 1.44 | 1.81 | 2.07 | 2.51 | 2.82 | 3.33 | 3.69 |
| 24 | 25 | 600 | 1.50 | 1.88 | 2.16 | 2.61 | 2.94 | 3.47 | 3.84 |
| 25 | 25 | 625 | 1.56 | 1.96 | 2.25 | 2.72 | 3.06 | 3.61 | 4.00 |
| 25 | 26 | 650 | 1.63 | 2.04 | 2.34 | 2.83 | 3.19 | 3.75 | 4.16 |
| 26 | 26 | 676 | 1.69 | 2.12 | 2.43 | 2.94 | 3.31 | 3.90 | 4.33 |
| 26 | 27 | 702 | 1.76 | 2.20 | 2.53 | 3.06 | 3.44 | 4.05 | 4.49 |
| 27 | 27 | 729 | 1.82 | 2.29 | 2.62 | 3.18 | 3.57 | 4.21 | 4.67 |
| 27 | 28 | 756 | 1.89 | 2.37 | 2.72 | 3.29 | 3.70 | 4.37 | 4.84 |
| 28 | 28 | 784 | 1.96 | 2.46 | 2.82 | 3.42 | 3.84 | 4.53 | 5.02 |
| 28 | 29 | 812 | 2.03 | 2.55 | 2.92 | 3.54 | 3.98 | 4.69 | 5.20 |
| 29 | 29 | 841 | 2.10 | 2.64 | 3.03 | 3.66 | 4.12 | 4.86 | 5.38 |
| 29 | 30 | 870 | 2.18 | 2.73 | 3.13 | 3.79 | 4.26 | 5.03 | 5.57 |
| 30 | 30 | 900 | 2.25 | 2.82 | 3.24 | 3.92 | 4.41 | 5.20 | 5.76 |
| 30 | 31 | 930 | 2.33 | 2.92 | 3.35 | 4.05 | 4.56 | 5.37 | 5.95 |
| 31 | 31 | 961 | 2.40 | 3.01 | 3.46 | 4.19 | 4.71 | 5.55 | 6.15 |
| 31 | 32 | 992 | 2.48 | 3.11 | 3.57 | 4.32 | 4.86 | 5.73 | 6.35 |
| 32 | 32 | 1024 | 2.56 | 3.21 | 3.69 | 4.46 | 5.02 | 5.91 | 6.55 |

FIG. 11

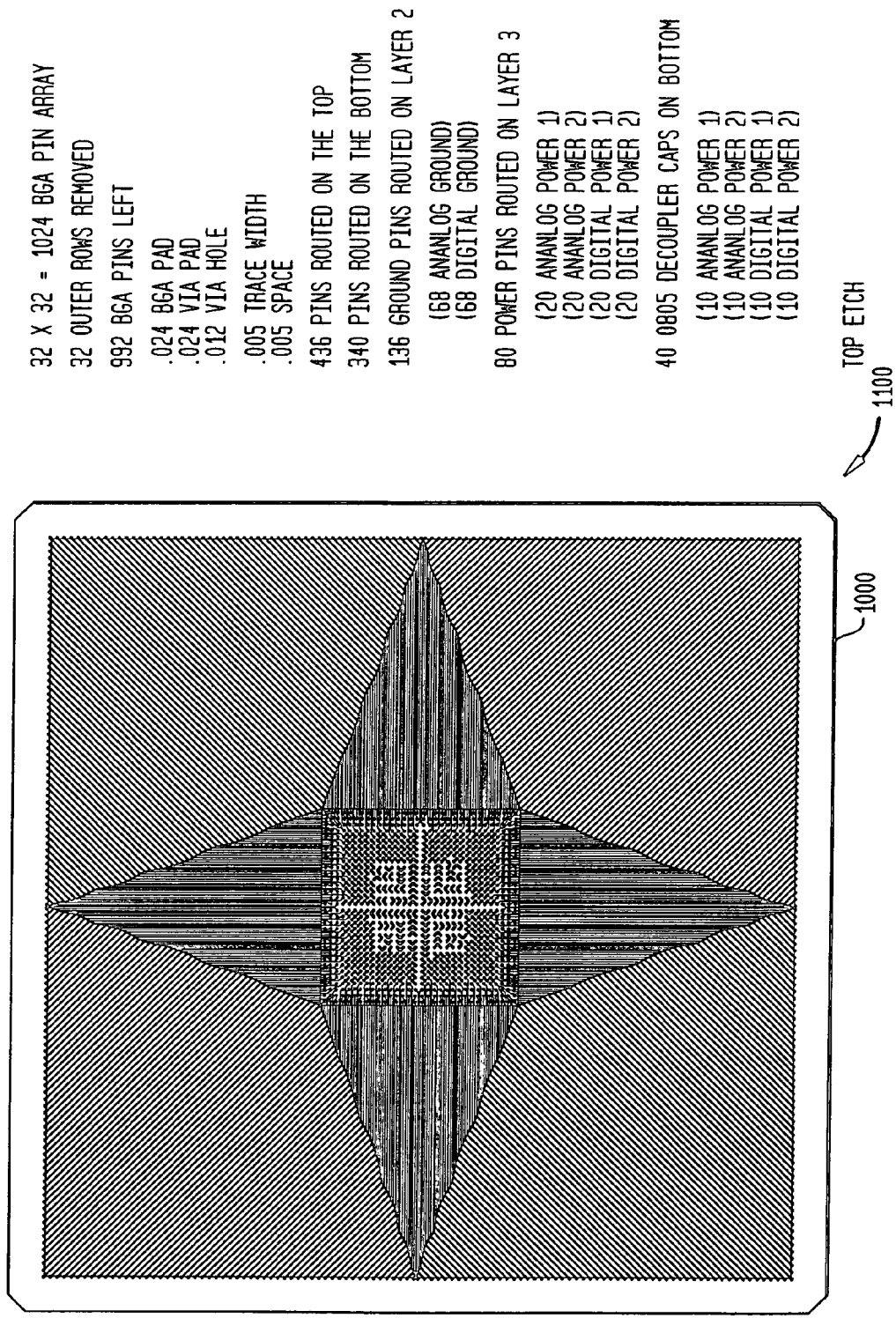

32 X 32 = 1024 BGA PIN ARRAY
32 OUTER ROWS REMOVED
992 BGA PINS LEFT

.024 BGA PAD
.024 VIA PAD
.012 VIA HOLE

.005 TRACE WIDTH
.005 SPACE

436 PINS ROUTED ON THE TOP
340 PINS ROUTED ON THE BOTTOM
136 GROUND PINS ROUTED ON LAYER 2
  (68 ANANLOG GROUND)
  (68 DIGITAL GROUND)
80 POWER PINS ROUTED ON LAYER 3
  (20 ANANLOG POWER 1)
  (20 ANANLOG POWER 2)
  (20 DIGITAL POWER 1)
  (20 DIGITAL POWER 2)
40 0805 DECOUPLER CAPS ON BOTTOM
  (10 ANANLOG POWER 1)
  (10 ANANLOG POWER 2)
  (10 DIGITAL POWER 1)
  (10 DIGITAL POWER 2)

TOP ETCH
1100
1000

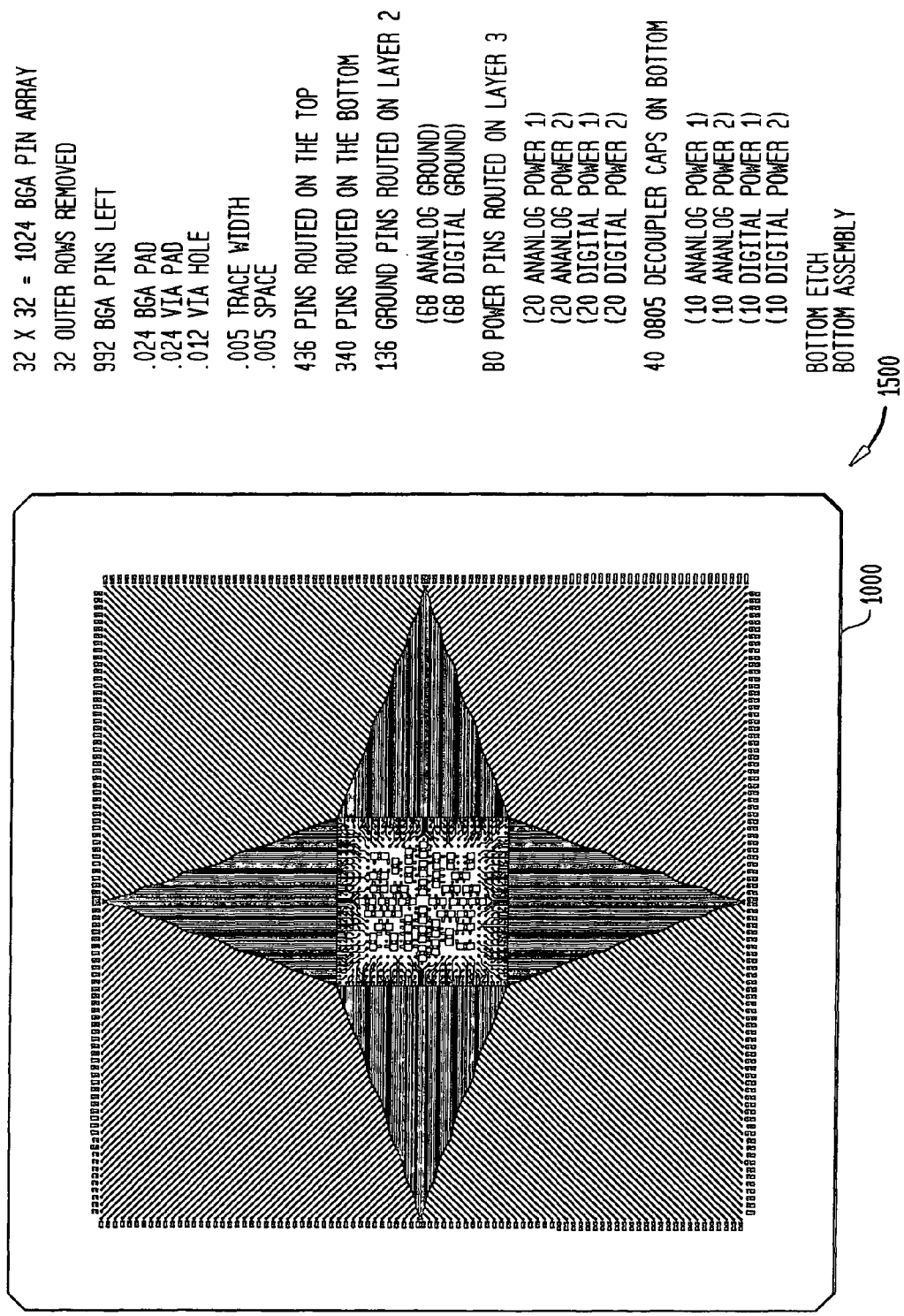

FIG. 15

32 X 32 = 1024 BGA PIN ARRAY

32 OUTER ROWS REMOVED

992 BGA PINS LEFT

.024 BGA PAD
.024 VIA PAD
.012 VIA HOLE

.005 TRACE WIDTH
.005 SPACE

436 PINS ROUTED ON THE TOP
340 PINS ROUTED ON THE BOTTOM
136 GROUND PINS ROUTED ON LAYER 2
  (68 ANANLOG GROUND)
  (68 DIGITAL GROUND)
80 POWER PINS ROUTED ON LAYER 3
  (20 ANANLOG POWER 1)
  (20 ANANLOG POWER 2)
  (20 DIGITAL POWER 1)
  (20 DIGITAL POWER 2)
40 0805 DECOUPLER CAPS ON BOTTOM
  (10 ANANLOG POWER 1)
  (10 ANANLOG POWER 2)
  (10 DIGITAL POWER 1)
  (10 DIGITAL POWER 2)

BOTTOM ETCH
BOTTOM ASSEMBLY

| X | Y | SPACES | INSIDE LOSS | OUTSIDE LOSS | TOTAL LOSS | COMMENT | EXAMPLE |
|---|---|---|---|---|---|---|---|
| 0 | 0 | 0 | 0 | 5 | 5 | | 2100 |
| 0 | 1 | 1 | 0 | 4 | 4 | | 2200 |
| 0 | 2 | 2 | 0 | 3 | 3 | | 2300 |
| 0 | 3 | 3 | 0 | 2 | 2 | | 2400 |
| 0 | 4 | 4 | 1 | 2 | 3 | | 2500 |
| 1 | 1 | 2 | 0 | 3 | 3 | | 2600 |
| 1 | 2 | 3 | 0 | 2 | 2 | | 2700 |
| 1 | 3 | 4 | 0 | 1 | 1 | 1 LOSS (ext.) | 2800 |
| 1 | 4 | 5 | 1 | 1 | 2 | | 2900 |
| 2 | 1 | 3 | 0 | 2 | 2 | | 2700 |
| 2 | 2 | 4 | 0 | 1 | 1 | 1 LOSS (ext.) | 3000 |
| 2 | 3 | 5 | 0 | 0 | 0 | OPTIMUM | 1800 |
| 2 | 4 | 6 | 1 | 0 | 1 | 1 LOSS (int.) | 1900 |
| 3 | 1 | 4 | 0 | 1 | 1 | 1 LOSS (ext.) | 2800 |
| 3 | 2 | 5 | 0 | 0 | 0 | OPTIMUM | 1800 |
| 3 | 3 | 6 | 1 | 0 | 1 | 1 LOSS (int.) | 2000 |
| 3 | 4 | 7 | 2 | 0 | 2 | | 3100 |
| 4 | 1 | 5 | 1 | 1 | 2 | | 2900 |
| 4 | 2 | 6 | 1 | 0 | 1 | 1 LOSS (int.) | 1900 |
| 4 | 3 | 7 | 2 | 0 | 2 | | 3100 |
| 4 | 4 | 8 | 3 | 0 | 3 | | 3200 |

FIG. 37

| LOOKUP | OFFSET | SIZE | | SIDES | | CORNERS | | | | INTERNAL LOSS | | | | EXTERNAL LOSS | | | | TOTAL LOSS | EXAMPLE |
|---|---|---|---|---|---|---|---|---|---|---|---|---|---|---|---|---|---|---|---|
| KEY | KEY | X | Y | NS | EW | NE | SE | SW | NW | NE | SE | SW | NW | TOT | NE | SE | SW | NW | TOT | |
| 00 | 0 | 15 | 15 | 12 | 13 | 23 | 42 | 23 | 42 | 0 | 1 | 0 | 1 | 2 | 0 | 0 | 0 | 0 | 0 | 2 | FIG. 41 |
| 01 | 0 | 15 | 16 | 12 | 13 | 23 | 23 | 23 | 32 | 0 | 0 | 0 | 1 | 1 | 0 | 0 | 0 | 0 | 0 | 1 | FIG. 42 |
| 02 | 1 | 15 | 14 | 12 | 13 | 23 | 23 | 23 | 32 | 0 | 0 | 0 | 0 | 0 | 0 | 0 | 0 | 0 | 0 | 0 | FIG. 40 (ROTATED) |
| 10 | 1 | 16 | 15 | 13 | 12 | 23 | 42 | 23 | 23 | 0 | 1 | 0 | 0 | 1 | 0 | 0 | 0 | 0 | 0 | 1 | FIG. 42 (ROTATED) |
| 11 | 1 | 13 | 13 | 11 | 11 | 32 | 32 | 32 | 32 | 0 | 0 | 0 | 0 | 0 | 0 | 0 | 0 | 0 | 0 | 0 | FIG. 36 |
| 12 | 0 | 13 | 14 | 11 | 12 | 23 | 23 | 33 | 23 | 1 | 1 | 0 | 1 | 2 | 0 | 0 | 0 | 0 | 0 | 2 | FIG. 38 |
| 20 | 1 | 14 | 15 | 12 | 11 | 32 | 32 | 23 | 23 | 0 | 0 | 0 | 0 | 0 | 0 | 0 | 0 | 0 | 0 | 0 | FIG. 40 |
| 21 | 0 | 14 | 13 | 12 | 11 | 33 | 23 | 23 | 23 | 1 | 0 | 1 | 0 | 2 | 0 | 0 | 0 | 0 | 0 | 2 | FIG. 38 (ROTATED) |
| 22 | -1 | 14 | 14 | 12 | 12 | 33 | 33 | 33 | 33 | 1 | 1 | 1 | 1 | 4 | 0 | 0 | 0 | 0 | 0 | 4 | FIG. 39 |

FIG. 43A

| SIZE SQ" | FULLY POPULATED BGA |||||| PINS REMOVED 1 OUTER ROW ||||||| REF KEY | EXTERNALLY ACCESSIBLE POWER CHANNELS ||||||||||||
|---|---|---|---|---|---|---|---|---|---|---|---|---|---|---|---|---|---|---|---|---|---|---|---|---|---|---|
| | NS | EW | PINS | EXT | INT | PCT | KEY | NS | EW | PINS | EXT | INT | PCT | | 1 | 2 | 3 | 4 | 5 | 6 | 7 | 8 | 9 | 10 | 11 | 12 |
| 0.42 | 13 | 13 | 169 | 144 | 25 | 15% | 11 | 11 | 11 | 161 | 160 | 1 | 1% | 160 | 158 | 156 | 154 | 152 | 150 | 148 | 146 | 144 | 142 | 140 | 138 | 136 |
| 0.46 | 13 | 14 | 182 | 150 | 32 | 18% | 22 | 11 | 12 | 174 | 166 | 8 | 5% | 161 | 164 | 162 | 160 | 158 | 156 | 154 | 152 | 150 | 148 | 146 | 144 | 142 |
| 0.49 | 14 | 14 | 196 | 156 | 40 | 20% | 00 | 12 | 12 | 188 | 172 | 16 | 9% | 167 | 170 | 168 | 166 | 164 | 162 | 160 | 158 | 156 | 154 | 152 | 150 | 148 |
| 0.53 | 14 | 15 | 210 | 162 | 48 | 23% | 11 | 12 | 13 | 200 | 182 | 18 | 9% | 173 | 176 | 174 | 172 | 170 | 168 | 166 | 164 | 162 | 160 | 158 | 152 | 148 |
| 0.56 | 15 | 15 | 225 | 168 | 57 | 25% | 22 | 13 | 13 | 215 | 188 | 27 | 13% | 183 | 182 | 180 | 178 | 174 | 172 | 170 | 168 | 166 | 164 | 162 | 160 | 158 |
| 0.60 | 15 | 16 | 240 | 174 | 66 | 28% | 00 | 13 | 14 | 228 | 195 | 33 | 14% | 189 | 186 | 184 | 182 | 180 | 178 | 176 | 174 | 170 | 168 | 166 | 164 | 162 |
| 0.64 | 16 | 16 | 256 | 180 | 76 | 30% | 11 | 14 | 14 | 244 | 204 | 40 | 16% | 193 | 191 | 189 | 187 | 185 | 183 | 181 | 179 | 177 | 175 | 173 | 171 | 164 |
| 0.68 | 16 | 17 | 272 | 186 | 86 | 32% | 22 | 14 | 15 | 260 | 210 | 50 | 19% | 202 | 200 | 198 | 196 | 194 | 192 | 190 | 188 | 186 | 184 | 182 | 180 | 171 |
| 0.72 | 17 | 17 | 289 | 192 | 97 | 34% | 00 | 15 | 15 | 277 | 216 | 61 | 22% | 208 | 206 | 204 | 202 | 200 | 198 | 196 | 192 | 190 | 188 | 186 | 182 | 180 |
| 0.77 | 17 | 18 | 306 | 198 | 108 | 35% | 01 | 15 | 16 | 292 | 226 | 66 | 23% | 211 | 212 | 210 | 208 | 206 | 204 | 202 | 198 | 196 | 194 | 192 | 188 | 186 |
| 0.81 | 18 | 18 | 324 | 204 | 120 | 37% | 12 | 16 | 16 | 310 | 232 | 78 | 25% | 217 | 222 | 220 | 218 | 216 | 214 | 212 | 208 | 206 | 204 | 202 | 194 | 192 |
| 0.86 | 18 | 19 | 342 | 210 | 132 | 39% | 22 | 16 | 17 | 326 | 239 | 87 | 27% | 223 | 228 | 226 | 224 | 222 | 220 | 218 | 214 | 212 | 210 | 208 | 204 | 202 |
| 0.90 | 19 | 19 | 361 | 216 | 145 | 40% | 00 | 17 | 17 | 345 | 248 | 97 | 28% | 233 | 235 | 233 | 231 | 229 | 227 | 225 | 223 | 221 | 219 | 217 | 210 | 208 |
| 0.95 | 19 | 20 | 380 | 222 | 158 | 42% | 01 | 17 | 18 | 364 | 254 | 110 | 30% | 240 | 244 | 242 | 240 | 238 | 236 | 234 | 232 | 230 | 228 | 226 | 226 | 224 |
| 1.00 | 20 | 20 | 400 | 228 | 172 | 43% | 12 | 18 | 18 | 384 | 260 | 124 | 32% | 249 | 252 | 250 | 248 | 246 | 244 | 240 | 238 | 236 | 234 | 232 | 226 | 230 |
| 1.05 | 20 | 21 | 420 | 234 | 186 | 44% | 22 | 18 | 19 | 402 | 270 | 132 | 33% | 255 | 258 | 256 | 254 | 252 | 250 | 246 | 244 | 242 | 240 | 238 | 232 | 230 |
| 1.10 | 21 | 21 | 441 | 240 | 201 | 46% | 00 | 19 | 19 | 423 | 276 | 147 | 35% | 261 | 266 | 264 | 262 | 260 | 258 | 256 | 252 | 250 | 248 | 246 | 238 | 236 |
| 1.16 | 21 | 22 | 462 | 246 | 216 | 47% | 01 | 19 | 20 | 442 | 283 | 159 | 36% | 271 | 274 | 272 | 270 | 268 | 266 | 262 | 260 | 258 | 256 | 254 | 246 | 246 |
| 1.21 | 22 | 22 | 484 | 252 | 232 | 48% | 12 | 20 | 20 | 464 | 292 | 172 | 37% | 277 | 282 | 279 | 277 | 275 | 273 | 271 | 269 | 267 | 265 | 263 | 261 | 252 |
| 1.27 | 22 | 23 | 506 | 258 | 248 | 49% | 22 | 20 | 21 | 486 | 298 | 188 | 39% | 284 | 290 | 288 | 286 | 284 | 282 | 280 | 278 | 276 | 274 | 272 | 270 | 259 |
| 1.32 | 23 | 23 | 529 | 264 | 265 | 50% | 00 | 21 | 21 | 509 | 304 | 205 | 40% | 293 | 296 | 294 | 292 | 290 | 288 | 286 | 284 | 282 | 280 | 278 | 276 | 268 |
| 1.38 | 23 | 24 | 552 | 270 | 282 | 51% | 01 | 21 | 22 | 530 | 314 | 216 | 41% | 299 | 302 | 300 | 298 | 296 | 294 | 292 | 290 | 288 | 286 | 284 | 282 | 274 |
| 1.44 | 24 | 24 | 576 | 276 | 300 | 52% | 12 | 22 | 22 | 554 | 320 | 234 | 42% | 305 | 312 | 310 | 308 | 306 | 304 | 302 | 300 | 298 | 296 | 294 | 292 | 280 |
| 1.50 | 24 | 25 | 600 | 282 | 318 | 53% | 22 | 22 | 23 | 576 | 327 | 249 | 43% | 315 | 318 | 316 | 314 | 312 | 310 | 308 | 306 | 304 | 302 | 300 | 298 | 290 |
| 1.56 | 25 | 25 | 625 | 288 | 337 | 54% | 00 | 23 | 23 | 601 | 336 | 265 | 44% | 321 | 325 | 323 | 321 | 319 | 317 | 315 | 313 | 311 | 309 | 307 | 305 | 296 |
| 1.63 | 25 | 26 | 650 | 294 | 356 | 55% | 01 | 23 | 24 | 626 | 342 | 284 | 45% | 328 | 334 | 332 | 330 | 328 | 326 | 324 | 322 | 320 | 318 | 316 | 314 | 312 |
| 1.69 | 26 | 26 | 676 | 300 | 376 | 56% | 12 | 24 | 24 | 652 | 348 | 304 | 47% | 337 | 340 | 338 | 336 | 334 | 332 | 330 | 328 | 326 | 324 | 322 | 320 | 318 |
| 1.76 | 26 | 27 | 702 | 306 | 396 | 56% | 22 | 24 | 25 | 676 | 358 | 318 | 47% | 349 | 346 | 344 | 342 | 340 | 338 | 336 | 334 | 332 | 330 | 328 | 326 | 334 |

FIG. 43B

| SIZE | FULLY POPULATED BGA | | | | PINS REMOVED 1 OUTER ROW | | | | | REF | EXTERNALLY ACCESSIBLE POWER CHANNELS | | | | | | | | | | | |
|---|---|---|---|---|---|---|---|---|---|---|---|---|---|---|---|---|---|---|---|---|---|---|
| SQ" | NS | EW | PINS | EXT | INT | PCT | KEY | NS | EW | PINS | EXT | INT | PCT | KEY | 1 | 2 | 3 | 4 | 5 | 6 | 7 | 8 | 9 | 10 | 11 | 12 |
| 1.82 | 27 | 27 | 729 | 312 | 417 | 57% | 00 | 20 | 21 | 703 | 364 | 339 | 48% | KEY | 362 | 360 | 358 | 356 | 354 | 352 | 350 | 348 | 346 | 344 | 342 | 340 |
| 1.89 | 27 | 28 | 756 | 318 | 438 | 58% | 01 | 20 | 21 | 728 | 371 | 357 | 49% | | 369 | 367 | 365 | 363 | 361 | 359 | 357 | 355 | 353 | 351 | 349 | 347 |
| 1.96 | 28 | 28 | 784 | 324 | 460 | 59% | 11 | 21 | 21 | 756 | 380 | 376 | 50% | | 378 | 376 | 374 | 372 | 370 | 368 | 366 | 364 | 362 | 360 | 358 | 356 |
| 2.03 | 28 | 29 | 812 | 330 | 482 | 59% | 12 | 21 | 22 | 784 | 386 | 398 | 51% | | 384 | 382 | 380 | 378 | 376 | 374 | 372 | 370 | 368 | 366 | 364 | 362 |
| 2.10 | 29 | 29 | 841 | 336 | 505 | 60% | 22 | 22 | 22 | 813 | 392 | 421 | 52% | | 390 | 388 | 386 | 384 | 382 | 380 | 378 | 376 | 374 | 372 | 370 | 368 |
| 2.18 | 29 | 30 | 870 | 342 | 528 | 61% | 20 | 22 | 23 | 840 | 402 | 438 | 52% | | 400 | 398 | 396 | 394 | 392 | 390 | 388 | 386 | 384 | 382 | 380 | 378 |
| 2.25 | 30 | 30 | 900 | 348 | 552 | 61% | 00 | 23 | 23 | 870 | 408 | 462 | 53% | | 406 | 404 | 402 | 400 | 398 | 396 | 394 | 392 | 390 | 388 | 386 | 384 |
| 2.33 | 30 | 31 | 930 | 354 | 576 | 62% | 01 | 23 | 23 | 898 | 415 | 483 | 54% | | 413 | 411 | 409 | 407 | 405 | 403 | 401 | 399 | 397 | 395 | 393 | 391 |
| 2.40 | 31 | 31 | 961 | 360 | 601 | 63% | 11 | 24 | 23 | 929 | 424 | 505 | 54% | | 422 | 420 | 418 | 416 | 414 | 412 | 410 | 408 | 406 | 404 | 402 | 400 |
| 2.48 | 31 | 32 | 992 | 366 | 626 | 63% | 12 | 24 | 24 | 960 | 430 | 530 | 55% | | 428 | 426 | 424 | 422 | 420 | 418 | 416 | 414 | 412 | 410 | 408 | 406 |
| 2.56 | 32 | 32 | 1024 | 372 | 652 | 64% | 22 | 24 | 24 | 992 | 436 | 556 | 56% | | 434 | 432 | 430 | 428 | 426 | 424 | 422 | 420 | 418 | 416 | 414 | 412 |
| 2.64 | 32 | 33 | 1056 | 378 | 678 | 64% | 20 | 25 | 24 | 1022 | 446 | 576 | 56% | | 444 | 442 | 440 | 438 | 436 | 434 | 432 | 430 | 428 | 426 | 424 | 422 |
| 2.72 | 33 | 33 | 1089 | 384 | 705 | 65% | 00 | 25 | 25 | 1055 | 452 | 603 | 57% | | 450 | 448 | 446 | 444 | 442 | 440 | 438 | 436 | 434 | 432 | 430 | 428 |
| 2.81 | 33 | 34 | 1122 | 390 | 732 | 65% | 01 | 25 | 26 | 1086 | 459 | 627 | 58% | | 457 | 455 | 453 | 451 | 449 | 447 | 445 | 443 | 441 | 439 | 437 | 435 |
| 2.89 | 34 | 34 | 1156 | 396 | 760 | 66% | 11 | 26 | 26 | 1120 | 468 | 652 | 58% | | 466 | 464 | 462 | 460 | 458 | 456 | 454 | 452 | 450 | 448 | 446 | 444 |
| 2.98 | 34 | 35 | 1190 | 402 | 788 | 66% | 12 | 26 | 26 | 1154 | 474 | 680 | 59% | | 472 | 470 | 468 | 466 | 464 | 462 | 460 | 458 | 456 | 454 | 452 | 450 |
| 3.06 | 35 | 35 | 1225 | 408 | 817 | 67% | 22 | 26 | 27 | 1189 | 480 | 709 | 60% | | 478 | 476 | 474 | 472 | 470 | 468 | 466 | 464 | 462 | 460 | 458 | 456 |
| 3.15 | 35 | 36 | 1260 | 414 | 846 | 67% | 20 | 27 | 27 | 1222 | 490 | 732 | 60% | | 488 | 486 | 484 | 482 | 480 | 478 | 476 | 474 | 472 | 470 | 468 | 466 |
| 3.24 | 36 | 36 | 1296 | 420 | 876 | 68% | 00 | 27 | 27 | 1258 | 496 | 762 | 61% | | 494 | 492 | 490 | 488 | 486 | 484 | 482 | 480 | 478 | 476 | 474 | 472 |
| 3.33 | 36 | 37 | 1332 | 426 | 906 | 68% | 01 | 27 | 28 | 1292 | 503 | 789 | 61% | | 501 | 499 | 497 | 495 | 493 | 491 | 489 | 487 | 485 | 483 | 481 | 479 |
| 3.42 | 37 | 37 | 1369 | 432 | 937 | 68% | 11 | 28 | 28 | 1329 | 512 | 817 | 61% | | 510 | 508 | 506 | 504 | 502 | 500 | 498 | 496 | 494 | 492 | 490 | 488 |
| 3.52 | 37 | 38 | 1406 | 438 | 968 | 69% | 12 | 28 | 28 | 1366 | 518 | 848 | 62% | | 516 | 514 | 512 | 510 | 508 | 506 | 504 | 502 | 500 | 498 | 496 | 494 |
| 3.61 | 38 | 38 | 1444 | 444 | 1000 | 69% | 22 | 28 | 29 | 1404 | 524 | 880 | 63% | | 522 | 520 | 518 | 516 | 514 | 512 | 510 | 508 | 506 | 504 | 502 | 500 |
| 3.71 | 38 | 39 | 1482 | 450 | 1032 | 70% | 20 | 29 | 29 | 1440 | 534 | 906 | 63% | | 532 | 530 | 528 | 526 | 524 | 522 | 520 | 518 | 516 | 514 | 512 | 510 |
| 3.80 | 39 | 39 | 1521 | 456 | 1065 | 70% | 00 | 29 | 29 | 1479 | 540 | 939 | 63% | | 538 | 536 | 534 | 532 | 530 | 528 | 526 | 524 | 522 | 520 | 518 | 516 |
| 3.90 | 39 | 40 | 1560 | 462 | 1098 | 70% | 01 | 29 | 30 | 1516 | 547 | 969 | 64% | | 545 | 543 | 541 | 539 | 537 | 535 | 533 | 531 | 529 | 527 | 525 | 523 |
| 4.00 | 40 | 40 | 1600 | 468 | 1132 | 71% | 11 | 30 | 30 | 1556 | 556 | 1000 | 64% | | 554 | 552 | 550 | 548 | 546 | 544 | 542 | 540 | 538 | 536 | 534 | 532 |

4300 (CONTINUED)

.050 BGA PITCH
.024 BGA PAD
.024 VIA PAD
.012 VIA HOLE
.005 TRACE WIDTH
.005 SPACE 25 x 25 = 625 PIN ARRAY
24 OUTER ROW PINS REMOVED
601 PINS LEFT
336 PINS ROUTED ON TOP
240 PINS ROUTED ON BOTTOM
25 CENTER PINS NOT ROUTED

.050 BGA PITCH
.024 BGA PAD
.024 VIA PAD
.012 VIA HOLE
.005 TRACE WIDTH
.005 SPACE 25 x 25 = 625 PIN ARRAY
24 OUTER ROW PINS REMOVED
601 PINS LEFT
336 PINS ROUTED ON TOP
240 PINS ROUTED ON BOTTOM
25 CENTER PINS NOT ROUTED

← 4400,4450

.050 BGA PITCH
.024 BGA PAD
.024 VIA PAD
.012 VIA HOLE
.005 TRACE WIDTH
.005 SPACE 25 x 25 = 625 PIN ARRAY
24 OUTER ROW PINS REMOVED
601 PINS LEFT
336 PINS ROUTED ON TOP
240 PINS ROUTED ON BOTTOM
25 CENTER PINS NOT ROUTED

FIG. 45

| LOOKUP KEY | OFFSET KEY | POWER NS | POWER EW | POWER NS | POWER EW | POWER NS | POWER EW | POWER NS | POWER EW | POWER NS | POWER EW | POWER NS | POWER EW | POWER NS | POWER EW | POWER NS | POWER EW | POWER NS | POWER EW | CORNERS NE | SE | SW | NW | SEE SAMPLE |
|---|---|---|---|---|---|---|---|---|---|---|---|---|---|---|---|---|---|---|---|---|---|---|---|---|
| 00 | 0 | 0 | 0 | 1 | 0 | 2 | 0 | 1 | 0 | 2 | 0 | 1 | 0 | 2 | 0 | 1 | 0 | 2 | 0 | 23 | 42 | 23 | 42 | FIG. 41 |
| 01 | 0 | 15 | 15 | 15 | 16 | 15 | 16 | 15 | 16 | 15 | 16 | 15 | 16 | 15 | 16 | 15 | 16 | 15 | 16 | 23 | 23 | 42 | 32 | FIG. 42 |
| 02 | 1 | 15 | 16 | 14 | 15 | 14 | 15 | 14 | 15 | 14 | 15 | 14 | 15 | 14 | 15 | 14 | 15 | 14 | 15 | 23 | 32 | 23 | 32 | FIG. 40 (ROTATED) |
| 10 | 0 | 15 | 14 | 16 | 14 | 16 | 14 | 16 | 14 | 16 | 14 | 16 | 14 | 16 | 14 | 16 | 14 | 16 | 14 | 23 | 23 | 32 | 23 | FIG. 42 (ROTATED) |
| 11 | 1 | 16 | 15 | 14 | 15 | 14 | 15 | 14 | 15 | 14 | 15 | 14 | 15 | 14 | 15 | 14 | 15 | 14 | 15 | 32 | 23 | 42 | 32 | FIG. 36 |
| 12 | 0 | 13 | 13 | 13 | 14 | 13 | 14 | 13 | 14 | 13 | 14 | 13 | 14 | 13 | 14 | 13 | 14 | 13 | 15 | 23 | 32 | 32 | 32 | FIG. 38 |
| 20 | 1 | 13 | 14 | 15 | 13 | 14 | 14 | 14 | 15 | 15 | 15 | 15 | 16 | 16 | 15 | 14 | 16 | 16 | 16 | 32 | 33 | 23 | 33 | FIG. 40 |
| 21 | 0 | 14 | 15 | 14 | 14 | 15 | 13 | 14 | 15 | 13 | 15 | 14 | 15 | 14 | 16 | 14 | 15 | 15 | 14 | 33 | 23 | 33 | 23 | FIG. 38 (ROTATED) |
| 22 | -1 | 14 | 14 | 14 | 14 | 14 | 14 | 14 | 15 | 14 | 15 | 15 | 16 | 15 | 16 | 15 | 16 | 15 | 16 | 33 | 33 | 33 | 33 | FIG. 39 |

OPTIMIZATION OF ROUTING LAYERS AND BOARD SPACE REQUIREMENTS FOR BALL GRID ARRAY PACKAGE IMPLEMENTATIONS INCLUDING ARRAY CORNER CONSIDERATIONS

CROSS-REFERENCE TO RELATED APPLICATIONS

This application is a divisional of U.S. patent application Ser. No. 10/650,975, filed on Aug. 29, 2003, which claims the benefit of U.S. Provisional Application No. 60/449,562, filed on Feb. 25, 2003, which are each herein incorporated by reference in their entirety.

The following application of common assignee is related to the present application, has the same filing date as the present application, and is herein incorporated by reference in its entirety:

"Optimization Of Routing Layers And Board Space Requirements For Ball Grid Array Package Implementations Including Single And Multi-Layer Routing." Ser. No. 10/651,164.

BACKGROUND OF THE INVENTION

1. Field of the Invention

The present invention relates to integrated circuit packaging, and more particularly, to improved routing in integrated circuit packages and in circuit boards to which they are mounted.

2. Background Art

Integrated circuit (IC) dies are typically mounted in or on a package that is attached to a printed circuit board (PCB). One such type of IC die package is a ball grid array (BGA) package. BGA packages provide for smaller footprints than many other package solutions available today. A BGA package has an array of solder ball pads located on a bottom external surface of a package substrate. Solder balls are attached to the solder ball pads. The solder balls are reflowed to attach the package to the PCB. The IC die is mounted to a top surface of the package substrate. Wire bonds typically couple signals of the IC die to the substrate. The substrate has internal routing which electrically couples the IC die signals to the solder balls on the bottom substrate surface.

BGA packages are widely used in the IC packaging industry. BGA packages have many beneficial characteristics, including high reliability, a relatively mature assembly process, relatively low cost, and good thermal and electrical performances. Existing BGA packages, however, have limitations that affect their ability to be used for advanced IC die applications.

Increasingly more functions are being integrated into individual IC dies. Thus, BGA package substrates must interface a greater number of input/output (I/O) signals, and powers and grounds, with the PCB. Thus, signal routing in both the package substrate and PCB is becoming more complex. Hence, to accommodate these difficulties, increasingly larger BGA package sizes are being used, with larger arrays of solder ball pads. Furthermore, the number of layers of the package substrate is increasing. However, these changes have undesirable consequences, including an increase in the cost of the BGA package, and a larger BGA package footprint on the PCB.

Hence, what is needed are BGA packages that can accommodate increasingly larger IC dies, while maintaining or reducing the overall BGA package size. Furthermore, what is needed are techniques for reducing the complexity of BGA package and related PCB signal routing.

BRIEF SUMMARY OF THE INVENTION

The present invention provides a method and apparatus for improving signal routing of integrated circuit (IC) packages and printed circuit boards (PCBs). The present invention further provides improved contact pad arrays for IC packages, and improved land patterns for attaching the IC packages. The land patterns and arrays are formed with edge rows that are not fully populated with contact pads. Spaces in the non-fully populated edge rows allow for additional signal routing channels, which eases IC package and PCB design and manufacturing and improves performance.

In an aspect of the present invention, an IC package includes a substrate material having a first side configured to receive a semiconductor chip. A second side of the substrate has a plurality of contact or conductive pads arranged in an array of rows and columns. One or more edges of the array are not fully populated with pads.

In another aspect, a land pattern for interfacing an IC package includes a plurality of contact or conductive pads arranged in an array of rows and columns. One or more edges of a perimeter of the array is not fully populated with conductive pads. Spaces created in the edges by missing conductive pads create additional routing channels for signals from conductive pads within the array to be routed external to the array through the edges.

In another aspect, a PCB includes a substrate material and a plurality of conductive features on a first side of the PCB. The conductive features include a plurality of contact or conductive pads arranged in an array of rows and columns. The array of conductive pads is configured to receive mounting thereon of an integrated circuit device. One or more edges of a perimeter of the array is not fully populated with conductive pads. Spaces created in the edges by missing conductive pads create additional routing channels for signals from conductive pads within the array to be routed external to the array through the edges.

According to aspects of the present invention, any number of one or more of the spaces are created in any number of one or more edges to create the additional routing channels.

In an aspect of the invention, a number of spaces to be formed in an edge (i.e., the number of spaces not occupied by a conductive pad) is optimized, such that little or no benefit in signal routing capacity will be gained by adding further spaces to an edge, and that signal routing capacity may be reduced by removing spaces. For example, in an example aspect of the invention, an optimized number of spaces is calculated according to $$S=INT((E-5)/3),$$

where:
S=the number of spaces to be formed in the edge;
E=a number of conductive pads in the edge, if fully populated; and
INT is an INTEGER function, rounded down.

In one aspect of the invention, a ratio of conductive pads in an edge to a number of spaces in the edge is at least 2 to 1.

Furthermore, the present invention describes a method and system for designing a land pattern for mating an IC package/device to a PCB. A number of required pins is determined. An array pattern is selected to yield the required pins. A number of required perimeter routing channels is determined. A size of the array is optimized to yield the required perimeter routing channels. At least one perimeter edge of the array is under-populated.

In an aspect, a perimeter edge of the array is under-populated by adding at least one non-fully populated perimeter edge of pins to the array.

In an alternative aspect, a perimeter edge of the array is under-populated by removing pins from at least one existing fully populated perimeter edge of the array.

In another aspect of the present invention, a method and apparatus for a land pattern in a multi-layer printed circuit board is described. A first layer of the circuit board comprises a substrate material. A plurality of conductive features are formed on a surface of the first layer. The conductive features include a first plurality of conductive pads arranged in a first array of rows and columns that are configured to receive mounting thereon of an integrated circuit device. A second layer of the circuit board comprises a substrate material. A second plurality of conductive pads are arranged in a second array of rows and columns on a surface of the second layer. The second array includes fewer rows and columns than the first array. A plurality of conductive vias through the circuit board electrically couple at least a portion of the first plurality of conductive pads to corresponding conductive pads of the second plurality of conductive pads. At least one edge of a perimeter of the first array is not fully populated with conductive pads. Spaces created in the edge by missing conductive pads create additional routing channels for signals from conductive pads within the first array to be routed external to the first array through the edge.

In another aspect, additionally or alternatively, spaces can be created in at least one edge of the second array on the second layer to create additional routing channels for signals from conductive pads within the second array to be routed external to the second array through the edge.

In another aspect, the multi-layer circuit board can have further layers. The further layers can have additional pluralities of conductive pads arranged in arrays that are coupled by vias through the circuit board to the first array. These additional arrays can have spaces in edges to create additional routing channels for signals from conductive pads within the arrays to be routed external to the respective array.

In another aspect of the present invention, a method and system for designing a land pattern for mating an integrated circuit device to a printed circuit board is described. A number of required pads is determined. A number of layers of the printed circuit board to have routing channels is determined. A land pattern is selected to yield the required pads. A number of required perimeter routing channels is determined for an array of conductive pads on each layer of the determined number of layers. A size of the land pattern is optimized to yield the required perimeter routing channels in each layer. A least one perimeter edge on at least one layer is under populated with conductive pads.

In still another aspect of the present invention, a system and method for designing a land pattern for mating an integrated circuit device to a printed circuit board is described. A number of required pads is determined. A number of required perimeter routing channels is determined. A land pattern is selected to yield the required number of pads and number of required perimeter routing channels. The selected land pattern incorporates one or more corner pad arrangements. A corner pad arrangement includes pads of two edges that converge at a corner of the land pattern. A corner pad arrangement has one or more known characteristics, such as a number of lost or unusable routing channels. This number can be used to aid in determining an overall routing channel capacity for a land pattern incorporating the corner pad arrangement.

In a further aspect, a land pattern that yields the required number of pads and number of required perimeter routing channels is selected according to the following: A potential land pattern that at least yields the required pads is selected. A pad arrangement is selected for at least one corner portion of the selected potential land pattern. At least one perimeter edge of the selected potential land pattern is under populated. It is then determined whether the selected potential land pattern yields at least the determined number of required perimeter routing channels.

In an aspect, this process for selecting the land pattern can be repeated for subsequent potential land patterns if the first potential land pattern is inadequate in terms of routing channels, for comparison purposes, or for other reasons.

The foregoing and other features and advantages of the invention will be apparent from the following more particular description of the embodiments of the invention, as illustrated in the accompanying drawings.

BRIEF DESCRIPTION OF THE DRAWINGS/FIGURES

The accompanying drawings which are incorporated therein and form a part of the specification illustrate the present invention and together with the description further serves to explain the principles of the invention and to enable a person skilled in the art to make and use the invention.

FIG. 1 illustrates an example ball grid array package.

FIG. 2 illustrates an example array of solder ball pads, fully populated.

FIGS. 6A and 6B show a table providing optimized land pattern and array information, according to embodiments of the present invention.

FIG. 7A shows a conductive pad pattern, which is similar to the pattern shown in FIG. 5A, with an additional perimeter of conductive pads added thereto.

FIG. 7B shows the conductive pad pattern of FIG. 7A, with the additional perimeter edges not fully populated with pads, according to an embodiment of the present invention.

FIG. 8 shows a flowchart providing steps for designing a land pattern or array, according to an example embodiment of the present invention.

FIG. 9 shows a table providing various dimensions for a variety of conductive pad arrays that are applicable to the present invention.

FIGS. 10-15 show various layers in an example multi-layer embodiment of the present invention.

FIG. 16 shows a pad/pin layout for the example multi-layer embodiment of FIGS. 10-15, according to an embodiment of the present invention.

FIG. 33 shows a table providing data related to the corner pad arrangements of FIGS. 18-32, according to an example embodiment of the present invention.

FIG. 37 shows a table providing corner arrangement and routing channel data for an example set of land patterns, according to an embodiment of the present invention.

FIGS. 43A and 43B show a table similar to the table shown in FIGS. 6A and 6B, modified to account for corner pad arrangements in arrays/land patterns, according to an embodiment of the present invention.

FIG. 45 shows a table providing corner arrangement for an example set of land patterns having particular required numbers of power channels, according to an embodiment of the present invention.

Figure 3:
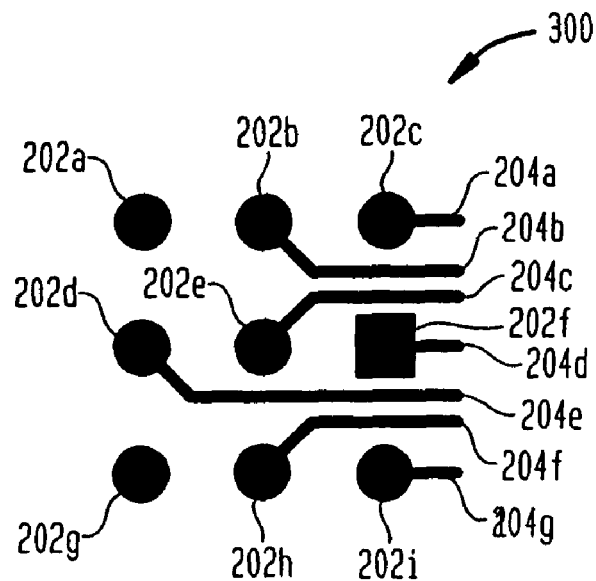
FIG. 3 shows an example subset of a conventional, fully populated, solder ball pad array having nine solder ball pads, with corresponding signal routing.

The present invention will now be described with reference to the accompanying drawings. In the drawings alike reference numbers indicate identical or functionally similar elements. Additionally, the left-most digits of a reference number identifies the drawing in which the reference number first appears.

DETAILED DESCRIPTION OF THE INVENTION

Overview

The present invention is directed to the optimization of routing layers and board space requirements in integrated circuit (IC) packages and printed circuit boards (PCBs). For example, the present invention is applicable in land grid array (LGA), pin grid array (PGA), chip scale package (CSP), ball grid array (BGA), and other integrated circuit package types, and their respective PCB land patterns. The present invention is applicable to all types of package substrates, including ceramic, plastic, and tape (flex) substrates. Furthermore the present invention is applicable to die-up (cavity-up) and die-down (cavity-down) IC die orientations. For illustrative purposes, the present invention is described herein as being implemented in a BGA package. However, the present invention is applicable to the other integrated circuit package types mentioned herein, and to additional integrated circuit package types.

Note that the terms "contact pad," "contact," and "conductive pad" are used interchangeably herein to refer to an element that makes electrical contact. Furthermore, although the description below primarily refers to IC packages having "pads" for making electrical contact, the present invention is also applicable to IC packages having "pins" or sockets for making electrical contact.

Furthermore, as used herein, "array" refers to a group of combination of conductive pads or pins on a surface of a PCB or substrate. For example, "array" is used to refer to a group or combination of conductive pads or pins of an IC package substrate, typically arranged in rows and columns, for interfacing with a PCB or other structure, when mounted thereto. As used herein, "land pattern" refers to a type of array, primarily referring to a group or combination of conductive pads on a surface of a PCB or other structure, typically arranged in rows and columns, intended for the mounting of an IC package. A "land pattern" is also known as "footprint," and these terms are used interchangeably herein.

Note that, for illustrative purposes, the present specification and drawings sometimes refer to either land patterns or arrays. It is to be understood, however, that the description below related to forming non-fully populated edges is fully applicable to both land patterns and arrays.

Ball grid array package types are described below. A discussion of the present invention is provided, and then various embodiments of the present invention are described. Initially, conceptual embodiments are described that encompass the invention more generally, and can also be considered to be approximations. Description of these embodiments is followed by description of more specific embodiments relating to more complete implementations. Note that the embodiments described herein may be combined in any applicable manner, as required by a particular application.

Ball Grid Array (BGA) Package

A ball grid array (BGA) package is used to package and interface an IC die with a printed circuit board (PCB). BGA packages may be used with any type of IC die, and are particularly useful for high speed ICs. In a BGA package, solder pads do not just surround the package periphery, as in chip carrier type packages, but may cover the entire bottom package surface in an array configuration. BGA packages are also referred to as pad array carrier (PAC), pad array, land grid array, and pad-grid array packages. BGA package types are further described in the following paragraphs. For additional description on BGA packages, refer to Lau, J. H., *Ball Grid Array Technology*, McGraw-Hill, New York, (1995), which is herein incorporated by reference in its entirety.

Die-up and die-down BGA package configurations exist. In die-up BGA packages, the IC die is mounted on a top surface of a substrate or stiffener, in a direction away from the PCB. In die-down BGA packages, the IC die is mounted on a bottom surface of the substrate or stiffener, in a direction towards the PCB.

A number of BGA package substrate types exist, including ceramic, plastic (PBGA), and tape (also known as "flex"). FIG. 1 illustrates a conventional flex BGA package 100. BGA package 100 includes an IC die 102, a substrate 104, a plurality of solder balls 106, and one or more wire bonds 108.

Substrate 104 is generally made from one or more conductive layers bonded with a dielectric material. For instance, the dielectric material may be made from various substances, such as polyimide tape. Tape (or "flex") substrates are particularly appropriate for large IC dies with large numbers of input and outputs, such as application specific integrated circuits (ASIC) and microprocessors. The conductive layers are typically made from a metal, or combination of metals, such as copper and/or aluminum. Trace or routing patterns are made in the conductive layer material. Substrate 104 may be a single-layer tape, a two-layer tape, or additional layer tape substrate type. In a two-layer tape, the metal layers sandwich the dielectric layer, such as in a copper-Upilex-copper arrangement. Substrate 104 may alternatively be a plastic, ceramic, or other substrate type.

IC die 102 is attached directly to substrate 104, for example, by an epoxy or other die-attach material. IC die 102 is any type of semiconductor integrated circuit, separated from a semiconductor wafer.

One or more wire bonds 108 connect corresponding bond pads 118 on IC die 102 to contact pads 120 on substrate 104. Bond pads 118 are I/O pads for IC die 102 that make internal signals of IC die 102 externally available. Note that alternatively, IC die 102 may be flipped and mounted to substrate 104 by solder balls located on the bottom surface of IC die 102, by a process commonly referred to as "C4" or "flip chip" packaging. In such an embodiment, wire bonds 108 are not required.

Encapsulating material 116 covers IC die 102 and wire bonds 108 for mechanical and environmental protection. Encapsulating material 116 is a mold compound, epoxy, or other applicable encapsulating substance.

As shown in FIG. 1, BGA package 100 does not include a stiffener. In some BGA package types, particularly in tape or flex BGA packages, a stiffener can be attached to the substrate to add planarity and rigidity to the package.

BGA package 100 includes an array of solder ball pads located on a bottom external surface of substrate 104 for attachment of solder balls 106. Wire bonds 108 are electrically connected to solder balls 106 underneath substrate 104 through corresponding vias and routing in substrate 104. The vias in substrate 104 can be plated or filled with a conductive material, such as solder, to allow for these connections. Solder balls 106 are used to attach BGA package 100 to the PCB.

FIG. 2 shows an example land pattern 200. Land pattern 200 is located on a surface 210, which may be a surface of a PCB (i.e., for attachment of a BGA or other IC package), for example. In FIG. 2, land pattern 200 is shown as a 12×12 array of rows and columns of conductive pads 202. Conductive pads 202 may be solder ball contact pads, or other contact or conductive pad types. For illustrative purposes, land pattern 200 is shown as a 12×12 array of conductive pads 202. However, the present invention is applicable to arrays and land patterns of different sizes.

Land pattern 200 includes first, second, third, and fourth edge portions 220a, 220b, 220c, and 220d, which are each indicated by a respective rectangle in FIG. 2. As shown in FIG. 2, each edge portion 220 includes the number of conductive pads 202 serially aligned along an entire edge of land pattern 200, minus one corner conductive pad 202. Thus, the four edges of land pattern 200 include twelve conductive pads 202, while first, second, third, and fourth edge portions 220a-220d each include eleven conductive pads 202 (i.e., 12−1=11).

FIG. 2 also shows portions of first and second electrically conductive routing channels 204a and 204b on surface 210 (for illustrative purposes, other routing channels on surface 210 are not shown). First and second routing channels 204a and 204b are routed through a space between first and second conductive pads 202a and 202b. Due to the spacing of solder balls 202 in land pattern 200, and due to a particular routing channel width, only two routing channels can be routed through a gap between any two conductive pads 202, such as first and second conductive pads 202a and 202b. Such an arrangement reduces costs and optimizes manufacturing constraints relative to other spacing and routing channel arrangements. However, this arrangement causes difficulties in routing a sufficient number of signals from conductive pads 202 within land pattern 200 to points on surface 210 outside of land pattern 200.

For example, FIG. 3 shows an example land pattern portion 300 having a conventional arrangement of conductive pads 202. Land pattern portion 300 includes nine conductive pads 202a-202i. For illustrative purposes, conductive pad 202f is shown as square-shaped. For the purposes of the example of FIG. 3, it is desired to route signals from each of conductive pads 202a-202i to destinations to the right of land pattern portion 300, through land pattern portion 300. As described above, only two routing channels 204 are possible in a space between any two adjacent conductive pads 202. Thus, as shown in FIG. 3, routing channels are possible only for seven of the nine conductive pads 202a-202i. Routing channels 204a-204g correspond to conductive pads 202b-202f, 202h, and 202i. Due to spacing constraints of land pattern portion 300, conductive pads 202a and 202g are not able to be routed externally from land pattern portion 300. As described below, the present invention allows for a greater number of routing channels 204 than conventional land pattern portion 300.

Embodiments of The Present Invention for Improved Routing

Example embodiments for improving IC package-related signal routing are provided below. These embodiments are provided for illustrative purposes, and are not limiting. Alternative embodiments will be apparent to persons skilled in the relevant art(s) based on the discussion contained herein. As will be appreciated by persons skilled in the relevant art(s), other array and land pattern configurations are within the scope and spirit of the present invention.

According an embodiment of the present invention, routing channel capacity is improved by using land patterns and/or arrays having edge rows and/or columns that are not fully populated with conductive pads. Spaces in the edges are formed that create additional routing channels so that more signals can be routed from the land pattern or array. This subsection relates to embodiments that tend to be more conceptual/approximations, although in some embodiments, the embodiments described in this subsection can provide optimum/exact results. For example, for this subsection, the accuracy in numbers of routing channels determined for a particular edge can have a range of +/−1 routing channel, or even better results.

Figure 4:
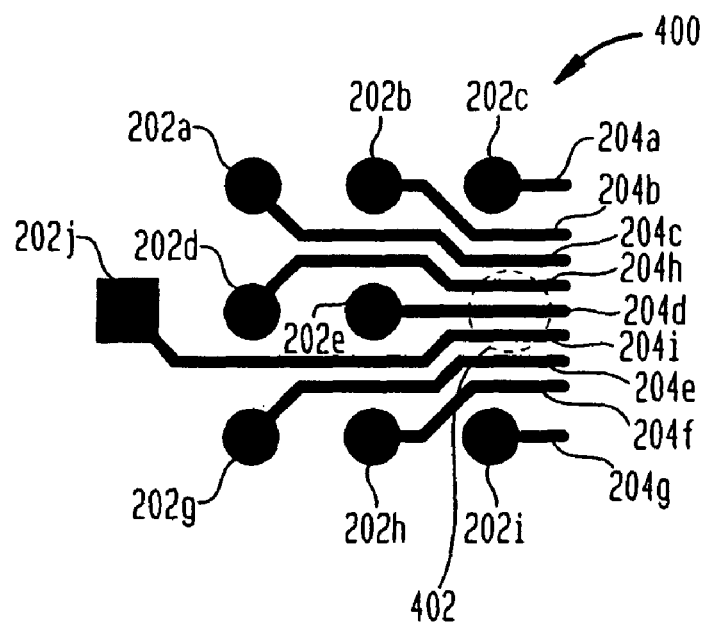
FIG. 4 shows a subset of a non-fully populated solder ball pad array having nine solder ball pads, and corresponding signal routing, according to an example embodiment of the present invention.

For example, FIG. 4 shows an example land pattern portion 400 having conductive pads 202 arranged according to an embodiment of the present invention. As shown in FIG. 4, as compared to land pattern portion 300 shown in FIG. 3, conductive pad 202f has been replaced with an opening or space 402. A conductive pad 202j has been added to the left side of land pattern portion 400 for illustrative purposes. By forming space 402 in the peripheral edge of land pattern portion 400, additional signal routing channels are available. For example, in contrast to FIG. 3, as shown in FIG. 4, two additional routing channels 204h and 204i are present due to space 402. Thus, all nine conductive pads 202a-202e and 202g-202j are able to be routed externally from land pattern portion 400.

In the present embodiment (having, for example, a line width of 0.005", a spacing of 0.005", a pad width of 0.024", and a ball or pad pitch of 0.050", or having other similar relative dimensions), a space 402 in an edge allows for two additional routing channels (i.e., in addition to the routing channel coupled to the pad/pin that would otherwise occupy space 402), for a total of three routing channels related to space 402. Note that in alternative embodiments having different routing channel widths or spacings, a space 402 may instead allow for fewer or more than two additional routing channels 204.

The present invention has numerous advantages. For instance, the present invention allows a greater percentage of contact pads/pins to be accessible by routing channels. The present invention further allows for a reduced overall IC package size. For example, the present invention allows for a smaller IC package and/or PCB substrate surface area, and/or for fewer substrate layers. Hence, the present invention also reduces IC package and PCB costs.

Furthermore, the present invention reduces a time required to select pad or pin assignments. Still further, the present invention offers a non-standard pad pitch that is practical for high-volume production. Furthermore, the present invention reduces a number of pads/pins that are forced to be "orphaned" (i.e., cannot be externally routed from within the land pattern or array on the same layer as other signals). Furthermore, the present invention allows a larger number of signals to be routed on a single board layer. The present invention has numerous further advantages.

As described above, according to the present invention, conductive pad patterns are formed having one or more edges that are not fully populated with solder ball pads. The locations of openings or spaces 402 in an edge of a solder ball pad pattern can be selected manually or automatically, or by a combination thereof. For example, a layout designer may manually select the placement of one or more openings or spaces 402 in an edge of a solder ball pad pattern. Alternatively, an automated system may select the locations for the one or more openings or spaces 402. The automated system may include hardware, software, firmware, or any combination thereof, to perform the present invention.

Furthermore, in an embodiment, a layout designer or automated system may use a library of land pattern and/or array subsections that include non-fully populated edge portions to assist in creating board layouts. For example, land pattern portion 400 may be included in such a library. Therefore, land pattern portion 400 could be selected from the library from other land pattern portions to create a partial or complete land pattern. Further land pattern or array subsections for inclusion in a library will be apparent to persons skilled in the relevant art(s) from the teachings herein.

According to an embodiment of the present invention, routing channel capacity is improved by removing one or more pads/pins from a perimeter side or edge of the land pattern or array. In an alternative embodiment, routing capacity is improved by adding a non-fully populated perimeter side or edge to a land pattern or array. These embodiments are fully described in the sub-sections below.

Embodiments Improving Routing Capacity by Removing Pads

As described above, routing capacity may be increased by removing one or more pins/pads from a peripheral edge of a land pattern or array. In embodiments of the present invention, any number of pins/pads may be removed from any number of edges of the land pattern or array. Furthermore, the pins/pads may be removed from any pin/pad location of an edge.

In an embodiment, an edge of a land pattern or array can be viewed as having one or more "sets" of conductive pad positions. A set may include any number of two or more adjacent conductive pad positions. An opening or space 402 may be positioned in each such set to replace a conductive pad. For example, similarly to land pattern portion 400 of FIG. 4, a space 402 can be located in a set of three edge conductive pad positions. In an embodiment, it is advantageous to use one space 402 for every three conductive pad positions. The space 402 may be located in any of the three edge conductive pad positions, including a middle conductive pad position. In such an embodiment, any number of such sets of three conductive pad positions may be placed in a particular edge of a land pattern or array to provide additional routing channels. Thus, the particular edge may have a ratio of conductive pads to spaces of 2 to 1, or greater, depending on how many sets are used.

In another embodiment, a number of openings or spaces 402 positioned in a solder ball pad edge portion 220 (i.e., the number of spaces not occupied by a conductive pad) may be optimized, such that little or no benefit in signal routing capacity is gained by adding further spaces 402 to the edge portion 220, and such that signal routing capacity may be reduced by removing spaces 402. For example, a optimized number of spaces 402 may be determined according to an equation, such as Equation 1 shown below:

$$S=INT((F-4)/3) \qquad \text{Equation 1}$$

Where:
F=a number of conductive pad positions in an edge portion 220 (i.e., length of the entire edge in solder ball pads, minus one solder ball pad), if fully populated;
S=a number of spaces 402 to be located in the edge portion 220; and
INT is an INTEGER function, rounded down (e.g., INT (3.9)=3).

Figure 5A:
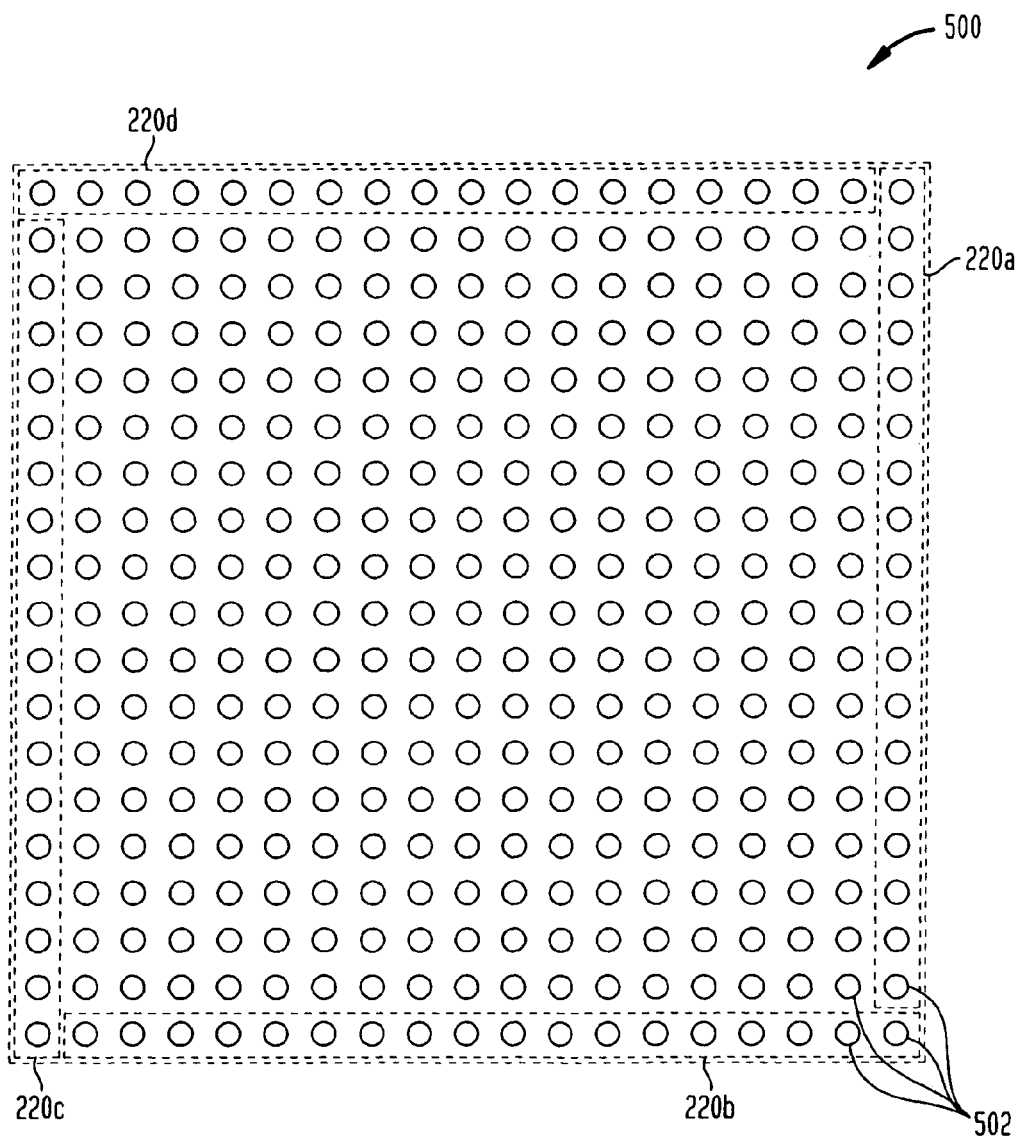
FIG. 5A shows an example conductive pad pattern.

An example application of Equation 1 is described with respect to an example land pattern 500, shown in FIG. 5A. As shown in FIG. 5A, land pattern 500 is a 19×19 array of conductive pad positions 502. Edge portions of land pattern 500 are designated as first, second, third, and fourth edge portions 220a-220d. Each of the four edges of land pattern 500 includes 19 conductive pad positions 502. Thus, each of edge portions 220a-220d includes 18 conductive pad positions 502 (e.g., 19−1=18). A number of spaces 402 for an edge portion 220 may be determined using Equation 1. For example, the number of spaces 402 to be located in edge portion 220a may be calculated as follows:

$$S=INT((18-4)/3)=INT(4.666)=4$$

Figure 5B:
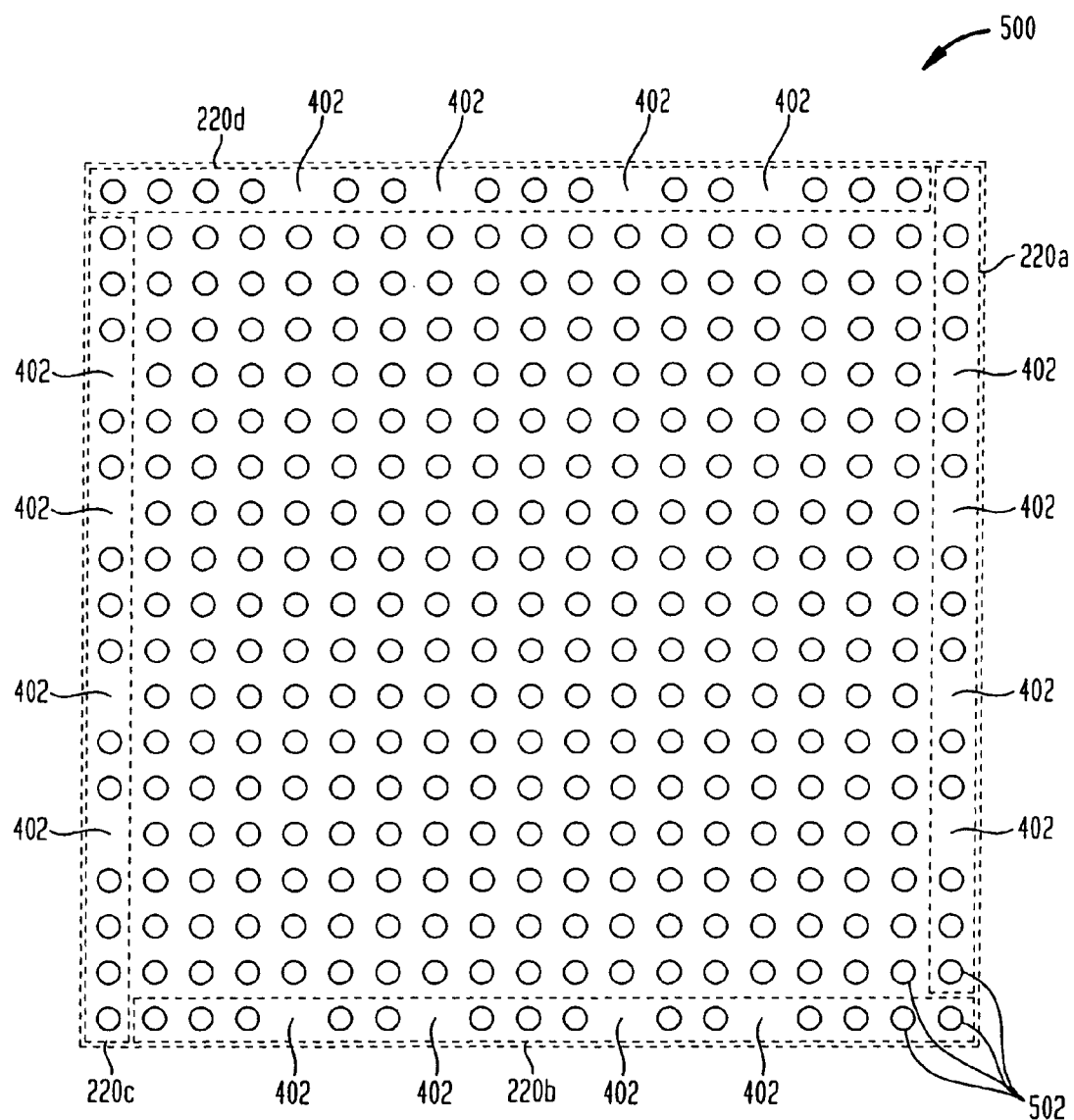
FIG. 5B shows the conductive pad pattern of FIG. 5A with conductive pads removed from a periphery, according to an example embodiment of the present invention.

Thus, according to Equation 1, the number of spaces 402 to be located in edge portion 220a is four. Accordingly, FIG. 5B shows land pattern 500, revised to include four spaces 402 in each of edge portions 220a-d, as calculated by Equation 1, according to an embodiment of the present invention. Land pattern 500 of FIG. 5B resultingly has a greater routing channel capacity than the land pattern of FIG. 5A.

Figure 5C:
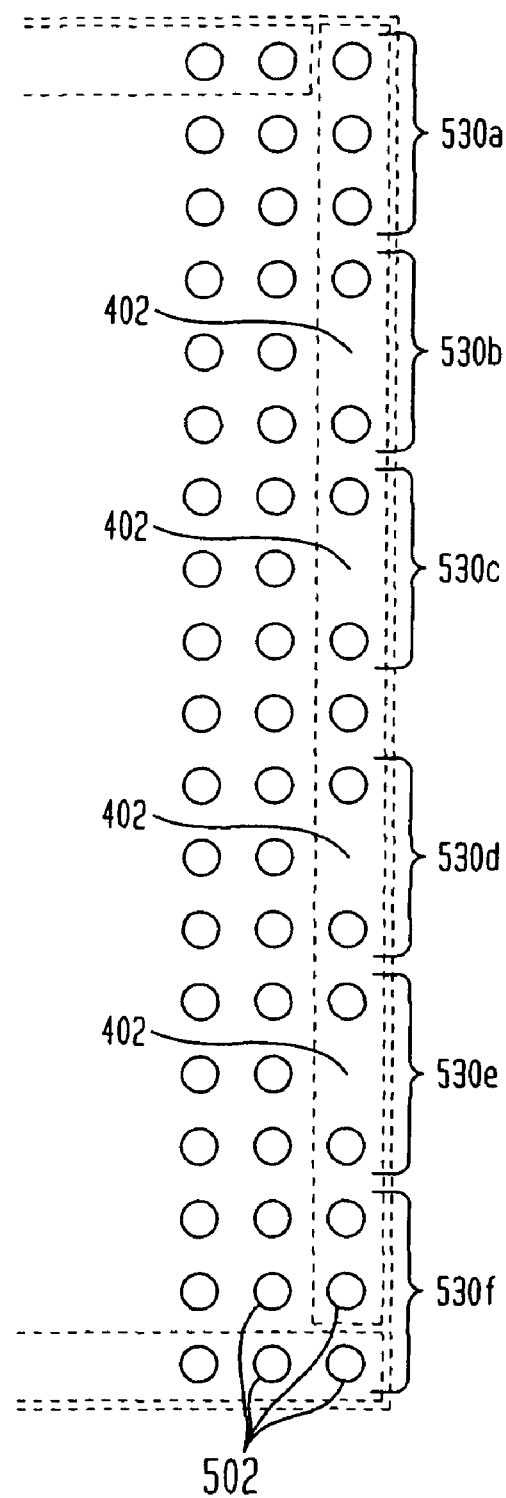
FIG. 5C shows a portion of the conductive pad pattern of FIG. 5B.

As described above, in an embodiment, an edge can be viewed as including sets of conductive pad positions. For example, FIG. 5C shows a portion of land pattern 500 of FIG. 5B. As shown in FIG. 5C, an edge of land pattern 500 can be segmented into six sets of three conductive positions: a first set 530*a*, a second set 530*b*, a third set 530*c*, a fourth set 530*d*, a fifth set 530*e*, and a sixth set 530*f*. As shown in FIG. 5C, each of second set 530*b*, third set 530*c*, fourth set 530*d*, and fifth set 530*e* have a middle conductive pad position filled with a space 402. Extra routing channels are available for each of these sets of conductive pad positions due to their respective spaces 402.

In embodiments, a set of conductive pad positions that includes a corner conductive pad position may or may not include a space 402. In some instances, little benefit is provided by locating a space 402 in or near a corner, because conductive pads in and near a corner of a land pattern are more easily accessed by routing channels. This is because corner conductive pad positions are accessible from two sides of the land pattern, as opposed to other edge positions, which can only be readily accessed from a single side. Thus, in the example embodiment shown in FIG. 5C, no spaces 402 are located in first set 530*a* and sixth set 530*f*. However, in alternative embodiments, one or more spaces 402 may be positioned in or near the corners of a land pattern, such as in first and/or sixth sets 530*a* and 530*f*.

Figure 5D:
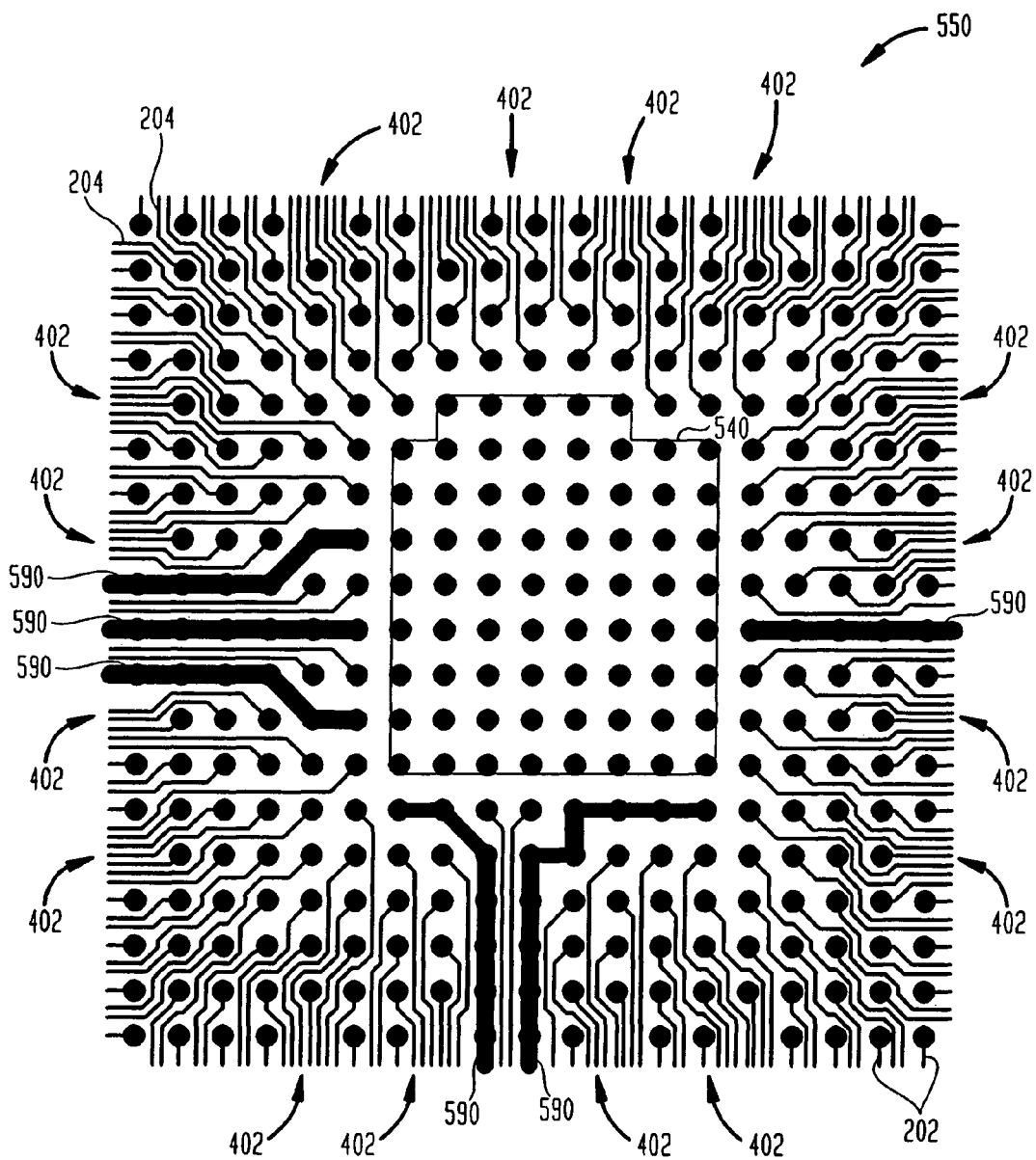
FIG. 5D shows a land pattern with example signal routing, according to an embodiment of the present invention.

As described above, spaces 402 allow for extra routing channels. FIG. 5D shows a land pattern 550, which is similar to land pattern 500, with numerous conductive features shown, including routing channels 204, according to an embodiment of the present invention. As shown in FIG. 5D, a larger amount of routing channels 204 is possible in the area in and around spaces 402. This larger amount of routing channels allows for a greater number of conductive pads 202 of land pattern 550 to be routed to destinations outside of land pattern 550. As shown in FIG. 5D, conductive pads 202 in an "isolated" area 540 are not routed to destinations external to land pattern 550. For example, conductive pads 202 in area 540 can be power pads, ground pads, test signal pads, or any combination thereof. All conductive pads 202 outside of isolated area 540 are routed by a corresponding routing channel 204 to destinations external to land pattern 550. Without the presence of spaces 402, isolated area 540 would include a larger proportion of isolated conductive pads 202 of land pattern 550.

Note that Equation 1 may be rewritten in terms of complete edges, instead of edge portions 220, as follows:

$$S=INT(((E-1)-4)/3)$$

or $$S=INT((E-5)/3) \qquad \text{Equation 1A}$$

Where:
E=a number of conductive pads in the entire edge of the land pattern, if fully populated (i.e., E includes both corner pads and pads between them).

Thus, for land pattern 500 shown in FIG. 5A, a number of spaces S to be located in a entire edge can be calculated using Equation 1A, as follows:

$$S=INT((19-5)/3)=INT(4.666)=4$$

Thus, Equation 1A arrives at the same result as calculated by Equation 1 for land pattern 500, above.

Thus, as described above, a number of spaces 402 to be located in one or more edges of a land pattern can be calculated according to Equations 1 and 1A. In alternative embodiments of the present invention, a number of spaces 402 to be located in an edge of a land pattern can be determined by referring to a table, such as Table 600, which is shown in FIGS. 6A and 6B. Table 600 contains information directed to numerous sizes of IC packages. Table 600 can be referred to by a user, manually, or can be incorporated in an automatic system. The information present in Table 600 is described, column by column, in the following paragraphs:

Column 602 shows, for each row of Table 600, an area required by a land pattern or array, having row and column pad/pin counts shown in columns 604 and 606. Column 602 shows area data in square inches.

Column 604 shows, for each row of Table 600, a count of pads or pins in a row (X) of the land pattern or array of column 602 (without operation of the present invention).

Column 606 shows, for each row of Table 600, a count of pads or pins in a column (Y) of the land pattern or array of column 602 (without operation of the present invention).

Column 608 shows, for each row of Table 600, a total number of pads or pins for the entire land pattern or array (prior to replacement of any conductive pads with spaces 402).

Column 610 shows, for each row of Table 600, a total number of externally available pads or pins for the entire land pattern or array prior to operation of the present invention. "Externally available" pads or pins are those that can be routed outside of the particular land pattern or array on the same substrate layer, and are therefore not "orphaned."

Column 612 shows, for each row of Table 600, a total number of internal or "orphaned" pads or pins for the entire land pattern or array prior to operation of the present invention. Internal or "orphaned" pads or pins are those that cannot be routed outside of the particular land pattern or array on the same substrate layer as the externally available pads or pins. Note that some IC package signals may be coupled to internal pins without substantially affecting package performance. For example, such pins include power and/or ground, which are coupled to power and/or ground planes in the PCB (through vias) when the IC package is mounted to the PCB. Other IC package signals that are coupled to internal or orphaned pins may include proprietary signals used only during test of the IC package, and other signals used during development of the PCB assembly.

Column 614 shows, for each row of Table 600, a percentage of pads or pins that are internal or orphaned for the entire land pattern or array (without operation of the present invention). Thus, for each row, a value in column 614 may be calculated as follows:

$$\text{value in column } 614 = \frac{\text{value in column } 612}{\text{value in column } 610} \times 100$$

Column 616 shows, for each edge row of the particular land pattern or array, a number of pads present (not counting one of the corner pads), after removal of peripheral pads or pins according to the present invention.

Column 618 shows, for each edge column of the particular land pattern or array, a number of pads present (not counting one of the corner pads), after removal of peripheral pads or pins according to the present invention.

Column 620 shows, for each row of Table 600, a resulting total number of pads or pins remaining for the entire land pattern or array, after removal of peripheral pads or pins according to the present invention.

Column 622 shows a total number of externally available pads or pins for the entire land pattern or array after removal of pads or pins according to the present invention.

Column 624 shows a total number of internal or "orphaned", unavailable pads or pins for the entire land pattern or array after removal of pads or pins according to the present invention.

Column 626 shows a percentage of pads or pins that are internal or orphaned for the entire land pattern or array after removal of pads or pins according to the present invention. Thus, for each row, a value in column 626 may be calculated as follows:

$$\text{value in column } 626 = \frac{\text{value in column } 624}{\text{value in column } 622} \times 100$$

Columns 628-650 show a total number of externally available pads or pins for the entire land pattern or array after removal of pads or pins for additional routing channels, that is further reduced due to a selected number of externally accessible power channels. In the present example, for every external power channel selected, the number of externally available pins is reduced by two. Thus, the values in columns 628-650 may be calculated as follows:

$$\begin{array}{l}\text{each value}\\\text{in columns}\\\text{628-650}\end{array} = \begin{array}{l}\text{value in}\\\text{column } 622\end{array} - \begin{array}{l}2 \times \text{number of external}\\\text{power channels selected}\\\text{(value in row } 652)\end{array}$$

Note that in alternative embodiments, the number of externally available pins may be reduced by amounts greater or less than two. FIG. 5D shows several example power channels 590, according to the present invention.

Thus, information in Table 600 shown in FIGS. 6A and 6B can be consulted to determine a number of spaces 402 to be positioned in one or more edges of a land pattern or array. For example, a row 660 of Table 600, shown in FIG. 6A, can be consulted for land pattern 500 of FIG. 5A. As shown in columns 604 and 606 of Table 600, row 660 applies to a 19×19 array of pad positions, such as land pattern 500. Columns 616 and 618 indicate that edge portions (i.e., not counting one of the corner pad positions of the edge) can be modified to include 14 solder ball pads. This is shown in FIG. 5B, where four spaces 402 are positioned in each of edge portions 220a-220d of land pattern 500. Thus, Table 600 provides a result similar to that for Equations 1 and 1A described above. Information present in Table 600 may be referred to for any land pattern or array of sizes 11×11 through 31×31. Furthermore, the information of Table 600 may be extended to larger and smaller land pattern and array sizes, as would be understood by persons skilled in the relevant art(s) from the teachings herein. The present invention can be applied to array and land patterns of any size, even sizes much greater than 31×31.

Table 600 also provides an indication of routing channel improvements due to embodiments of the present invention. As shown in column 608 for row 660 of Table 600, land pattern 500 originally had 361 pads or pins (i.e., as shown in FIG. 5A). As indicated in column 620, after inclusion of four spaces 402 in each edge of land pattern 500 (i.e., as shown in FIG. 5B), land pattern 500 can have a total number of 345 pads or pins. As indicated in column 610, land pattern 500 originally had 216 pads or pins that were externally accessible by routing channels. As indicated in column 622, land pattern 500 can have 248 pads or pins that are externally accessible by routing channels, an increase of 32 pads or pins. As indicated in columns 612 and 624, the number of internal or orphaned pads or pins has been reduced from 145 to 97. Thus, while reducing a total pad or pin count for land pattern 500 by 16 pads or pins, 32 additional pads or pins are available for signal routing in land pattern 550. Thus, the present invention increases the availability of pads or pins.

In the example of land pattern 550 shown in FIG. 5D, six power channels 590 are present. Column 638 of Table 600 indicates that in an embodiment, a total of 236 pads or pins can be externally accessible by routing channels when six power channels 590 are present. Thus, land pattern 550 is shown in FIG. 5D having 236 externally accessible routing channels, corresponding to 236 pads or pins. Land pattern 550 has 69 orphaned pads or pins in a central region. Land pattern 69 has 40 pads or pins coupled to the six power channels 590. Thus, a sum of the 236 pads or pins, 69 orphaned pads or pins, and 40 pads or pins coupled to power channels 590 equals the total of 345 pads or pins shown in column 620 of Table 600. Thus, example land pattern 550 has a greater number of routing channels than indicated in column 610, and fewer orphaned pads or pins than are indicated in column 612 of Table 600.

Thus, the present invention increases the availability of pads or pins, which therefore allows the use of smaller package sizes, and fewer routing layers, for example.

Embodiments Improving Routing Capacity by Adding Pads

As described above, in an embodiment, routing capacity is improved for a land pattern or array by adding a non-fully populated perimeter edge or side of pads or pins to the land pattern or array. Additional routing channels are provided by spaces or openings formed by missing pins in the added non-fully populated perimeter side. Any number of one or more non-fully populated edges may be added to the land pattern or array. The additional perimeter of conductive pads can have spaces 402 formed therein for additional routing channels, according to the present invention. The number and location of spaces 402 can be selected manually and/or automatically, or as described elsewhere herein.

In an embodiment, Equations 1 and/or 1A, and Table 600, may be used to determine a number of spaces 402 to use in an added non-fully populated perimeter edge. Furthermore, when an additional perimeter of conductive pads is added to entirely surround an array or land pattern, Equations 1 and/or 1A, and Table 600, may be used to determine a number of spaces 402 to use in each of the four added non-fully populated edges.

In another embodiment, when an additional perimeter of conductive pads is added to entirely surround a land pattern or array, the number of spaces 402 to be placed in each new edge of can be calculated according to Equation 2, shown below:

$$S = INT((F-2)/3) \hspace{2cm} \text{Equation 2}$$

Where:
  S = a number of spaces to be located in each edge portion of the additional surrounding perimeter of conductive pads;
  F = a number of conductive pad positions in an edge portion of the array of land pattern before adding the additional surrounding perimeter of conductive pads; and
  INT is the INTEGER function, rounded down (e.g., INT (3.9)=3).

For example, routing for land pattern 500 shown in FIG. 5 may be improved in this manner. Each of edge portions 220a-220d of land pattern 500 include 18 solder ball pad positions

502 (e.g., 19−1=18). FIG. 7A shows a land pattern 700, which is similar to land pattern 500, with an additional perimeter of conductive pads entirely surrounding land pattern 500. Land pattern 700 is a 21×21 array of conductive pad positions. The additional perimeter of conductive pads are shown included in edge portions 720a-720d.

The number of spaces 402 to be located in an edge portion 720 may be calculated according to Equation 2 as follows:

$$S=INT((18-2)/3)=INT(5.333)=5$$

Thus, the number of spaces 402 to be located in an edge portion of the additional periphery of solder ball pads, according to Equation 2, is five. FIG. 7B shows an example land pattern 750, similar to land pattern 500, with an additional non-fully populated perimeter of solder ball pads, according to an embodiment of the present invention. Each of edge portions 720a-720d include five spaces 402, as calculated by Equation 2.

Note that Equation 2 may be rewritten in terms of complete edges, instead of edge portions 220, as follows:

$$S=INT(((E-1)-2)/3)$$

or $$S=INT((E-3)/3) \qquad \text{Equation 2A}$$

Where:
E=a number of conductive pads in an edge of the land pattern, prior to addition of the surrounding perimeter of conductive pads, if fully populated (i.e., E includes both corner pads and pads between them for an edge).

Example Embodiments for Designing Land Patterns and Arrays

The present invention may be used to design IC package arrays and/or land patterns for interfacing with an IC package. FIG. 8 shows an example flowchart 800 providing steps for designing one or more embodiments of the present invention. The steps of FIG. 8 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 800 begins with a step 802. In step 802, a number of required pins is determined. For example, a user or automatic system may determine a required number of signals needed to couple to a PCB by a package, therefore determining the required number of pins or pads.

In step 804, a number of required perimeter routing channels is determined. In an embodiment, the signals corresponding to the required number of pins determined in step 802 can be evaluated to determine which need to be routed external to the array or land pattern. For example, at least some ground, power, and/or other signals may be selected to be included in the group of internal or "orphaned" pads/pins not needing to be externally routed. Once the number of internal pads/pins is determined, a number of pads/pins that require to be externally routed using routing channels will be known.

In step 806, an array or land pattern is selected to yield the required pads or pins. For example, the user or automatic system can choose an N×M size array having the required number of pins/pads determined in step 802. In an embodiment, a table, such as Table 600 may be referred to for this selection. For example, column 608 indicates a number of total pads/pins for a given N×M size array.

In step 808, a size of the array or land pattern is optimized to yield the required perimeter routing channels, wherein at least one perimeter side of the array is under-populated. For example, the number of pads/pins needing routing channels determined in step 804 can be compared to the external routing channel capacity of the selected N×M size array. In an embodiment, a table, such as Table 600 can be referred to for this comparison. For example, column 610 indicates a number of externally available pads or pins for the land pattern. If additional routing channels are required, one or more pads/pins can be added or removed from one or more peripheral edges of the N×M size array. Thus, in an embodiment, step 808 includes under populating at least one perimeter edge of the array or land pattern. For example, FIG. 5B above shows the removing of pad/pins (i.e., or adding of spaces 402) to an edge of a land pattern to under populate a perimeter edge. In another example, FIG. 7B shows the adding of an under-populated edge of pads/pins to an edge of a land pattern to under populate a perimeter edge.

In embodiments, a number of added or removed pins/pads may be determined manually or automatically. Furthermore, Table 600 may be referred to, and/or Equations 1, 1A, 2, and/or 2A may be used to determine the number of added or removed pins/pads.

Once the array or land pattern has been optimized, signals may be routed from pads internal to the land pattern through openings formed by missing pads in the non-fully populated perimeter edge(s).

Example Applications of the Present Invention

For illustrative purposes, Table 600 described above relates to land patterns and arrays having the sizes indicated in column 602. However, the present invention is not limited to these sizes, but instead is applicable to land patterns and arrays of any size. For example, Table 900 shown in FIG. 9 provides additional sizes to which the present invention is applicable. Table 900 is described as follows:

Columns 902, 904, and 906 of Table 900 relate to example land pattern and array sizes having various pad/pin counts. Columns 902 and 904 respectively show row (X) and column (Y) pad/pin counts. Column 906 indicates a total pad/pin count for fully populated land patterns and arrays having the row and column counts indicated by columns 902 and 904.

Columns 908, 910, 912, 914, 916, 918, and 920 each show substrate areas required by the land patterns or arrays having the sizes of columns 902, 904, and 906, for different trace/pad technologies. Area data is shown in square inches. Note that column 908 relates to an area equivalent to that shown in column 602 of Table 600. Rows 930, 932, 934, and 936 provide dimension data for the trace/pad technologies of columns 908, 910, 912, 914, 916, 918, and 920.

Row 930 indicates line widths for routing channels for the various trace/pad technologies of columns 908, 910, 912, 914, 916, 918, and 920.

Row 932 indicates a spacing between routing channels for the various trace/pad technologies of columns 908, 910, 912, 914, 916, 918, and 920.

Row 934 indicates a pad width/length for the various trace/pad technologies of columns 908, 910, 912, 914, 916, 918, and 920.

Row 936 indicates a pitch, or distance center to center for adjacent pads, for the various trace/pad technologies of columns 908, 910, 912, 914, 916,918, and 920.

Table 900 provides relevant data for a variety of IC package sizes. Columns 610-650 of Table 600 can be referred to for additional information regarding the various technologies of Table 900. For example, as indicated by rows 930-936, of Table 900, column 912 relates to a trace/pad technology having a channel routing width of 0.006 inches, a routing channel spacing of 0.006, a pad width/length of 0.029 inches, and a pad pitch of 0.060 inches. A row 940 of Table 900 provides information regarding a 19×19 land pattern or array, similar to land pattern 500 shown in FIG. 5A. For row 940, columns 908-920 show land pattern or array sizes ranging from 0.90 to 2.31 square inches. Columns 610-650 of row 660 of Table 600 (shown in FIG. 6A) can be referred to for a 19×19 array of any of the sizes provided in row 940. In a similar fashion, the information provided in Table 600 can be related to any other of the trace/pad technologies shown in Table 900.

The various trace/pad technologies and land pattern/array sizes provided in Table 900 are provided for illustrative purposes, and are not limiting. The present invention is applicable to any trace/pad technologies and land pattern/array sizes, as would be understood by persons skilled in the relevant art(s) from the teachings herein. Thus, from the teachings herein, it will be apparent to persons skilled in the relevant art(s) how to improve signal routing by adding or removing pins/pads for land patterns and arrays of any size.

Multi-Layer Embodiments of the Present Invention

Embodiments of the present invention are applicable to circuit boards/substrates having any number of layers. In such embodiments, different portions of the pads/pins of a solder ball array/land pattern can be coupled to externally accessible routing channels on different layers.

Figure 10:
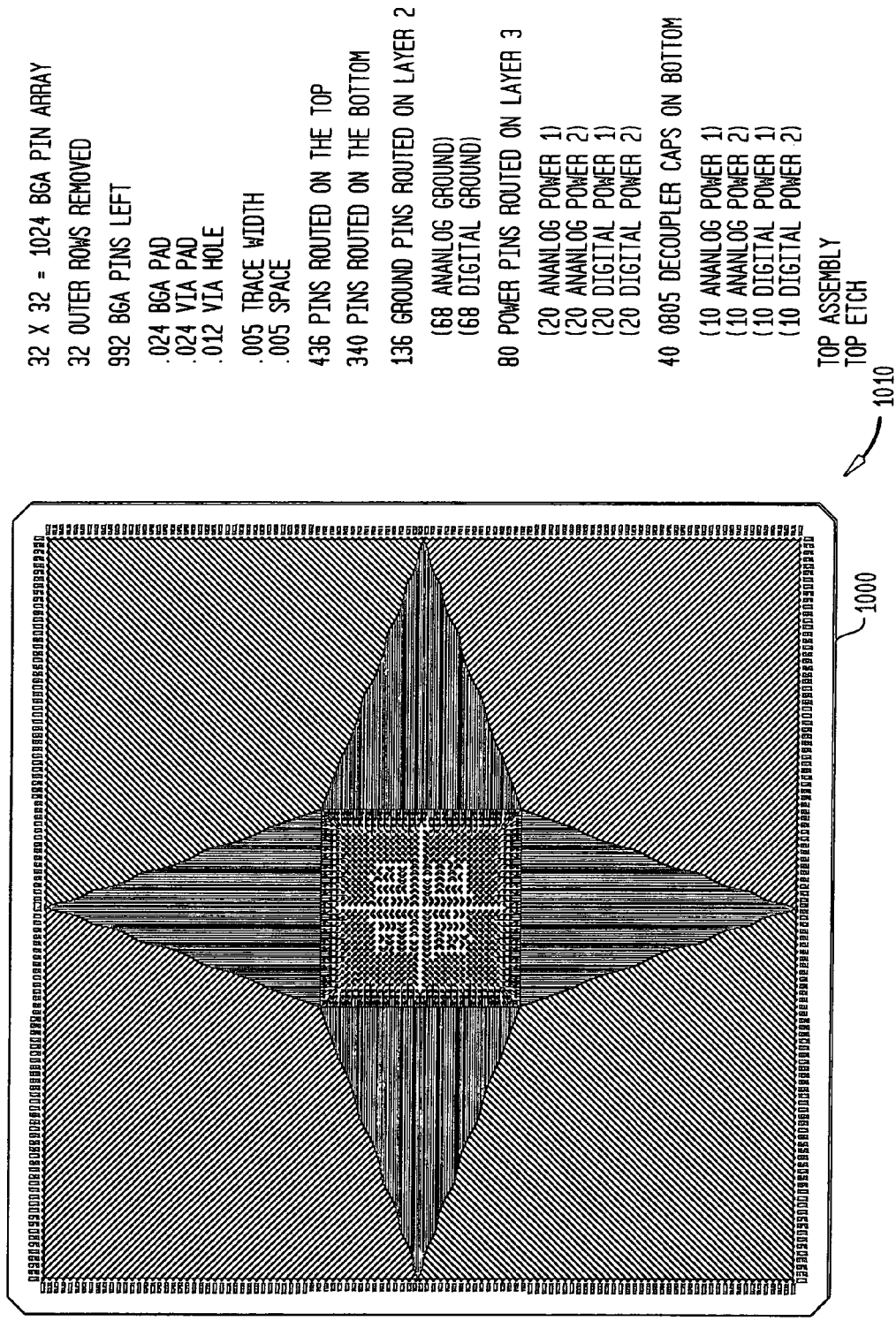

For example, FIGS. 10-15 show various layers in an example multi-layer circuit board embodiment of the present invention. FIG. 10 shows an example top assembly view 1010 of a circuit board 1000. For example, a ball grid array package can be attached to the land pattern centrally located on circuit board 1000 in view 1010. The land pattern shown in FIG. 10 includes various conductive features, including an array of conductive pads and routing channels. The array is a 32×32 pad/pin array, having 1024 pads/pins (prior to operation of the present invention). A first portion of the pads/pins of the 32×32 pad/pin array are shown on a top layer in FIG. 10 coupled to externally available routing channels. In the example of FIG. 10, the first portion of pads/pins that are externally routed are located in the peripheral five rows/columns of the land pattern.

Printed circuit board 1000 comprises a substrate material, and can include one or more layers in which conductive features are formed, in addition to the layer shown in FIG. 10. FIG. 11 shows a top etch view 1100 of circuit board 1000, which shows the layer shown in FIG. 10 as it would actually be etched.

Figure 12:
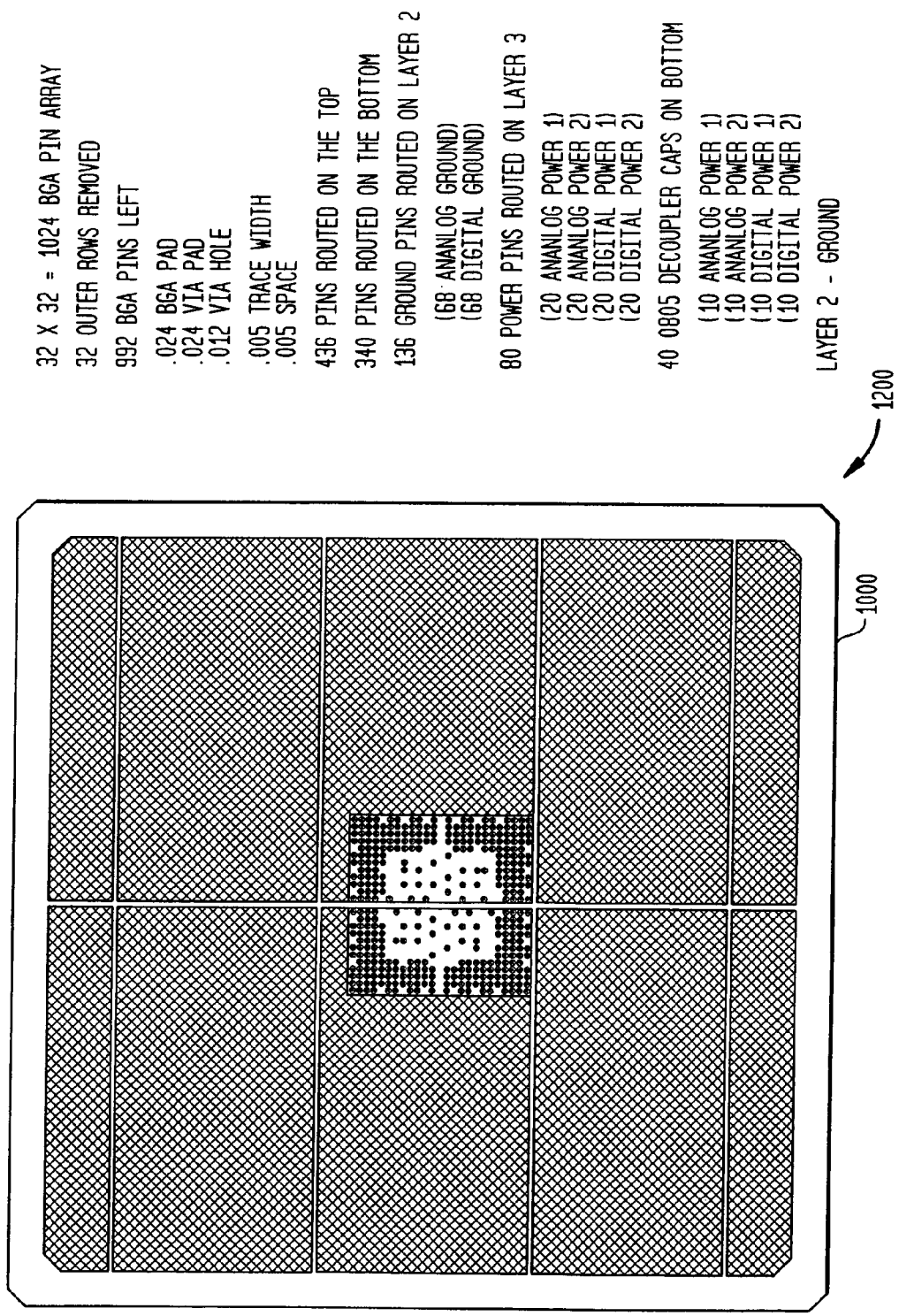

FIG. 12 shows a ground layer view 1200 of circuit board 1000. Ground layer view 1200 shows a ground plane of circuit board 1000.

Figure 13:
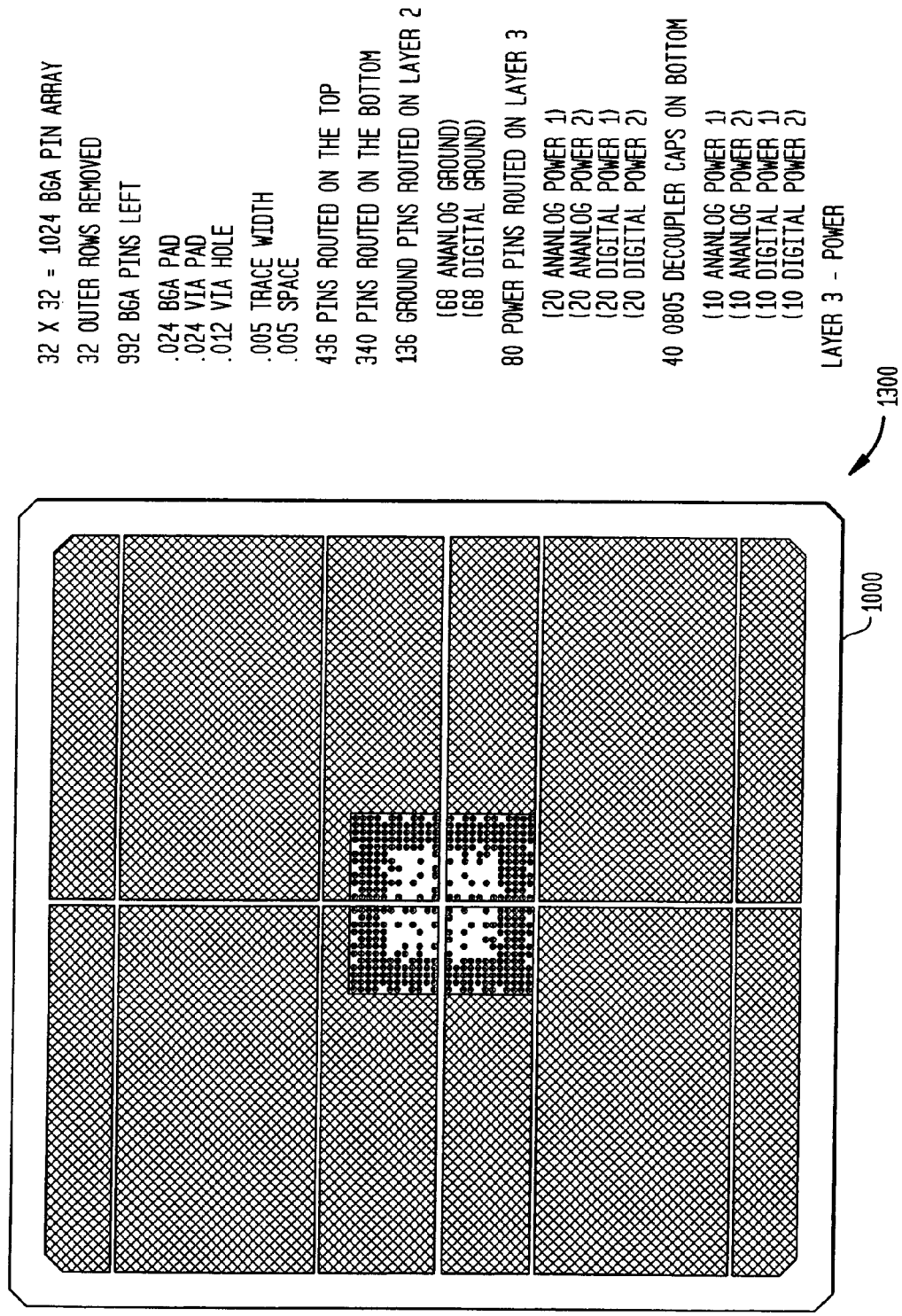

FIG. 13 shows a power layer view 1300 of circuit board 1000. Power layer view 1300 shows a power plane of circuit board 1000.

Figure 14:
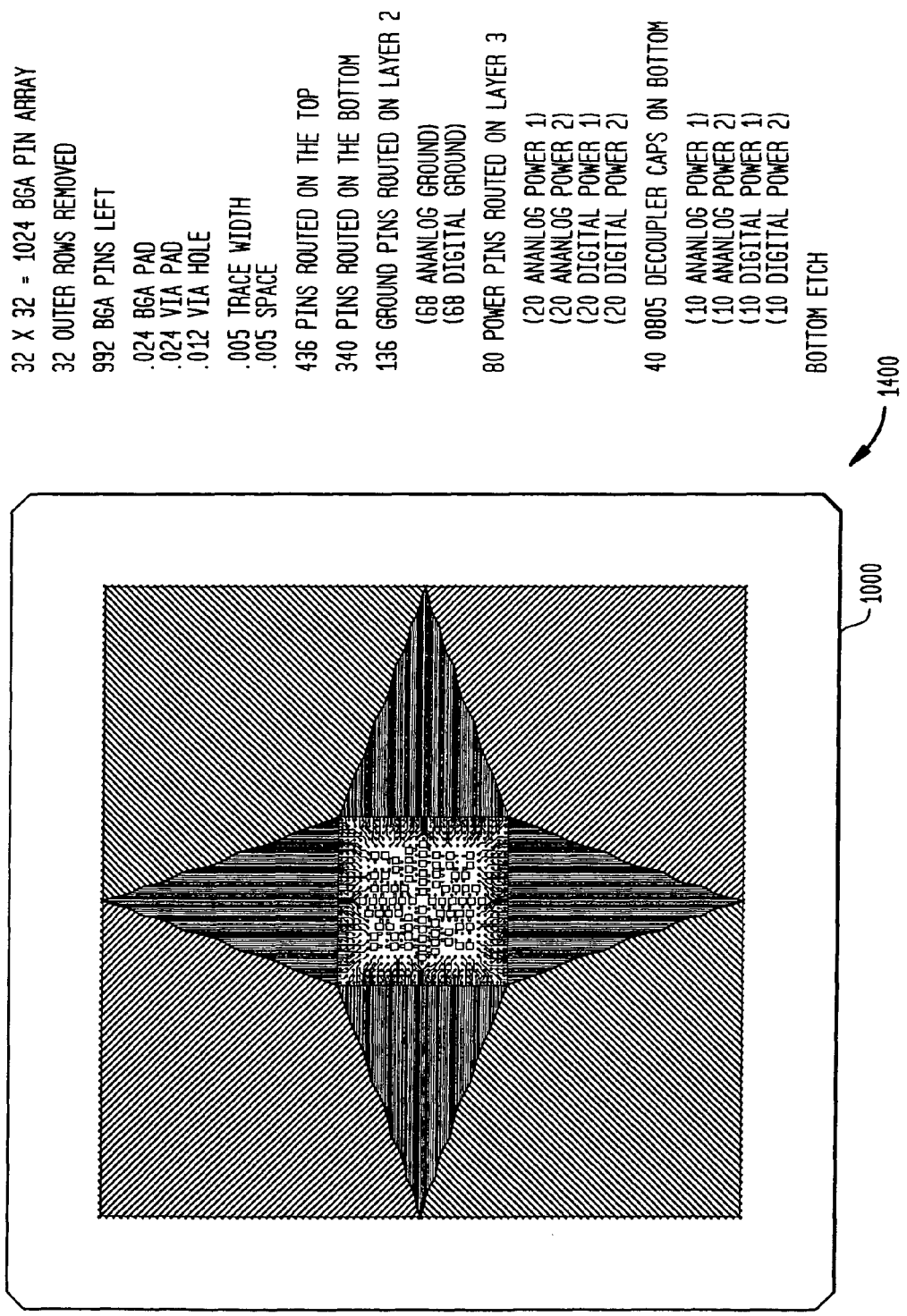

FIG. 14 shows a bottom etch view 1400 of circuit board 1000. FIG. 15 shows a bottom assembly view 1500 of circuit board 1000. View 1500 (and view 1400) shows on a bottom layer of circuit board 1000 a portion of the land pattern shown in FIG. 10. View 1500 shows conductive features on the bottom of circuit board 1000, including the innermost 25×25 array of pads/pins of the land pattern of FIG. 10. FIGS. 12 and 13 show vias corresponding to the 25×25 array of pads/pins, for electrically coupling the 25×25 array of pads/pins between the layers shown in views 1010 and 1500. As described above, a first portion of the 32×32 pad/pin array are shown externally routed in top assembly view 1010 of FIG. 10. A second portion of pads of the original 32×32 pad/pin array of FIG. 10 are shown coupled to externally available routing channels in view 1500. This second portion of pads/pins is located in the peripheral five circumferential rows of the 25×25 array portion shown in FIG. 15. Thus, a first portion of the land pattern of FIG. 10 is routed on a first layer of circuit board 1000, while a second portion of the land pattern is routed on a second layer of circuit board 1000.

To provide additional routing channels, spaces are located in the peripheral edges of the 32×32 pad/pin array shown in FIG. 10. Furthermore, additional routing channels are provided by locating spaces in the peripheral edges of the 25×25 pad/pin array shown in FIG. 15. Some conductive pads shown routed in view 1010 are replaced with spaces in the peripheral edges of the 25×25 pad/pin array shown in view 1500 to provide additional routing channels for the 25×25 pad/pin array. It would be understood to persons skilled in the relevant art(s) from the teachings herein how to remove pads/pins from and/or add pads/pins for each layer of the multi-layer embodiment example of FIGS. 10-15 to enhance signal routing.

In an embodiment, the number of pads/pins that are routed on a first routing layer is maximized, leaving as few as possible pads/pins to route on a subsequent layer(s). Note, however, in alternative embodiments, any proportion of pads/pins can be routed on any layer, according to the present invention. Note that on layers subsequent to the first or top routing layer, the pads/pins may be more appropriately referred to as "vias", although for illustrative purposes, they will typically be referred to as pads/pins herein. Thus, the present invention is also applicable to design of arrays of vias in PCBs and IC packages.

In the current example, 436 pads/pins are routed on the first routing layer (shown in FIG. 10), and 340 pads/pins are routed on the second routing layer (shown in FIG. 15). Eight pads/pins have been removed from each edge of the 32×32 array shown in FIG. 10. Seven pads/pins/vias have been removed from each edge of the 25×25 array portion shown in FIG. 15. In alternative embodiments, fewer or greater numbers of pads/pins may be removed.

Figure 16:
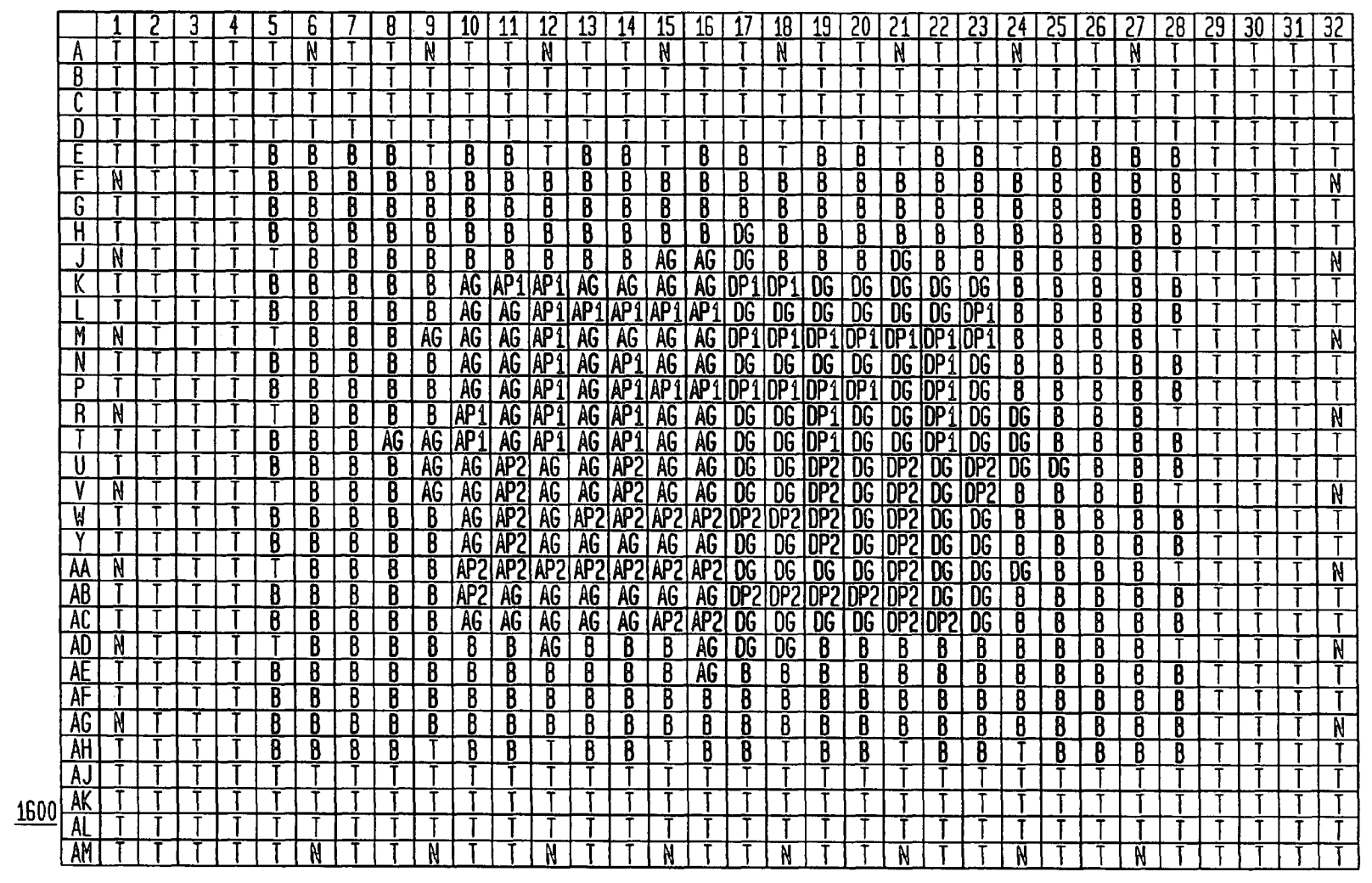

FIG. 16 shows a Table 1600 showing a pad/pin layout for the example multi-layer land pattern embodiment of FIGS. 10-15, according to an embodiment of the present invention. In FIG. 16, a "T" represents a pad/pin that is routed on the layer shown in FIG. 10 (e.g., top layer), and a "B" represents a pad/pin that is routed on the layer shown in FIG. 15 (e.g., bottom layer). A "N" represents a position where there is no pad/pin. "AG" represents analog ground, "AP1" and "AP2" represent analog power, "DG" represents digital ground, and "DP1" and "DP2" represent digital power.

In a multi-layer embodiment, flowchart 800 of FIG. 8 can be modified to include an additional step where a number of layers of the printed circuit board to have routing channels is determined. This step can occur at any point in flowchart 800. The printed circuit board can have any number of one or more layers that include routing channels, including two such layers, three such layers, and greater numbers of layers. The determination of the number of layers can be made manually or automatically.

Furthermore, in a multi-layer embodiment, step 804 of flowchart 800 can be modified such that a number of required perimeter routing channels is determined for an array of conductive pads on each layer of the determined number of layers. Step 808 can also be modified such that a size of the land pattern is optimized to yield the required perimeter routing channels in each layer. Step 808 can include the step where at least one perimeter edge is under populated on at least one layer. Thus, in a two-routing layer embodiment, either layer, or both layers can have edges that are under populated by incorporating one or more spaces.

The multi-layer land pattern embodiment shown in FIGS. 10-16 is provided for illustrative purposes, and is not limiting. The present invention is applicable to any land pattern/array size, on any number of layers, as would be understood by persons skilled in the relevant art(s) from the teachings herein. Thus, from the teachings herein, it will be apparent to persons skilled in the relevant art(s) how to improve signal routing by adding or removing pins/pads for land patterns and arrays of any size, on any number of layers.

Embodiments for Land Patterns with Selected Corner Pad Arrangements

The description above relates to the positioning of spaces in edges of solder ball arrays/land patterns. This subsection describes embodiments for arrangements of pads/spaces in and near corners of solder ball arrays/land patterns. More specifically, this subsection provides embodiments relating the proximity of spaces to corners of solder ball arrays/land patterns. The description below is applicable to both single-layer and multi-layer embodiments of the present invention.

Figure 17A:
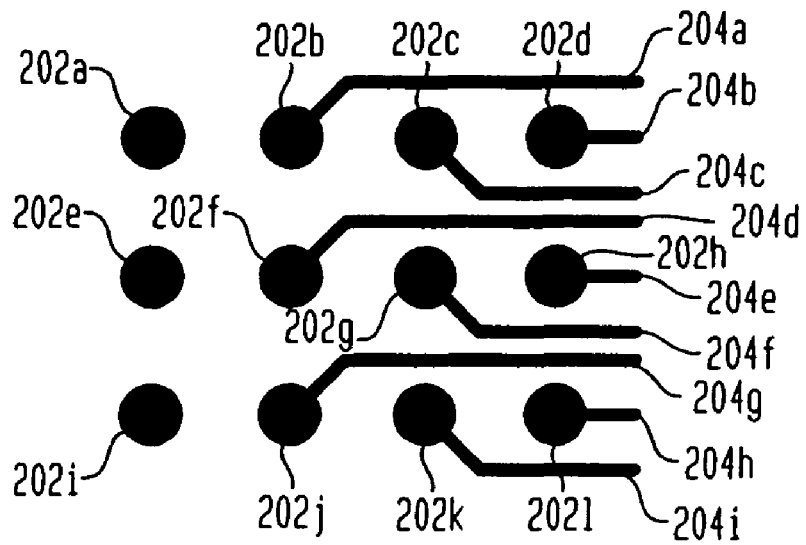
FIG. 17A shows an example conventional solder ball pad and routing arrangement.
Figure 17B:
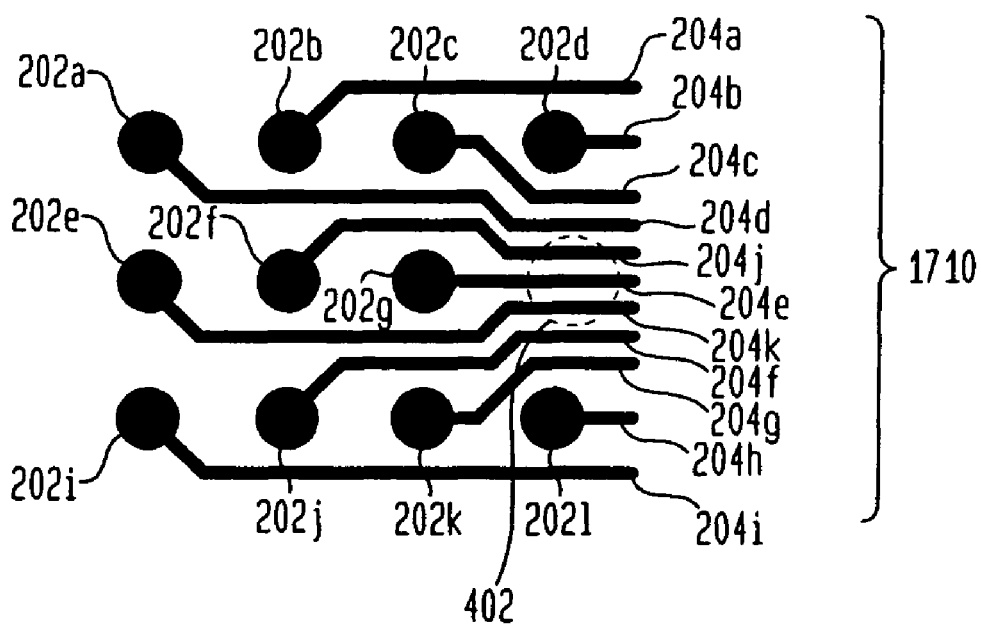
FIG. 17B shows an example solder ball pad and routing arrangement, according to an embodiment of the present invention.

As described above with respect to FIG. 4, a space 402 in an edge of a land pattern portion 400 allows for additional routing channels 204, as compared to land patterns that do not include a space 402. For example, FIG. 17A shows an example land pattern portion 1700 having a conventional arrangement of conductive pads 202. FIG. 17B shows an example land pattern portion 1750 having conductive pads 202 and a space 402 configured according to an embodiment of the present invention. As shown in FIG. 17A, nine conductive pads 202*b-d*, 202*f-h*, and 202*j-l* can be routed out of portion 1700 by nine respective routing channels 204*a-i*. As shown in FIG. 17B, conductive pad 202*h* has been replaced with an opening or space 402. Thus, eleven conductive pads 202*a-g* and 202*i-l* can be routed out of land pattern portion 1750 by eleven routing channels 204*a*-204*k*. In FIG. 17A, all conductive pads 202 that are three columns (or rows) deep from the edge of land pattern portion 1700 can be externally routed. In FIG. 17B, all conductive pads 202 present that are four columns (or rows) deep from the edge of land pattern portion 1750 can be routed, when a single space 402 is present.

As described above with respect to FIG. 5C, a set 530 of two solder ball pads 202 surrounding a space 402 in an edge can be repeated on the edge, to provide additional routing channels throughout the edge. In embodiments of the present invention, a set 530 can be positioned in the edge as dictated by a corner pad arrangement. As used herein, a "corner pad arrangement," "corner arrangement," or "pad arrangement for a corner portion" is defined by an arrangement of conductive pads in two edges that converge at a corner of an array/land pattern. In other words, pads of a corner pad arrangement are pads along two edges going out from a corner, until a pad prior to a space is encountered. A corner pad arrangement can also be considered to be a line of pads beginning in a first edge after a pad after a first space, extending to a corner, extending around the corner, and along a second edge until a pad prior to a second space is encountered. In embodiments, a corner pad arrangement can include additional pads. Different corner pad arrangements have various numbers of pads along the edges. Furthermore, a corner pad arrangement has one or more known characteristics, such as a number of lost or unusable routing channels. This number can be used in conjunction with the number of routing channels gained by using spaces 402 in an edge to determine an overall routing channel capacity for an edge, or even for an entire array/land pattern.

Figure 17C:
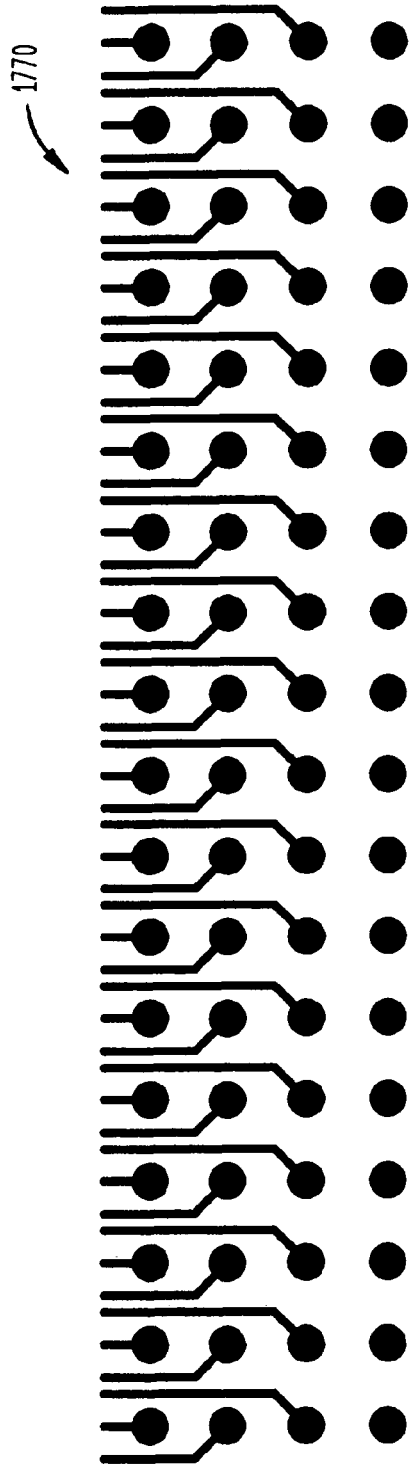
FIG. 17C shows an edge portion of a land pattern/array with a conventional edge pad arrangement and routing.
Figure 17D:
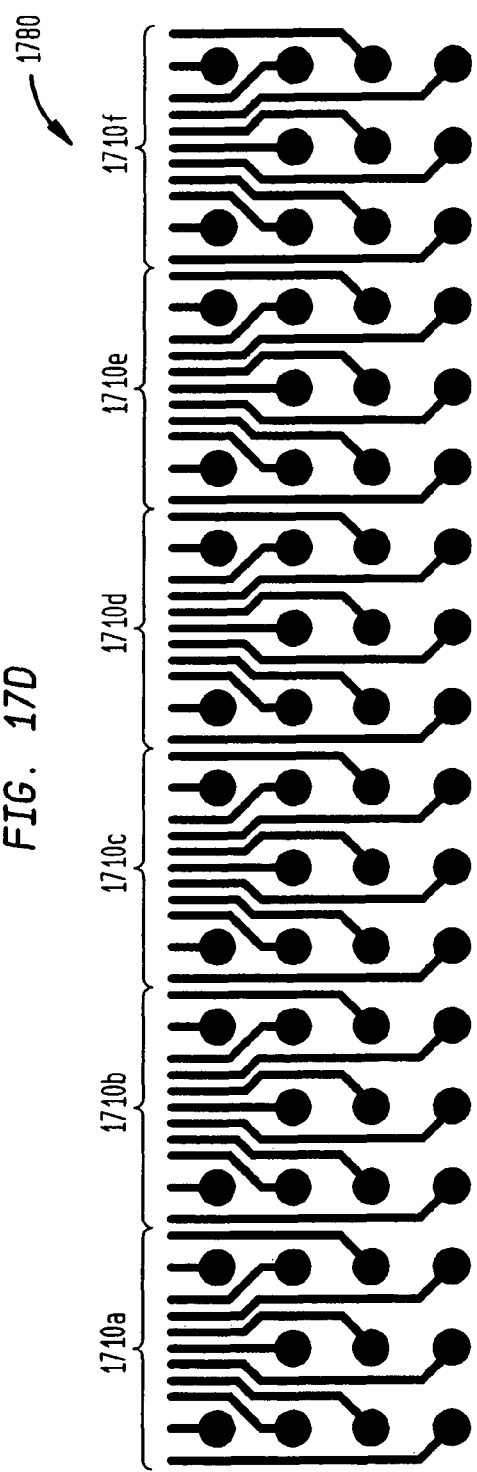
FIG. 17D shows an edge portion of a land pattern/array that incorporates a series arrangement of sets that include pads/pins and spaces, to provide additional routing channels, according to embodiments of the present invention

FIG. 17B shows an example set 1710 similar to set 530, but also showing example routing, according to an example embodiment of the present invention. As shown in FIG. 17B, set 1710 includes a first pad 202*d*, a space 402, and a second pad 2021 arranged in series along an edge. Furthermore, as described above, set 1710 allows for eleven routing channels 204*a-k*. The pads and routing of set 1710, or routing similar thereto, can be repeated (e.g., copied from a library) on an edge any number of times to provide known or predetermined routing of signals on edges. Set 1710 can be used adjacent to particular corner pad arrangements to provide predictable routability. For example, FIG. 17C shows an edge portion 1770 of a land pattern/array with a conventional edge pad arrangement, and routing. FIG. 17D shows an edge portion 1780 of a land pattern/array that incorporates a series arrangement of sets 1710*a-f* to provide additional routing channels, in a predictable manner. As compared to edge portion 1770, edge portion 1780 has six fewer edge pads 202, but is capacity for routing twelve more pads 202 externally.

Various unique corner pad arrangements are described below. FIGS. 18-32 show fifteen corner arrangements, according to example embodiments of the present invention. The corner pad arrangements can be used to aid in determining an overall number of routing channels for an array/land pattern, and can also be used to aid in positioning spaces in edges. For illustrative purposes, only two outer rows and columns of the corner pad positions are shown in FIGS. 18-32.

Figure 18:
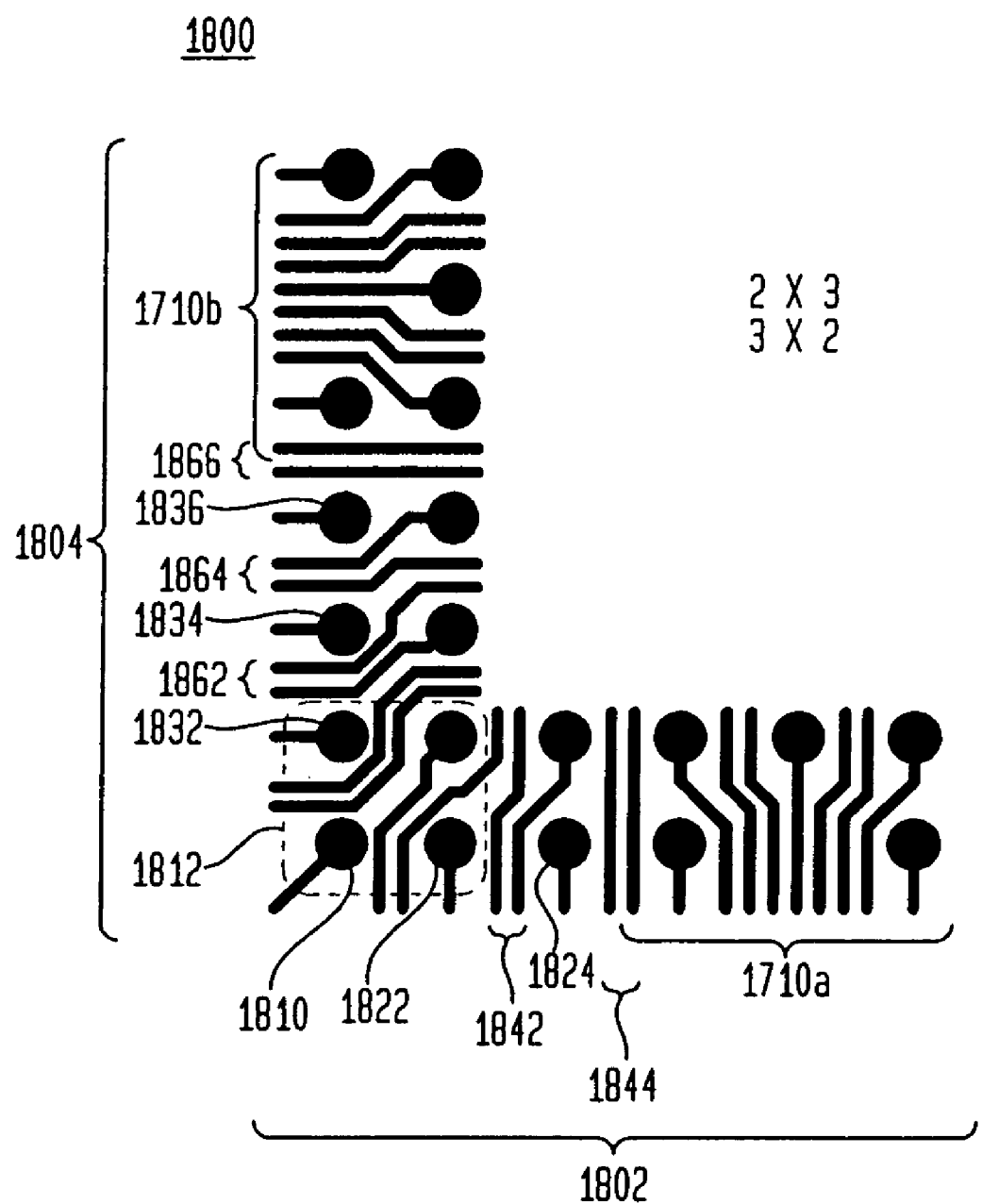
FIGS. 18-32 show example corner pad arrangements for land patterns, according to embodiments of the present invention.

FIG. 18 shows a corner arrangement 1800, according to an example embodiment of the present invention. Corner arrangement 1800 is located in a corner of a land pattern or array, at an intersection of first and second edges 1802 and 1804. Corner arrangement 1800 includes a corner pad 1810. A set of four corner pads 1812 is also shown. Corner arrangement 1800 is considered a "two-by-three" arrangement, because in first edge 1802, two pads 1822 and 1824 are present between corner pad 1810 and adjacent set 1710*a*, and in second edge 1804, three pads 1832, 1834, and 1836 are present between corner pad 1810 and adjacent set 1710*b*. Alternatively, corner arrangement 1800 is considered a "two-by-three" arrangement because two routing areas 1842 and 1844 between pads are present between adjacent set 1710*a* and corner pads 1812, and three routing areas 1862, 1864, and 1866 between pads are present between adjacent set 1710*b* and corner pads 1812.

Note that corner arrangement 1800 represents two corner pad arrangements: (1) the two-by-three arrangement of pads shown in FIG. 18; and (2) a three-by-two arrangement of pads that would result by swapping the positions of first and second edges 1802 and 1804 around corner pad 1810 in FIG. 18.

The two-by-three and three-by-two arrangements represented by corner arrangement 1800 are desirable corner pad arrangements. Example signal routing channels are shown for corner arrangement 1800 in FIG. 18. As shown in FIG. 18, two routing channels are routed through each of routing areas 1842, 1844, 1862, 1864, and 1866, and the routing areas adjacent to corner pad 1810, from internal to the land pattern/array to external of the land pattern/array through first and second edges 1802 and 1804. Thus, a maximum number of routing channels for each routing area proximate to the corner are used, and no routing channels are lost when using corner arrangement 1800.

Figure 19:
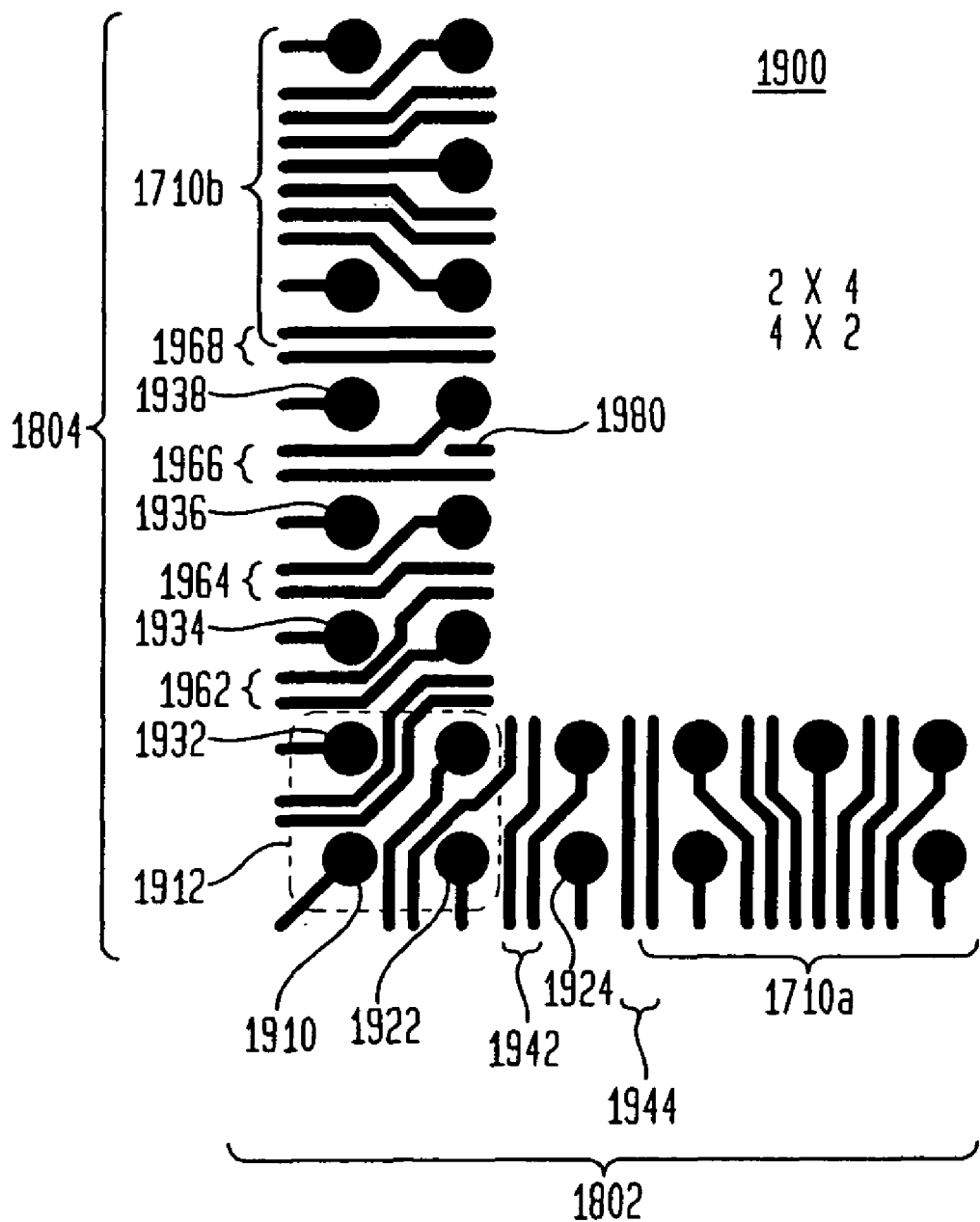

FIG. 19 shows a corner arrangement 1900, according to an example embodiment of the present invention. Corner arrangement 1900 is located in a corner of a land pattern or array, at an intersection of first and second edges 1802 and 1804. Corner arrangement 1900 includes a corner pad 1910. A set of four corner pads 1912 is also shown. Corner arrangement 1900 is considered a "two-by-four" arrangement, because in first edge 1802, two pads 1922 and 1924 are present between corner pad 1910 and adjacent set 1710a, and in second edge 1804, four pads 1932, 1934, 1936, and 1938 are present between corner pad 1910 and adjacent set 1710b. Alternatively, corner arrangement 1900 is considered a "two-by-four" arrangement because two routing areas 1942 and 1944 between pads are present between adjacent set 1710a and corner pads 1912, and four routing areas 1962, 1964, 1966, and 1968 between pads are present between adjacent set 1710b and corner pads 1912.

Note that corner arrangement 1900 represents two corner pad arrangements: (1) the two-by-four arrangement of pads shown in FIG. 19; and (2) a four-by-two arrangement of pads that would result by swapping first and second edges 1802 and 1804 in FIG. 19.

The two-by-four and four-by-two arrangements represented by corner arrangement 1900 are desirable corner pad arrangements, although less desirable than corner arrangement 1800 of FIG. 18. Corner arrangement 1900 is less desirable than corner arrangement 1800 because a routing channel is lost or unused. Example signal routing channels are shown for corner arrangement 1900 in FIG. 19. As shown in FIG. 19, two routing channels are routed through each of routing areas 1942, 1944, 1962, 1964, and 1968, and the routing areas adjacent to corner pad 1910, from internal to the land pattern/array to external of the land pattern/array through first and second edges 1802 and 1804. However, an internal routing channel 1980 is unable to be routed through routing area 1966. Thus, a maximum number of routing channels for each routing area is not used, as one internal routing channel is lost when using corner arrangement 1900. However, a loss of one routing channel may be acceptable, or a best option, in some land pattern/arrays.

Figure 20:
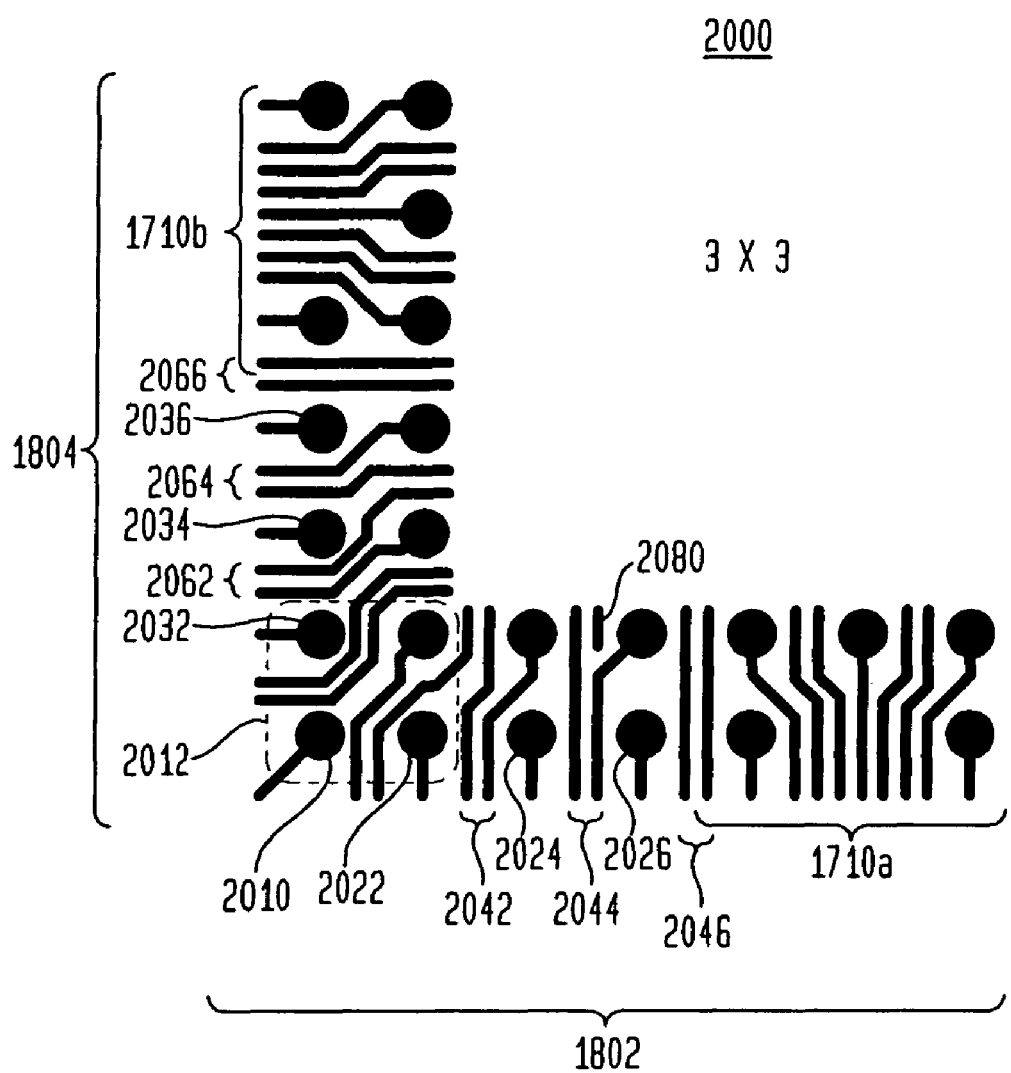

FIG. 20 shows a corner arrangement 2000, according to an example embodiment of the present invention. Corner arrangement 2000 is located in a corner of a land pattern or array, at an intersection of first and second edges 1802 and 1804. Corner arrangement 2000 includes a corner pad 2010. A set of four corner pads 2012 is also shown. Corner arrangement 2000 is considered a "three-by-three" arrangement, because in first edge 1802, three pads 2022, 2024, and 2026 are present between corner pad 2010 and adjacent set 1710a, and in second edge 1804, three pads 2032, 2034, and 2036 are present between corner pad 2010 and adjacent set 1710b. Alternatively, corner arrangement 2000 is considered a "three-by-three" arrangement because three routing areas 2042, 2044, and 2046 between pads are present between adjacent set 1710a and corner pads 2012, and three routing areas 2062, 2064, and 2066 between pads are present between adjacent set 1710b and corner pads 2012.

The three-by-three arrangement represented by corner arrangement 2000 is a desirable corner pad arrangement, although less desirable than corner arrangement 1800 of FIG. 18. Corner arrangement 2000 is less desirable than corner arrangement 1800 because a routing channel is lost or unused. Example signal routing channels are shown for corner arrangement 2000 in FIG. 20. As shown in FIG. 20, two routing channels are routed through each of routing areas 2042, 2046, 2062, 2064, and 2066, and the routing areas adjacent to corner pad 2010, from internal to the land pattern/array to external of the land pattern/array through first and second edges 1802 and 1804. However, an internal routing channel 2080 is unable to be routed through routing area 2044. Thus, a maximum number of routing channels for each routing area is not used, as one internal routing channel is lost when using corner arrangement 2000. However, a loss of one routing channel may be acceptable, or a best option, in some land pattern/arrays.

FIGS. 21-32 show corner arrangements that are even less desirable than those shown in FIGS. 18-20 due to loss of further routing channels. However, the corner arrangements shown in FIGS. 21-32 may be appropriate for use in some land pattern/arrays.

Figure 21:
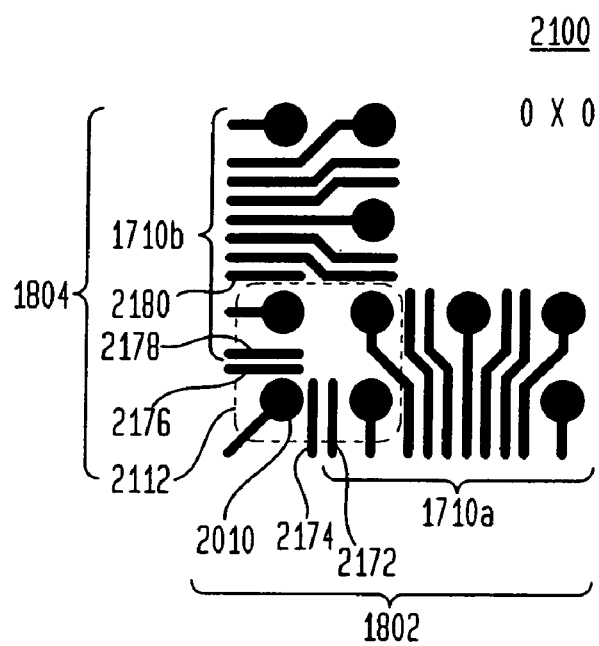

FIG. 21 shows a corner arrangement 2100, according to an example embodiment of the present invention. Corner arrangement 2100 is considered a "zero-by-zero" arrangement, because in first edge 1802, no pads are present between corner pad 2110 and adjacent set 1710a, and in second edge 1804, no pads are present between corner pad 2110 and adjacent set 1710b. Alternatively, corner arrangement 2100 is considered a "zero-by-zero" arrangement because no routing areas between pads are present between adjacent set 1710a and corner pads 2112, and no routing areas between pads are present between adjacent set 1710b and corner pads 2112.

Corner arrangement 2100 is less desirable than corner arrangement 1800 because five routing channels are lost or unused. Example signal routing channels are shown for corner arrangement 2100 in FIG. 21. As shown in FIG. 21, five routing channels 2172, 2174, 2176, 2178, and 2180 cannot be routed external of the land pattern/array through first and second edges 1802 and 1804. Thus, five external routing channels are lost or unused in corner arrangement 2100.

Figure 22:
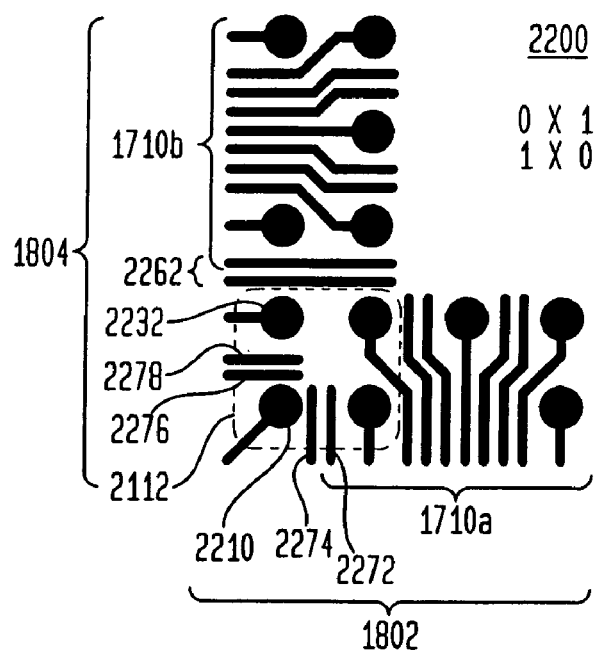

FIG. 22 shows a corner arrangement 2200, according to an example embodiment of the present invention. Corner arrangement 2200 is considered a "zero-by-one" arrangement, because in first edge 1802, no pads are present between corner pad 2210 and adjacent set 1710a, and in second edge 1804, one pad 2232 is present between corner pad 2210 and adjacent set 1710b. Alternatively, corner arrangement 2200 is considered a "zero-by-one" arrangement because no routing areas between pads are present between adjacent set 1710a and corner pads 2212, and one routing area 2262 between pads is present between adjacent set 1710b and corner pads 2212.

Note that corner arrangement 2200 represents two corner pad arrangements: (1) the zero-by-one arrangement of pads shown in FIG. 22; and (2) a one-by-zero arrangement of pads that would result by swapping first and second edges 1802 and 1804 in FIG. 22.

Corner arrangement 2200 is less desirable than corner arrangement 1800 because routing channels are lost or unused. Example signal routing channels are shown for corner arrangement 2200 in FIG. 22. As shown in FIG. 22, four routing channels 2272, 2274, 2276, and 2278 cannot be routed external of the land pattern/array through first and second edges 1802 and 1804. Thus, four external routing channels are lost or unused in corner arrangement 2200.

Figure 23:
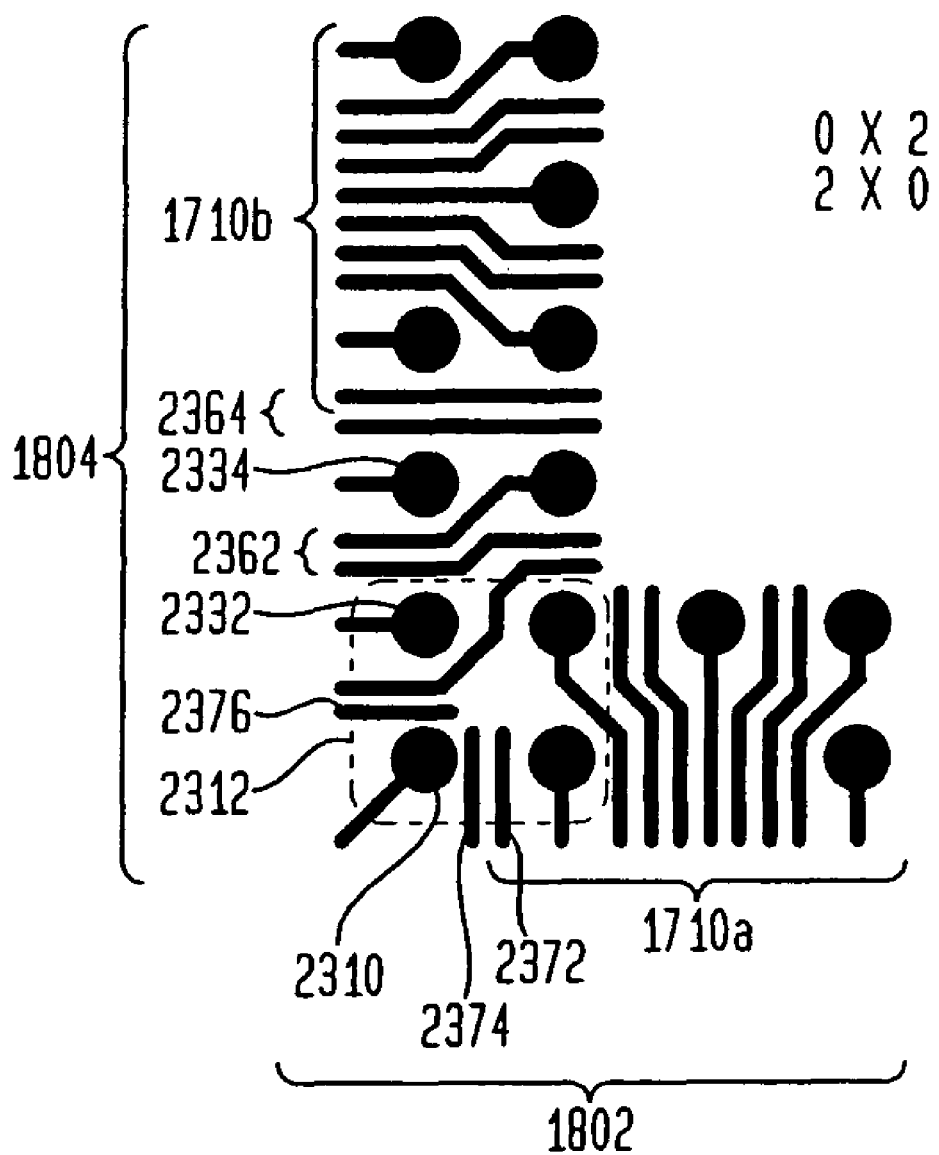

FIG. 23 shows a corner arrangement 2300, according to an example embodiment of the present invention. Corner arrangement 2300 represents a "zero-by-two" or "two-by-zero" arrangement. Corner arrangement 2300 is less desirable than corner arrangement 1800 because routing channels are lost or unused. Example signal routing channels are shown for corner arrangement 2300 in FIG. 23. As shown in FIG. 23, three routing channels 2372, 2374, and 2376 cannot be routed external of the land pattern/array through first and second edges 1802 and 1804. Thus, three external routing channels are lost or unused in corner arrangement 2300.

Figure 24:
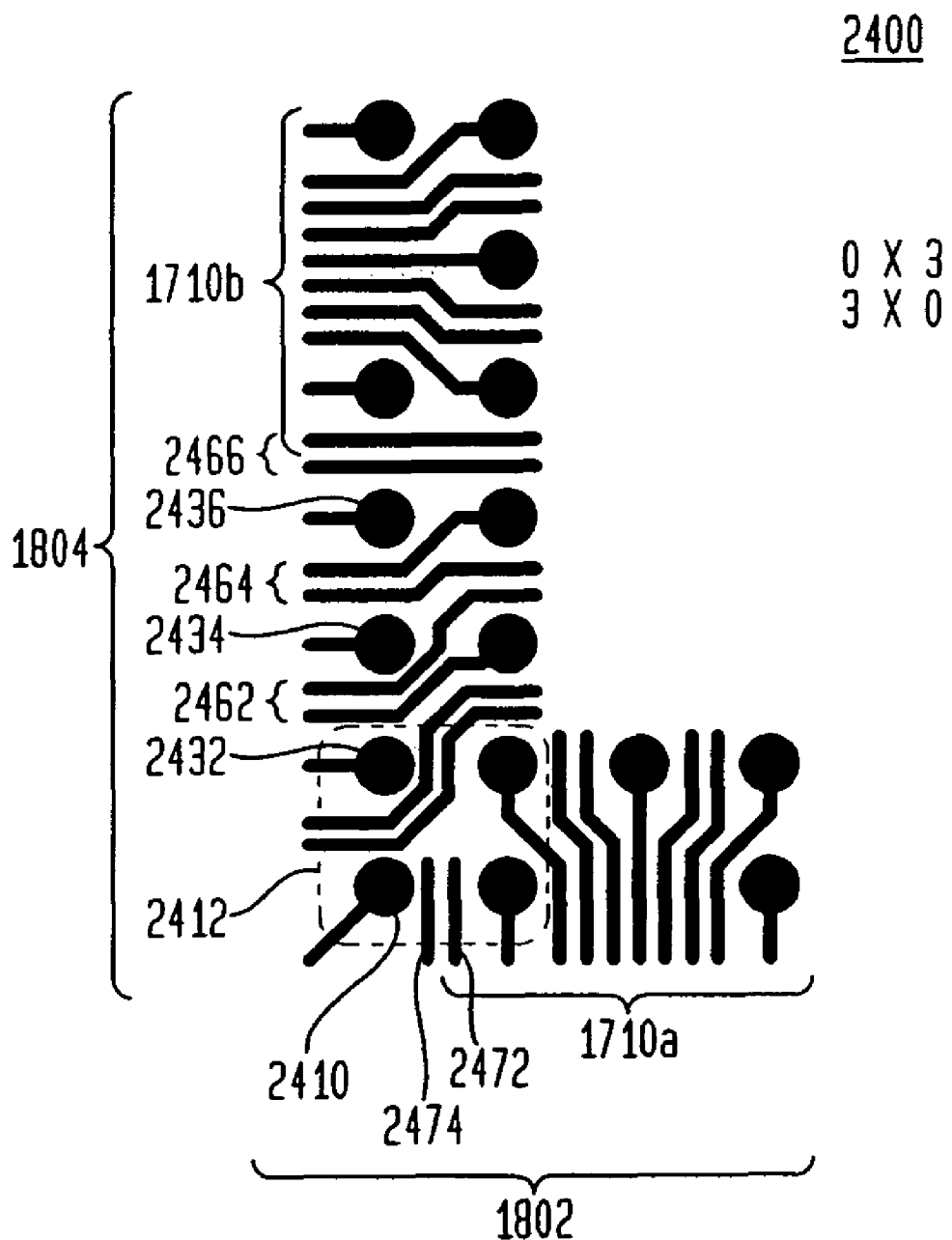

FIG. 24 shows a corner arrangement 2400, according to an example embodiment of the present invention. Corner arrangement 2400 represents a "zero-by-three" or "three-by-zero" arrangement. Corner arrangement 2400 is less desirable than corner arrangement 1800 because routing channels are lost or unused. Example signal routing channels are shown for corner arrangement 2400 in FIG. 24. As shown in FIG. 24, two routing channels 2472 and 2474 cannot be routed external of the land pattern/array through first and second edges 1802 and 1804. Thus, two external routing channels are lost or unused in corner arrangement 2400.

Figure 25:
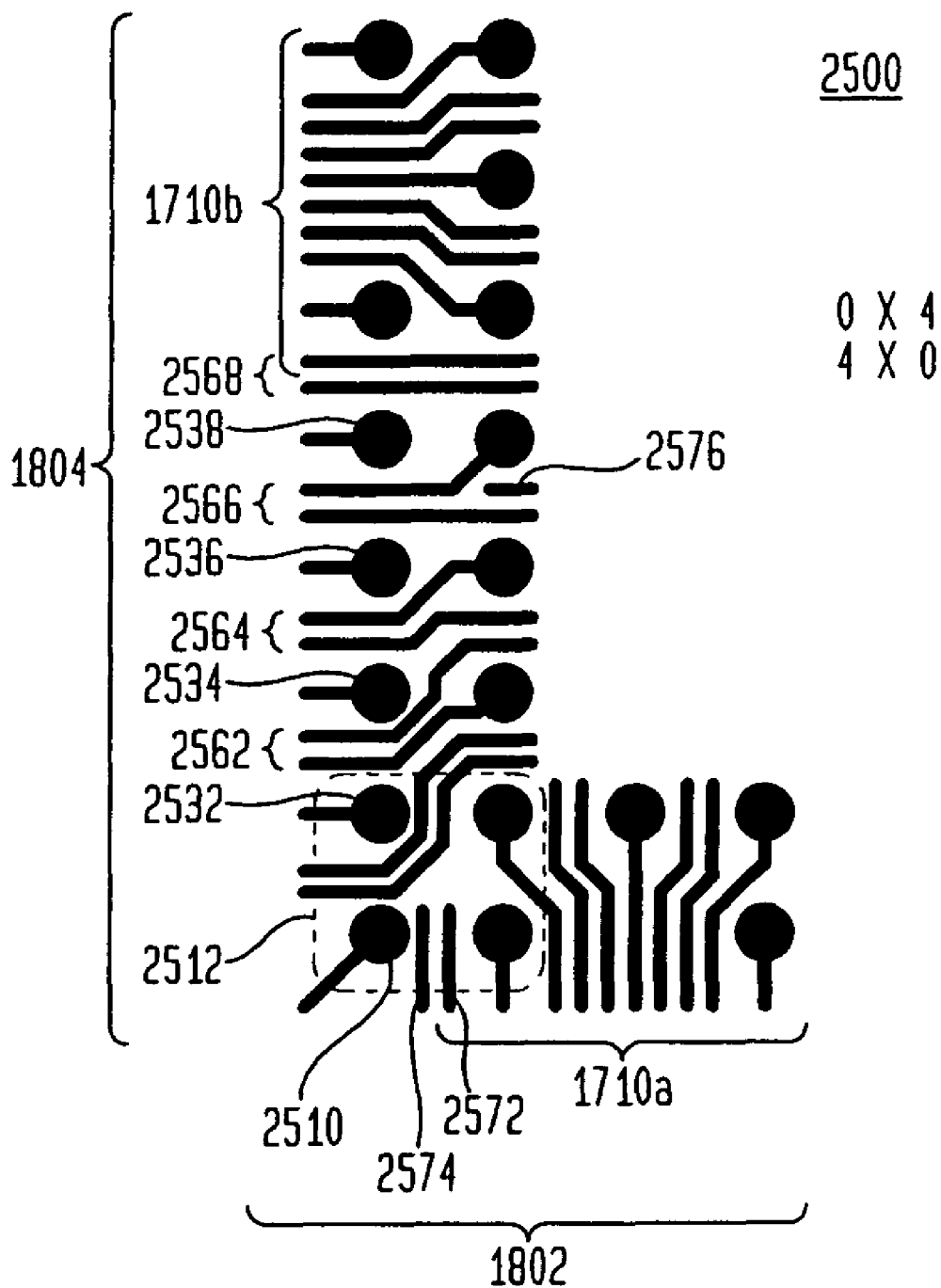

FIG. 25 shows a corner arrangement 2500, according to an example embodiment of the present invention. Corner arrangement 2500 represents a "zero-by-four" or "four-by-zero" arrangement. Corner arrangement 2500 is less desirable than corner arrangement 1800 because routing channels are lost or unused. Example signal routing channels are shown for corner arrangement 2500 in FIG. 25. As shown in FIG. 25, three routing channels 2572, 2574, and 2576 cannot be routed external of the land pattern/array through first and second edges 1802 and 1804. Routing channels 2572 and 2574 are lost or unused in edge 1802, and routing channel 2576 is lost or used internally to the land pattern/array. Thus, two external routing channels and one internal routing channel are lost or unused in corner arrangement 2500.

Figure 26:
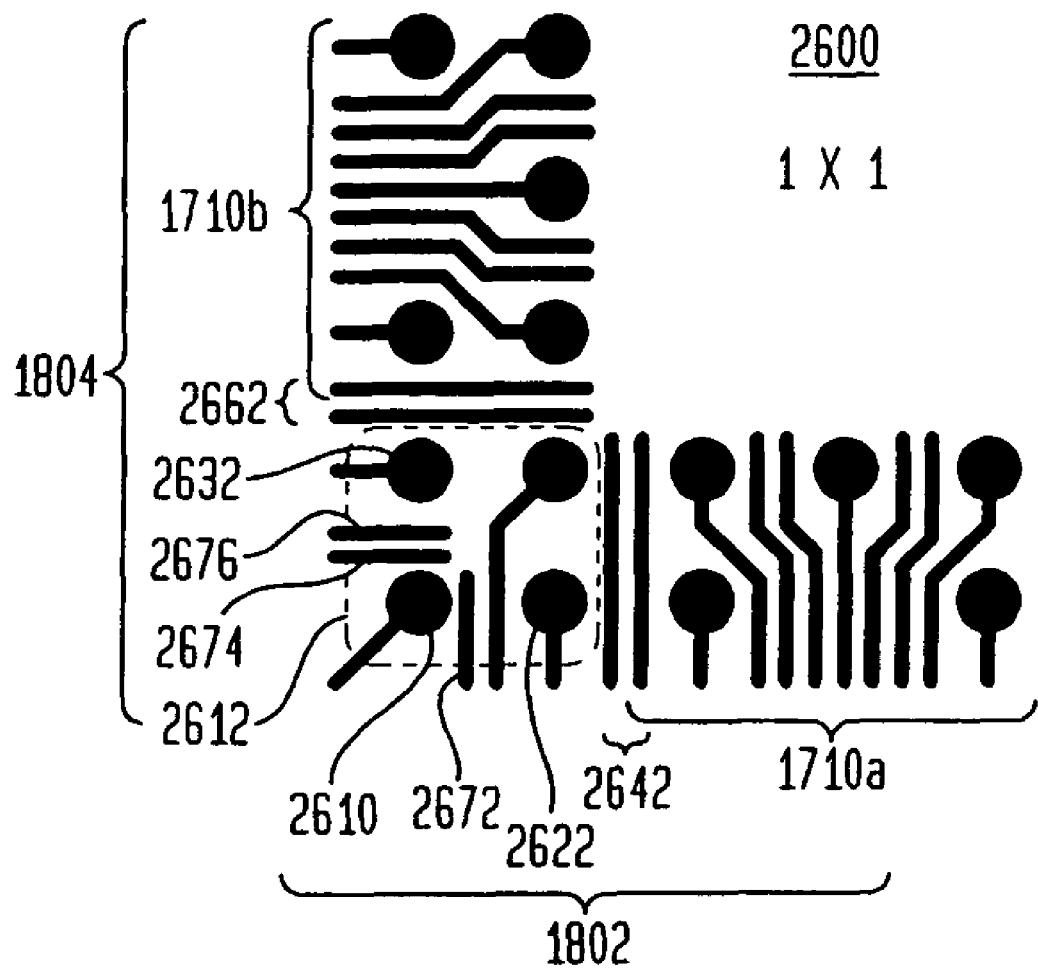

FIG. 26 shows a corner arrangement 2600, according to an example embodiment of the present invention. Corner arrangement 2600 represents a "one-by-one" arrangement. Corner arrangement 2600 is less desirable than corner arrangement 1800 because routing channels are lost or unused. Example signal routing channels are shown for corner arrangement 2600 in FIG. 26. As shown in FIG. 26, three routing channels 2672, 2674, and 2676 cannot be routed external of the land pattern/array through first and second edges 1802 and 1804. Thus, three external routing channels are lost or unused due to corner arrangement 2600.

Figure 27:
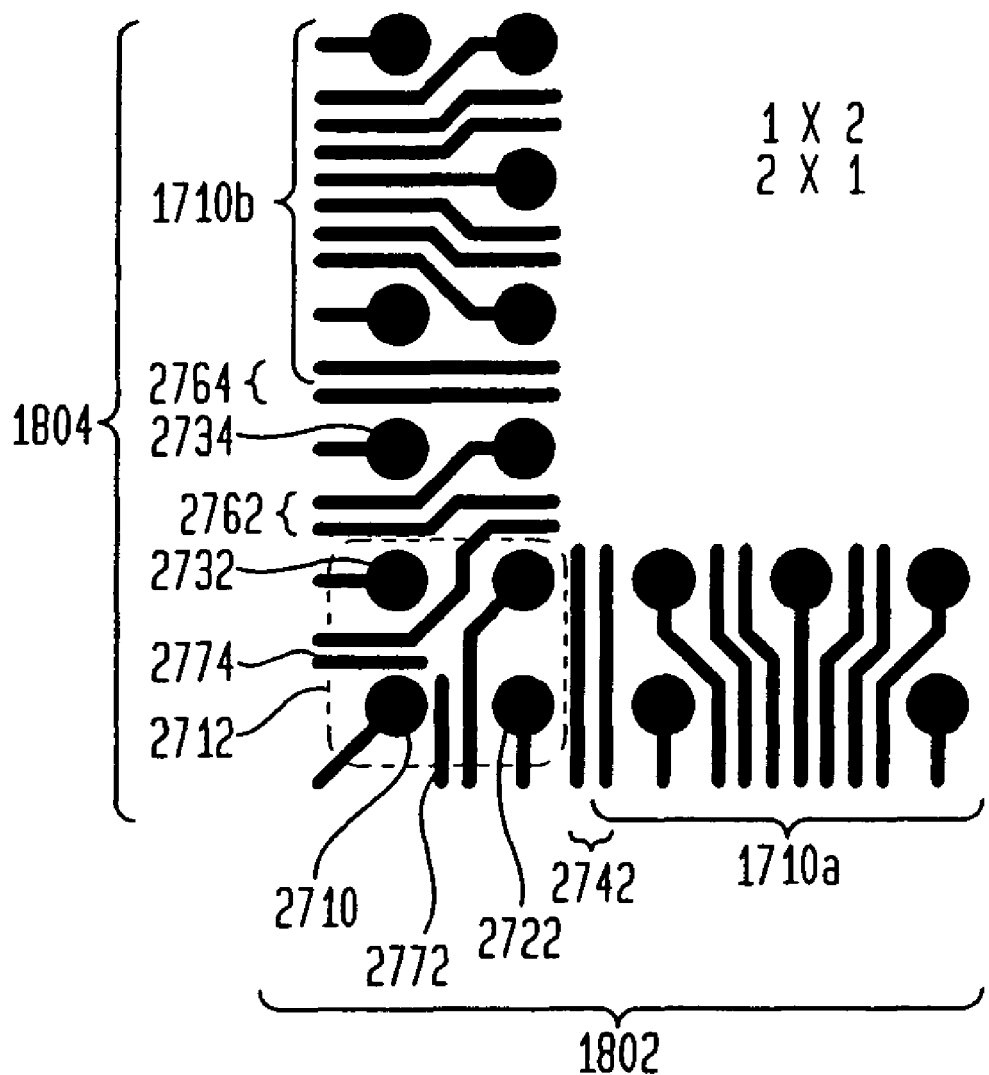

FIG. 27 shows a corner arrangement 2700, according to an example embodiment of the present invention. Corner arrangement 2700 represents a "one-by-two" or "two-by-one" arrangement. Corner arrangement 2700 is less desirable than corner arrangement 1800 because routing channels are lost or unused. Example signal routing channels are shown for corner arrangement 2700 in FIG. 27. As shown in FIG. 27, two routing channels 2772 and 2774 cannot be routed external of the land pattern/array through first and second edges 1802 and 1804. Thus, two external routing channels are lost or unused in corner arrangement 2700.

Figure 28:
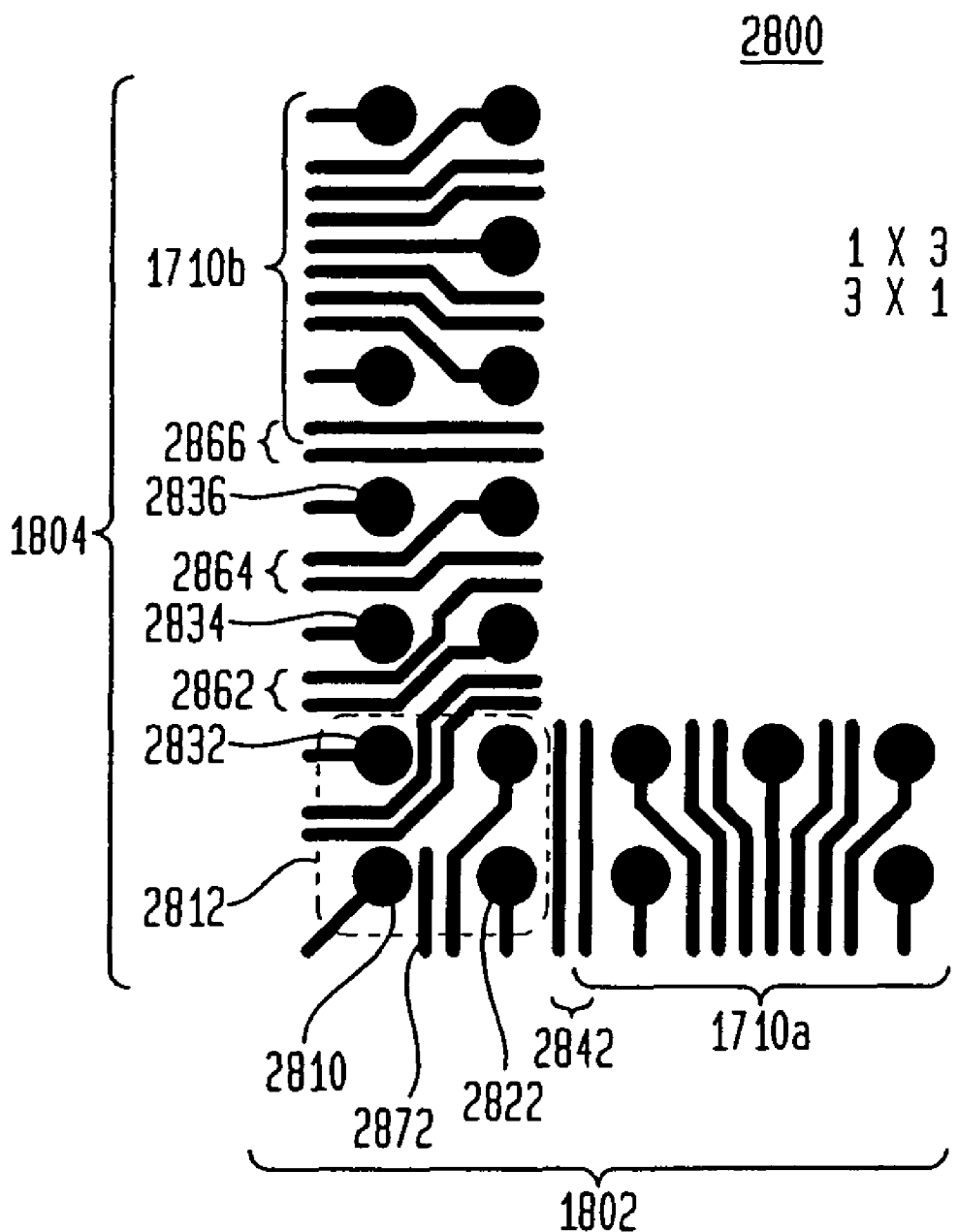

FIG. 28 shows a corner arrangement 2800, according to an example embodiment of the present invention. Corner arrangement 2800 represents a "one-by-three" or "three-by-one" arrangement. Corner arrangement 2800 is less desirable than corner arrangement 1800 because routing channels are lost or unused. Example signal routing channels are shown for corner arrangement 2800 in FIG. 28. As shown in FIG. 28, one routing channel 2872 cannot be routed from internal of the land pattern/array through first and second edges 1802 and 1804. Thus, one external routing channel is lost or unused in corner arrangement 2800.

Figure 29:
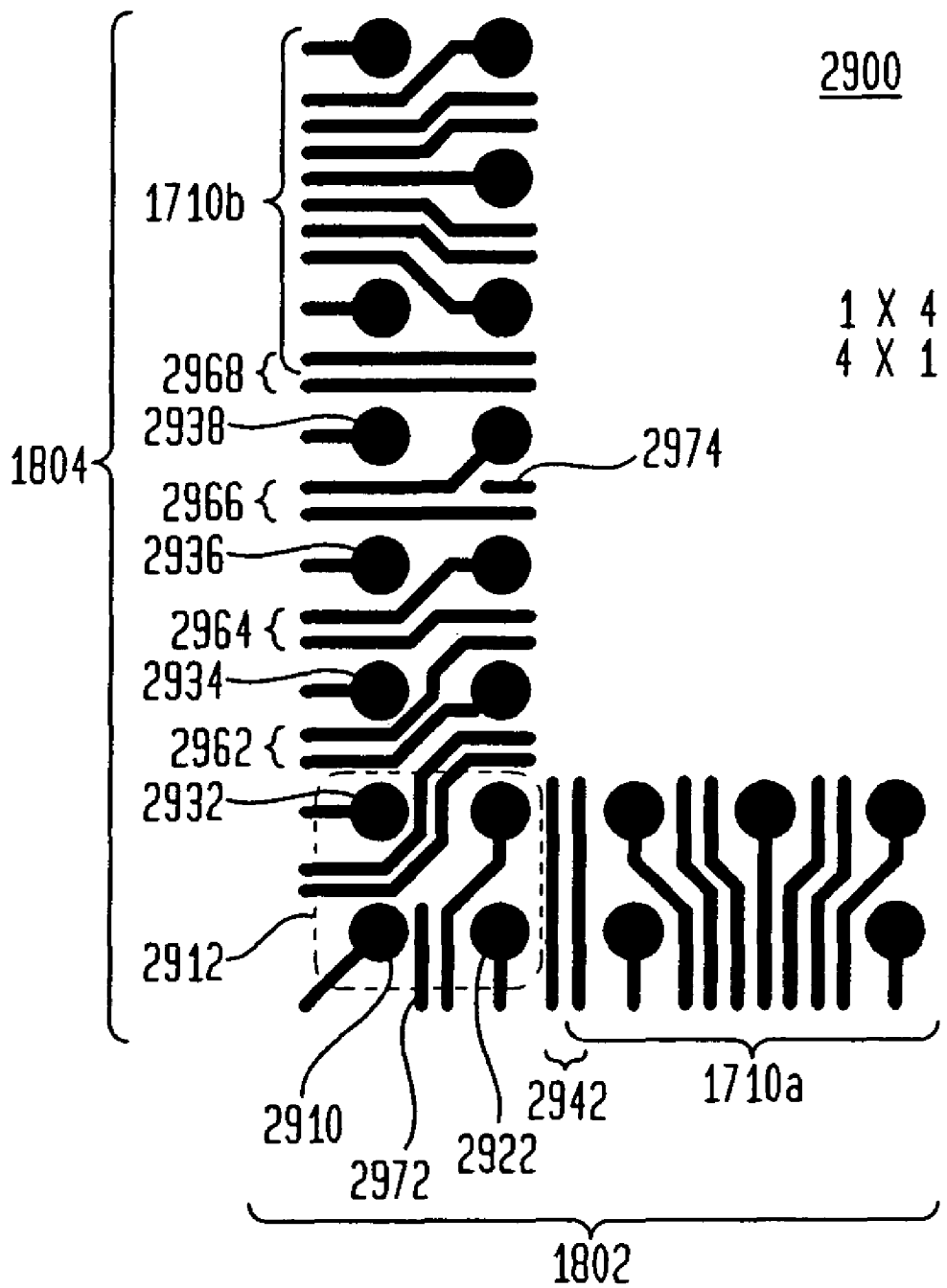

FIG. 29 shows a corner arrangement 2900, according to an example embodiment of the present invention. Corner arrangement 2900 represents a "one-by-four" or "four-by-one" arrangement. Corner arrangement 2900 is less desirable than corner arrangement 1800 because routing channels are lost or unused. Example signal routing channels are shown for corner arrangement 2900 in FIG. 29. As shown in FIG. 29, two routing channels 2972 and 2974 cannot be routed external of the land pattern/array through first and second edges 1802 and 1804. Routing channel 2972 is lost or unused in edge 1802, and routing channel 2974 is lost or used internally to the land pattern/array. Thus, one external and one internal routing channel are lost or unused in corner arrangement 2900.

Figure 30:
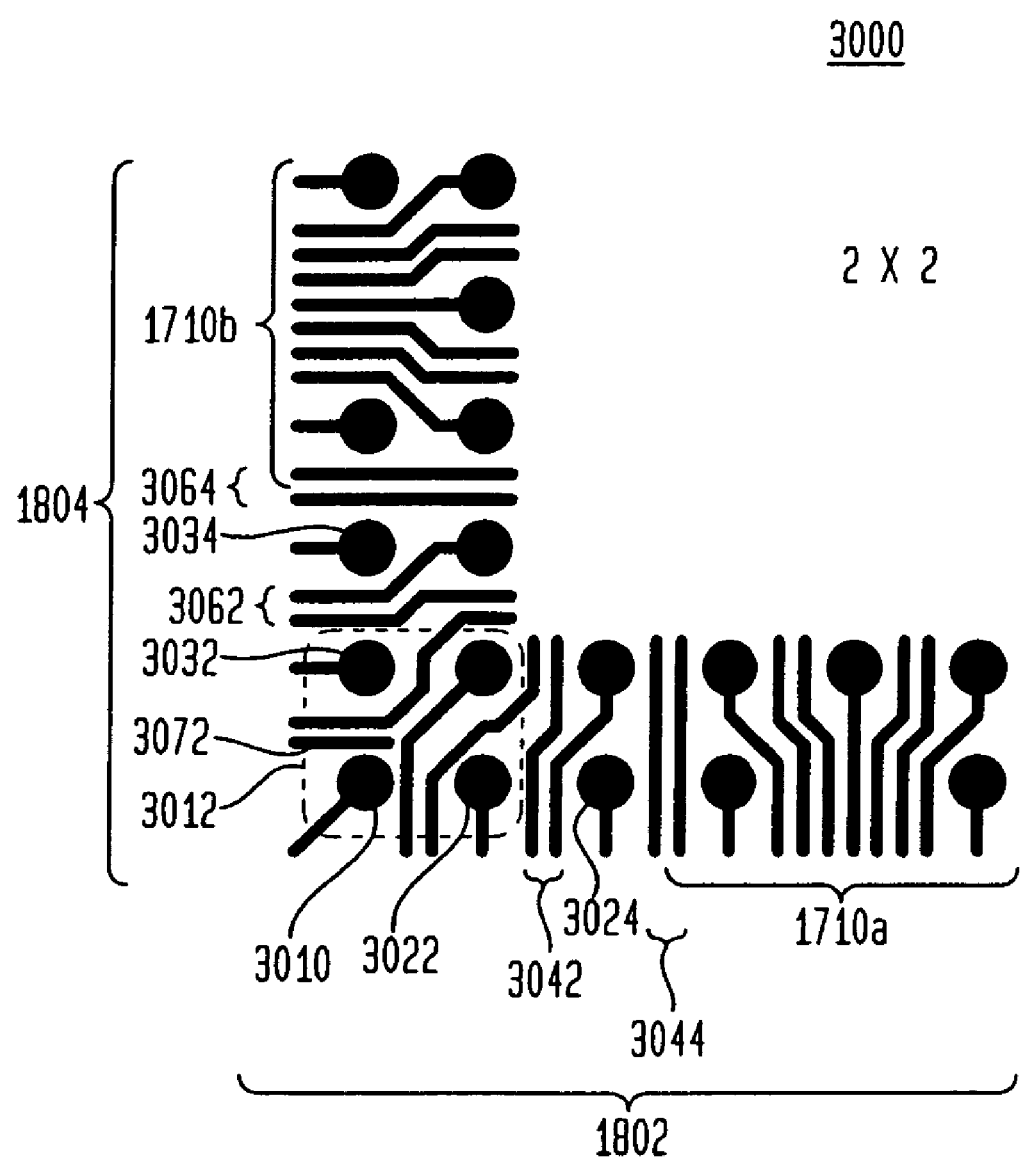

FIG. 30 shows a corner arrangement 3000, according to an example embodiment of the present invention. Corner arrangement 3000 represents a "two-by-two" arrangement. Corner arrangement 3000 is less desirable than corner arrangement 1800 because routing channels are lost or unused. Example signal routing channels are shown for corner arrangement 3000 in FIG. 30. As shown in FIG. 30, one routing channel 3072 cannot be routed external of the land pattern/array through first and second edges 1802 and 1804. Thus, one external routing channel is lost or unused in corner arrangement 3000.

Figure 31:
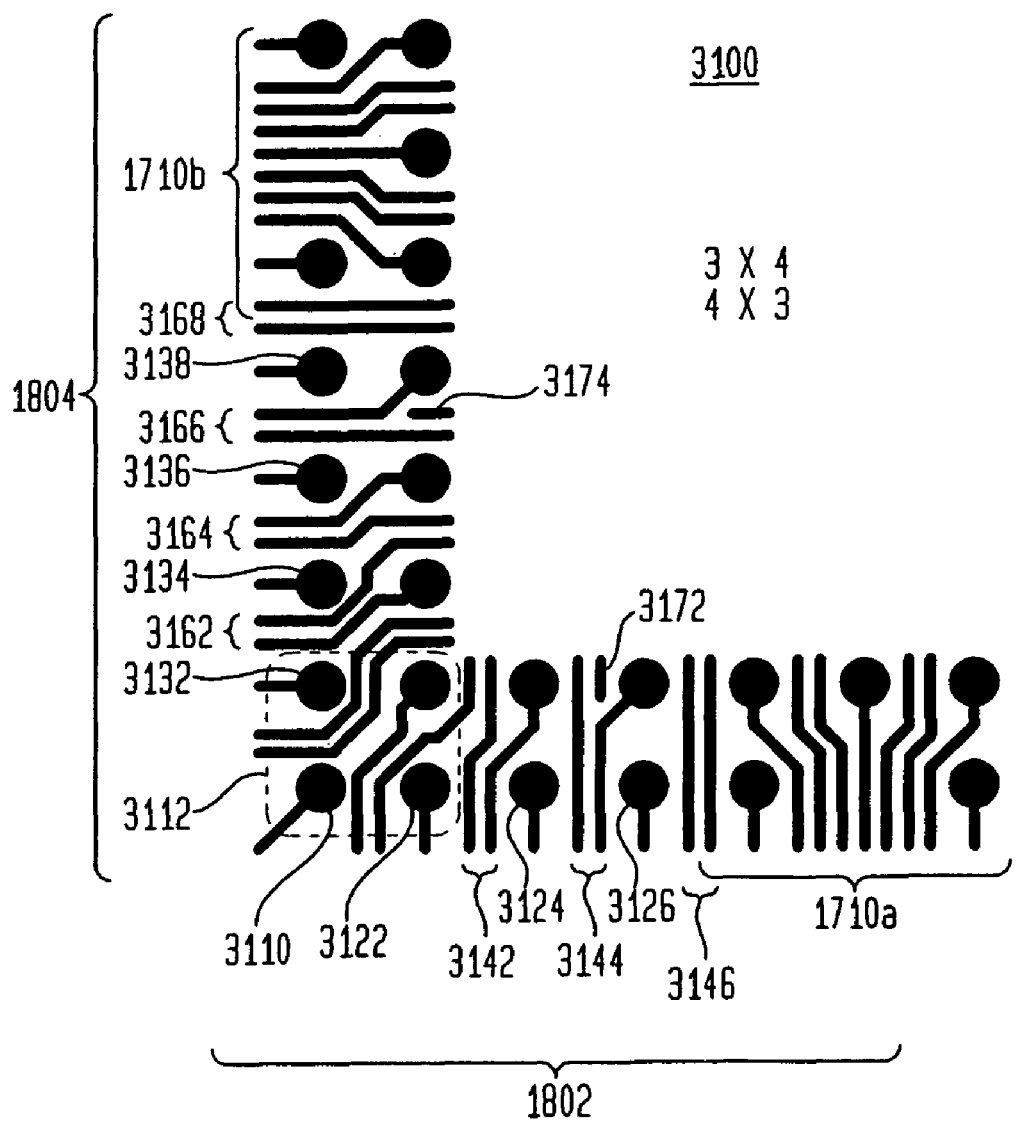

FIG. 31 shows a corner arrangement 3100, according to an example embodiment of the present invention. Corner arrangement 3100 represents a "three-by-four" or "four-to-three" arrangement. Corner arrangement 3100 is less desirable than corner arrangement 1800 because routing channels are lost or unused. Example signal routing channels are shown for corner arrangement 3100 in FIG. 31. As shown in FIG. 31, two routing channels 3172 and 3174 cannot be routed internally from the land pattern/array through first and second edges 1802 and 1804. Thus, two internal routing channels are lost or unused in corner arrangement 3100.

Figure 32:
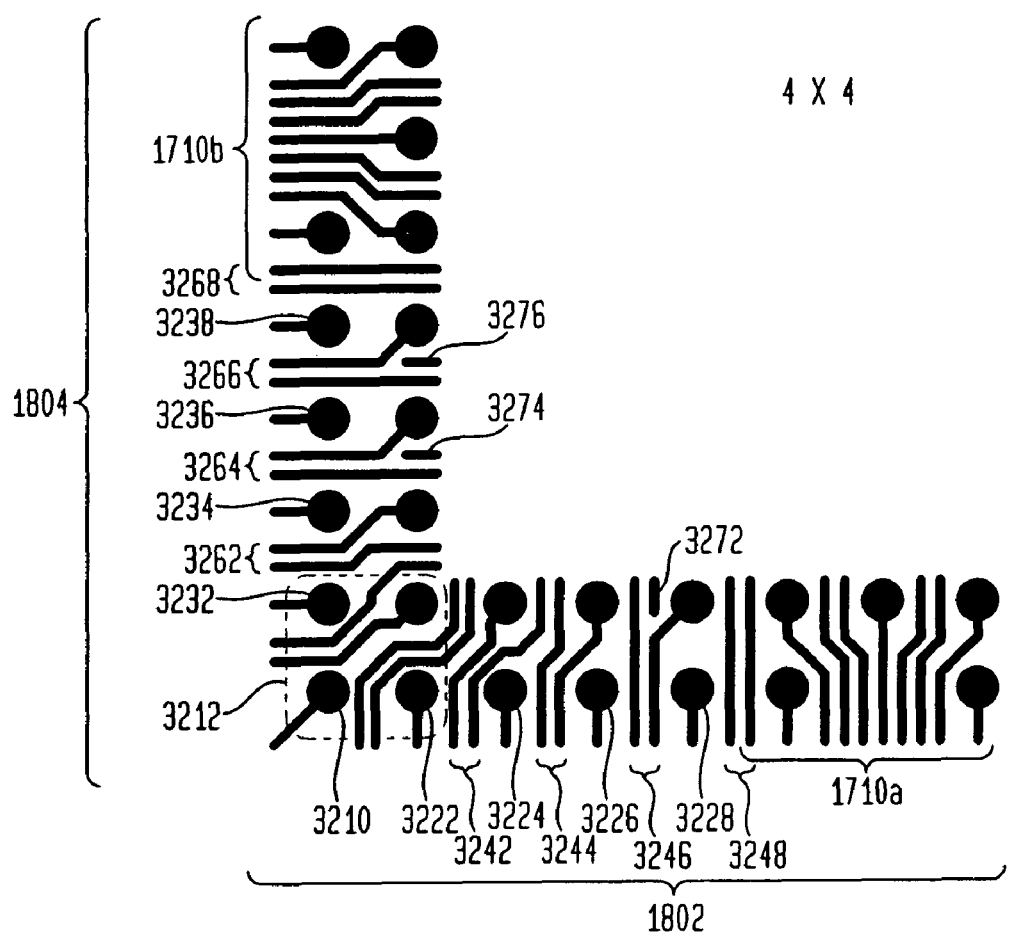

FIG. 32 shows a corner arrangement 3200, according to an example embodiment of the present invention. Corner arrangement 3200 represents a "four-by-four" arrangement. Corner arrangement 3200 is less desirable than corner arrangement 1800 because routing channels are lost or unused. Example signal routing channels are shown for corner arrangement 3200 in FIG. 32. As shown in FIG. 32, three routing channels 3272, 3274, and 3276 cannot be routed internally from the land pattern/array through first and second edges 1802 and 1804. Thus, three internal routing channels are lost or unused in corner arrangement 3200.

In an embodiment, a layout designer or automated system may use a library that includes the corner pad arrangements described above to assist in creating ball layouts. For example, any one or more of corner arrangements 1800, 1900, 2000, 2100, 2200, 2300, 2400, 2500, 2600, 2700, 2800, 2900, 3000, 3100, and 3200 may be included in such a library. Therefore, a land pattern could be at least partially designed by selecting one or more corner arrangements from the library for corners of the land pattern. FIG. 33 shows a Table 3300 that includes data related to the corner arrangements shown in FIGS. 18-32, according to an embodiment of the present invention. The data of Table 3300 could be used to determine total routing channel capacity when incorporating corner pad arrangements into land patterns. The information present in Table 3300 is described, column by column, in the following paragraphs:

Columns 3302 and 3304 respectively show X by Y corner arrangement sizes, for each row. For example, a row 3322 of Table 3300 has entries "0" and "4" for columns 3302 and 3304. Thus, row 3322 relates to a "zero-by-four" corner pad arrangement, such as corner arrangement 2500 shown in FIG. 25. Column 3316 indicates the example corner arrangement described above that a particular row relates to. For example, for row 3322, column 3316 indicates corner arrangement 2500 as an example "zero-by-four" arrangement. Another row 3324 relates to a "two-by-three" corner pad arrangement, such as corner arrangement 1800 shown in FIG. 18. Column 3316 indicates that corner arrangement 1800 as an example "two-by-three" arrangement.

Column 3306 shows a number of routing areas present in the respective corner arrangement (not including routing areas adjacent to corner pads), as described above. For example, row 3322 of Table 3300 relates to corner arrangement 2500 shown in FIG. 25. As shown in FIG. 25, edge 1802 of corner arrangement 2500 has zero routing areas between corner portion 2512 and set 1710a. Edge 1804 of corner arrangement 2500 has four routing areas 2562, 2564, 2566, and 2668 between corner portion 2512 and set 1710b. Thus, corner arrangement 2500 has a total of four indicated routing areas. The value "4" is indicated in column 3306 for row 3322. In another example, row 3324 of Table 3300 relates to corner arrangement 1800 shown in FIG. 18. As shown in FIG. 18, edge 1802 of corner arrangement 1800 has two routing areas. Edge 1804 of corner arrangement 1800 has three routing areas. Thus, corner arrangement 1800 has a total of five indicated routing areas, which is indicated in column 3306 for row 3324.

Column 3308 shows a number of internal routing channels that are unusable or lost in a respective corner arrangement. For example, row 3322 of Table 3300 relates to corner arrangement 2500 shown in FIG. 25. As described above with respect to FIG. 25, corner arrangement 2500 has one internal routing channel 2576 that is unusable or lost. In the example of row 3324, corner arrangement 1800 shown in FIG. 18 has no internal routing channels unusable or lost, as indicated in column 3308.

Column 3310 shows a number of external routing channels that are unusable or lost in a respective corner arrangement. For example, row 3322 of Table 3300 relates to corner arrangement 2500 shown in FIG. 25. As described above with respect to FIG. 25, corner arrangement 2500 has two external routing channels 2572 and 2574 that are unusable or lost. In the example of row 3324, corner arrangement 1800 shown in FIG. 18 has no external routing channels unusable or lost, as indicated in column 3310.

Column 3312 shows a sum of the internal and external routing channels that are unusable or lost for a respective corner arrangement. For example, for corner arrangement 2500, row 3322 of Table 3300 shows a total of three internal and external routing channels that are unusable or lost (i.e., routing channels 2572, 2574, and 2576). In the example of row 3324, column 3312 indicates that a total of zero internal and external routing channels are unusable or lost for corner arrangement 1800.

Column 3314 provides an indication of which corner arrangements sacrifice relatively fewer routing channels. For example, column 3314 indicates that corner arrangement 1800 of row 3324 is an optimum corner arrangement, because it sacrifices zero routing channels.

As described above, column 3316 indicates an example corner arrangement described above to which a particular row relates.

Figure 34:
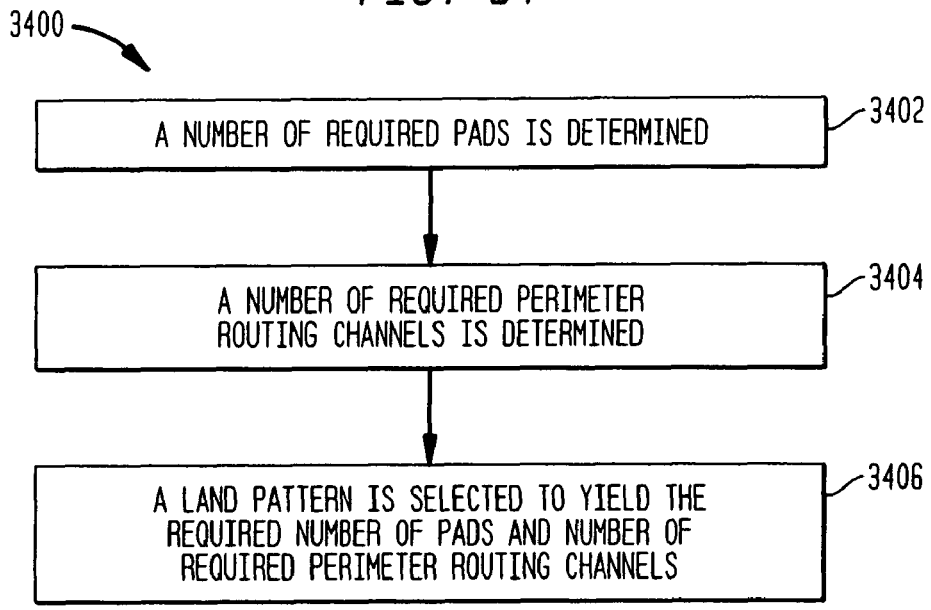
FIG. 34 shows a flowchart for designing land patterns, according to embodiments of the present invention.

FIG. 34 shows an example flowchart 3400 providing steps for designing land patterns incorporating corner pad arrangements, according to embodiments of the present invention. The steps of FIG. 34 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 3400 begins with a step 3402. In step 3402, a number of required pads is determined. For example, the number of required pads is typically a number of pads of an integrated circuit package to be mounted.

For example, the number of required pads can be any combination of power pads, test pads, and signal pads that will interface an integrated circuit package with the land pattern. Power pads include any power and ground pads that will interface with power and ground of the integrated circuit device. Test pads include any pads that will interface with test signals of the integrated circuit device. Test signals tend to be used temporarily during test of a particular integrated circuit package, and are not always made externally available in a final production version of the integrated circuit package, although in some instances they can remain externally available. Signal pads include any pads for other signals of the integrated circuit package. Signal pads tend to be pads that must be routed external to the land pattern on the PCB using routing channels.

In step 3404, a number of required perimeter routing channels is determined. The required number of perimeter routing channels is the number of pads of the array/land pattern that must be routed externally from the array/land pattern in the PCB with routing channels. For example, in an embodiment, the number of required perimeter routing channels is equal to the number of signal pads, and does not include power or test pads. In other embodiments, any combination of signal, power, and test pads may require routing channels.

In step 3406, a land pattern is selected to yield the required number of pads and number of required perimeter routing channels. In an embodiment, step 3406 includes one or more of the steps of flowchart 3500, shown in FIG. 35. These steps are described in detail below, and may occur in any order. Note that these elements of step 3406 can be performed automatically and/or manually. For example, a user and/or a computer system can be used to perform any combination of the elements of step 3502.

In step 3502, a potential land pattern is selected that at least yields the required pads. A land pattern is selected having an array of pads with enough pads for all required signals. For instance, the potential land pattern can be selected by referring to a table that shows array sizes and corresponding numbers of pads therein. A number of pads in an array can alternatively be calculated. For example, a 13×13 array of conductive pads can be selected as a land pattern. The number of pads of a 13×13 array/land pattern can be determined from a table, or can be calculated as follows:

$$\text{Number of pads} = X \text{ pads per row} \times Y \text{ pads per column} \quad \text{Equation 3}$$
$$= 13 \times 13$$
$$= 169 \text{ pads}$$

The number of routing channels for a 13×13 array/land pattern can be determined from a table, or be calculated as follows (First a number of perimeter pads is determined, followed by a determination of the number of routing channels):

$$\text{Number of perimeter pads} = (2 \times X \text{ pads per row} - 2 \text{ pads}) + \quad \text{Equation 4}$$

$$(2 \times Y \text{ pads per col.} - 2 \text{ pads})$$

$$= 2 \times X + 2 \times Y - 4$$

$$= (X + Y - 2) \times 2$$

$$\text{Number of routing channels} = \text{Number of perimeter pads} \times 3 \quad \text{Equation 5}$$

$$= ((X + Y - 2) \times 2) \times 3$$

$$= (X + Y - 2) \times 6$$

For a 13×13 array, the number of routing channels

=$(X+Y-2) \times 6 = (13+13-2) \times 6 = 144$ routing channels

However, if we assume for illustrative purposes that 159 routing channels are actually required for the example 13×13 array/land pattern, additional routing channels are needed. Thus, the 13×13 array/land pattern can be optimized according to the present invention to provide additional routing channels, according to the following steps of flowchart 3500.

In step 3504, a pad arrangement is selected for at least one corner portion of the selected potential land pattern. For example, in an embodiment, any one of the corner pad arrangements described above with respect to FIGS. 18-32 can be selected as the pad arrangement. A corner pad arrangement can be selected for any number of corners of the selected potential land pattern, including for all four corners. In the example of the 13×13 array/land pattern, for illustrative purposes, assume that a 2×3 or 3×2 corner arrangement, as shown in FIG. 18, is selected for all four corners. As described above with respect to FIG. 18, a 2×3 or 3×2 corner arrangement has no lost or unusable routing channels. Thus, if the example 13×13 array/land pattern has four 2×3 or 3×2 corner pad arrangements selected, no routing channels are lost due to the corner pad arrangements. Other selected corner pad arrangements may have lost or unusable routing channels. Note that in an example embodiment, a lookup key may be used to aid in selecting a corner pad arrangement. Such an embodiment is described more fully below with respect to FIG. 37.

Figure 36:
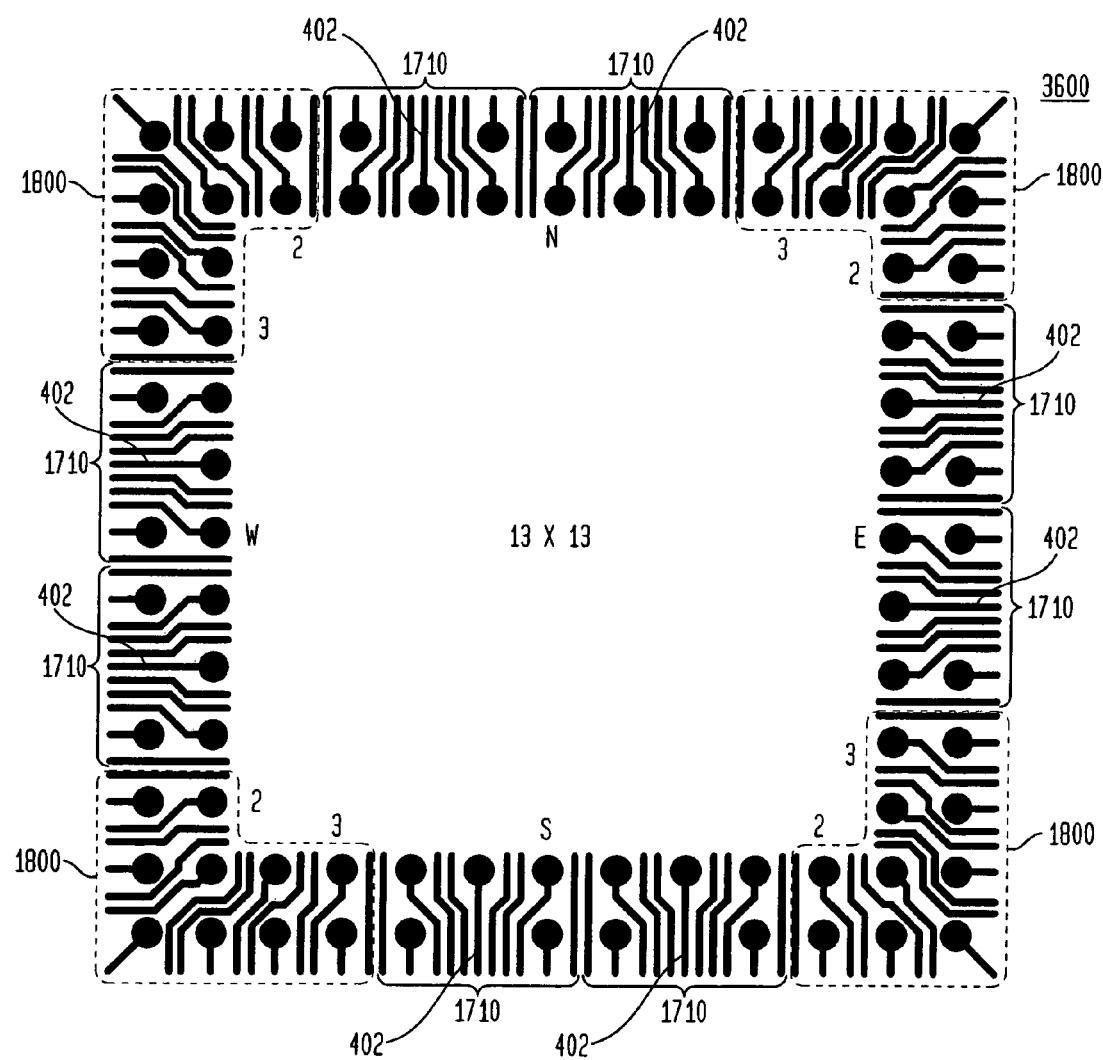
FIG. 36 shows a portion of a land pattern that incorporates corner pad arrangements, according to an example embodiment of the present invention.

In step 3506, at least one perimeter edge of the selected potential land pattern is under populated in a portion of the at least one perimeter edge outside of the selected pad arrangement for the at least one corner portion. For example, in embodiments, as described above, any number of spaces may be positioned in any number of edges of a land pattern to provide additional routing channels. For example, FIG. 36 shows the perimeter two rows/columns of a 13×13 array/land pattern 3600, according to an embodiment of the present invention.

Figure 35:
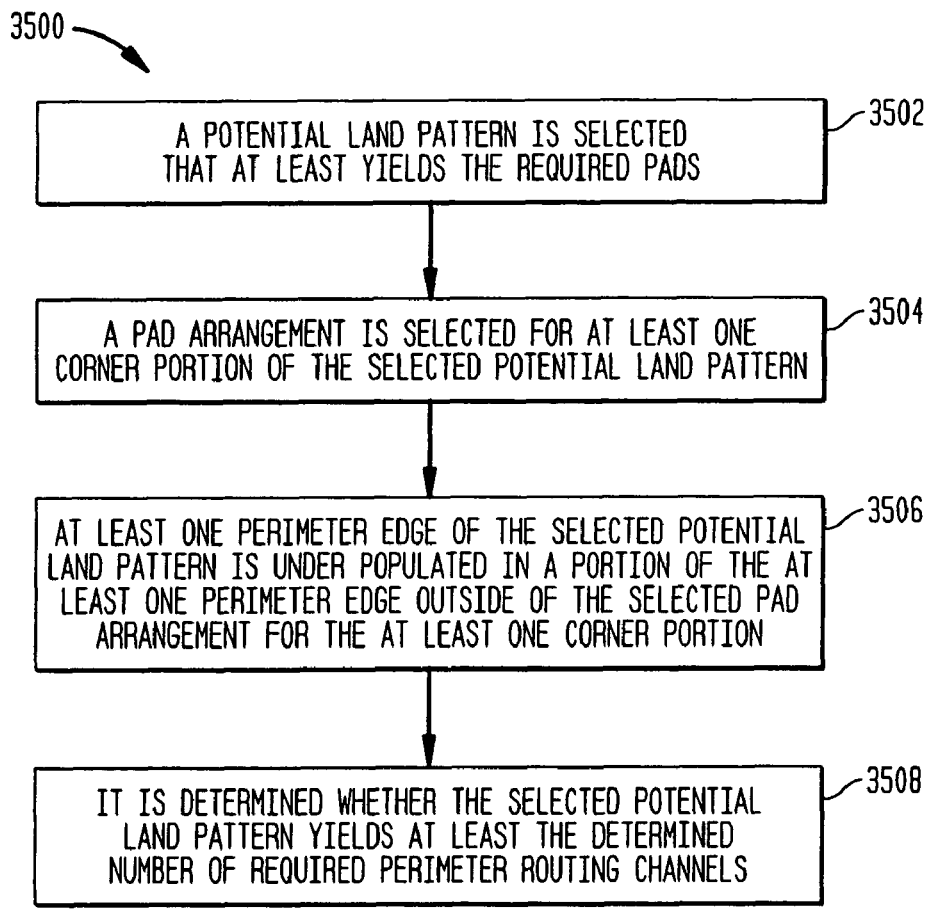
FIG. 35 shows a flowchart for selecting a land pattern, according to embodiments of the present invention.

As shown in FIG. 35, 2×3 or 3×2 corner arrangements 1800 are present in each corner of land pattern 3600, and spaces 402 are positioned in each of the four perimeter edges to provide additional routing channels. In the example of FIG. 36, two spaces 402 are positioned in each edge, for a total of eight spaces. As shown in FIG. 36, one out of every three pads in each edge, between corner pad arrangements 1800, are replaced with a space 402. For example, as shown in FIG. 36, a pair of sets 1710 are positioned in each edge to position spaces 402 in the edges, and provide additional routing channels. The number of spaces can be dictated by the number of sets 1710 that can be positioned in an edge, between the respective corner pad arrangements. Alternatively, the number of spaces positioned in an edge between the respective corner pad arrangements can be determined by any of the equations or description present elsewhere herein.

In step 3508, it is determined whether the selected potential land pattern yields at least the determined number of required perimeter routing channels. For example, in an embodiment, the number of perimeter routing channels present in the selected land pattern is calculated, and then compared with the required number. For example, the number of perimeter routing channels present in the example 13×13 array/land pattern, as shown in FIG. 36, can be calculated.

Number of routing channels present      Equation 6

$$\begin{aligned}
&= \text{number of routing channels previously present (e.g., see Eq. 5)} + \text{number of added routing channels due to spaces (} S \text{) (2 channels/space)} - \text{number of routing channels lost due to corner pad arrangements (e.g., Table 3300)} \\
&= (X+Y-2) \times 6 + S \times 2 - (\text{lost channels}) \times \# \text{ corners} \\
&= 144 + 8 \text{ spaces} \times 2 - (0) \times 4 \text{ corners} \\
&= 160 \text{ routing channels present}
\end{aligned}$$

Thus, in the example 13×13 array/land pattern, as modified by the present invention, 160 routing channels are present. Thus, assuming that 159 routing channels were desired, by comparing the 160 routing channels present to the requirement for 159 routing channels, enough routing channels are present (i.e., one extra routing channel exists).

Note that in an embodiment, if enough routing channels are not present in the selected potential land pattern after step 3508, steps 3502-3508 of flowchart 3500 can be repeated for a subsequently selected array/land pattern size. These steps can be repeated until enough pads and routing channels are provided by the selected array/land pattern.

Alternatively, steps 3504-3508 can be repeated for the same selected potential land pattern, using different corner pad arrangements and/or different numbers of spaces in one or more edges, to determine whether enough routing channels can be generated.

Note that any one or more of steps 3502, 3504, 3506, and 3508 can be performed by referring to a Table that lists land pattern sizes, and corresponding routing channel data for the land patterns after selecting corner pad arrangements and positioning spaces in edges of the land patterns. Such tables are further described as follows.

As indicated in column 3312 of FIG. 33, some corner pad arrangements suffer from greater losses of routing channels than others do. In embodiments, while any corner pad arrangement can be used with any size array/land pattern (assuming that the array/land pattern is large enough for a corner pad arrangement), corner pad arrangements with fewer routing channels lost or unusable are preferable. A Table 3700 shown in FIG. 37 shows an example selection of corner pad arrangements used for particular array/land pattern sizes, according to an embodiment of the present invention. Furthermore, as described below, Table 3700 of FIG. 37 can be applied to array/land pattern sizes not directly shown in Table 3700. The information present in Table 3700 of FIG. 37 is described, column by column, in the following paragraphs:

Column 3702 shows a key for each row that can be used as a reference for a particular set of corner arrangements corresponding to that row.

Column 3704 shows an offset key for each row.

Columns 3706 and 3708 respectively show a count of pads or pins in a row (X) and a count of pads or pins in a column (Y) of the land pattern or array of that particular row of Table 3700. For example, row 3758 refers to a 13×13 array/land pattern, as indicated in columns 3706 and 3708.

Columns 3710 and 3712 respectively show a count of pads or pins in a row (X) and a count of pads or pins in a column (Y) of the land pattern after spaces are removed from edges of the land pattern. In column 3710, "NS" refers to "North" and "South" edges, and in column 3712, "EW" refers to "East" and "West" edges of the land pattern. For example, for the 13×13 array/land pattern of FIG. 36, these edges are indicated with "N", "S", "E", and "W" symbols. Note that these indicated directions are relative, and that the present invention relates to land patterns rotated or mirrored in any orientation.

Columns 3714, 3716, 3718, and 3720 respectively show corner pad arrangements selected for northeast, southeast, southwest, and northwest corners of the respective land pattern. For example, row 3758 indicates that a 3×2 corner arrangement was selected for all four corners for a 13×13 array/land pattern. An example 3×2 corner arrangement was described above with respect to FIG. 18.

Columns 3722, 3724, 3726, and 3728 respectively indicate a number of internal routing channels lost for each of the northeast, southeast, southwest, and northwest corner pad arrangements indicated in columns 3714, 3716, 3718, and 3720. For example, these columns of row 3758 indicate that no internal routing channels were lost for the 3×2 corner arrangements selected for all four corners. The loss of no internal routing channels was indicated above with respect to the example 3×2 corner arrangement described above with respect to FIG. 18.

Column 3730 indicates a total number of internal routing channels lost, as indicated in columns 3722, 3724, 3726, and 3728. For example, row 3758 indicates a total of zero internal routing channels lost.

Columns 3732, 3734, 3736, and 3738 respectively indicate a number of external routing channels lost for each of the northeast, southeast, southwest, and northwest corner pad arrangements indicated in columns 3714, 3716, 3718, and 3720. For example, these columns of row 3758 indicate that no external routing channels were lost for the 3×2 corner arrangements selected for all four corners. The loss of no external routing channels was indicated above with respect to the example 3×2 corner arrangement described above with respect to FIG. 18.

Column 3740 indicates a total number of external routing channels lost, as indicated in columns 3732, 3734, 3736, and 3738. For example, row 3758 indicates a total of zero external routing channels lost.

Column 3742 indicates a total of all routing channels lost, which is a summation of columns 3730 and 3740. For example, row 3758 indicates a total of zero routing channels lost.

Column 3744 refers to figures that show example land patterns reflecting the corner pad arrangements and any routing channels lost as shown in the corresponding row. For example, row 3758 corresponds to 13×13 array/land pattern, such as land pattern 3600 shown in FIG. 36. Land pattern 3600 includes a 3×2 corner pad arrangement 1800 in each corner, which suffer no lost routing channels. Example arrays/land patterns corresponding to the remaining rows of column 3744 are described as follows with regard to FIGS. 38-42 as follows. For illustrative purposes, only the outer two perimeter rows/columns of the arrays/land patterns of FIGS. 38-42 are shown. As will be described below, the configuration of land patterns of FIGS. 36 and 38-42 can be extended to land patterns of any size.

Figure 38:
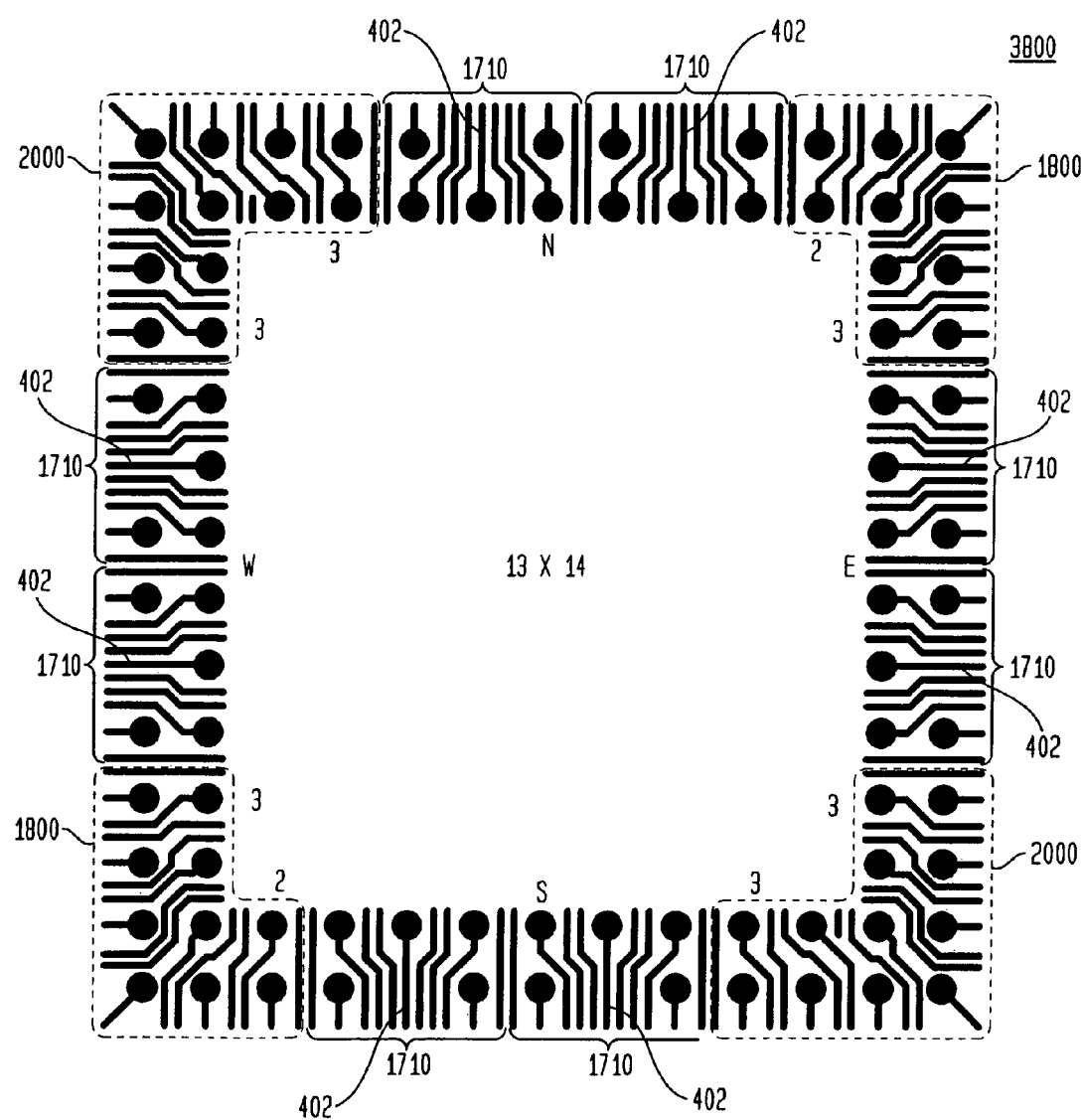
FIGS. 38-42 show portions of land patterns that incorporate corner pad arrangements, according to example embodiments of the present invention.

FIG. 38 shows an example 13×14 array/land pattern 3800, according to an embodiment of the present invention. Land pattern 3800 corresponds to rows 3760 and 3764 of Table 3700 shown in FIG. 37. As shown in FIG. 38, land pattern 3800 has a 3×3 corner arrangement 2000 (of FIG. 20) in the northwest and southeast corners, and has a 2×3 corner arrangement 1800 in the northeast and southwest corners. As indicated in column 3742, a total number of only two routing channels are lost due to the corner pad arrangements selected. Two spaces 402 are present in each edge of land pattern 3800.

Figure 39:
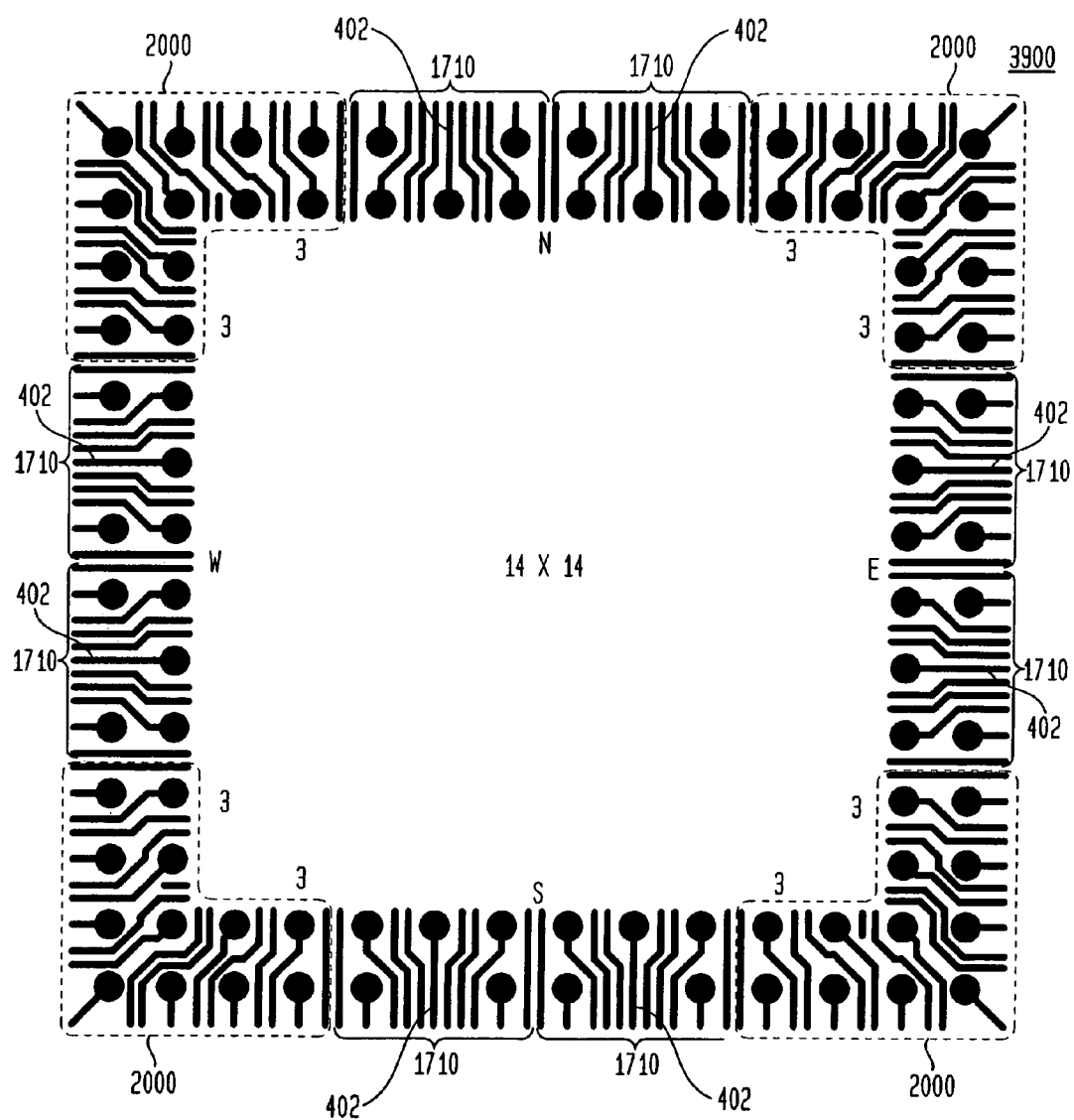

FIG. 39 shows an example 14×14 array/land pattern 3900, according to an embodiment of the present invention. Land pattern 3900 corresponds to row 3766 of Table 3700 shown in FIG. 37. As shown in FIG. 39, land pattern 3900 has a 3×3 corner arrangement 2000 (of FIG. 20) in all corners. As indicated in column 3742, a total number of only four routing channels are lost due to the corner pad arrangements selected. Two spaces 402 are present in each edge of land pattern 3900.

Figure 40:
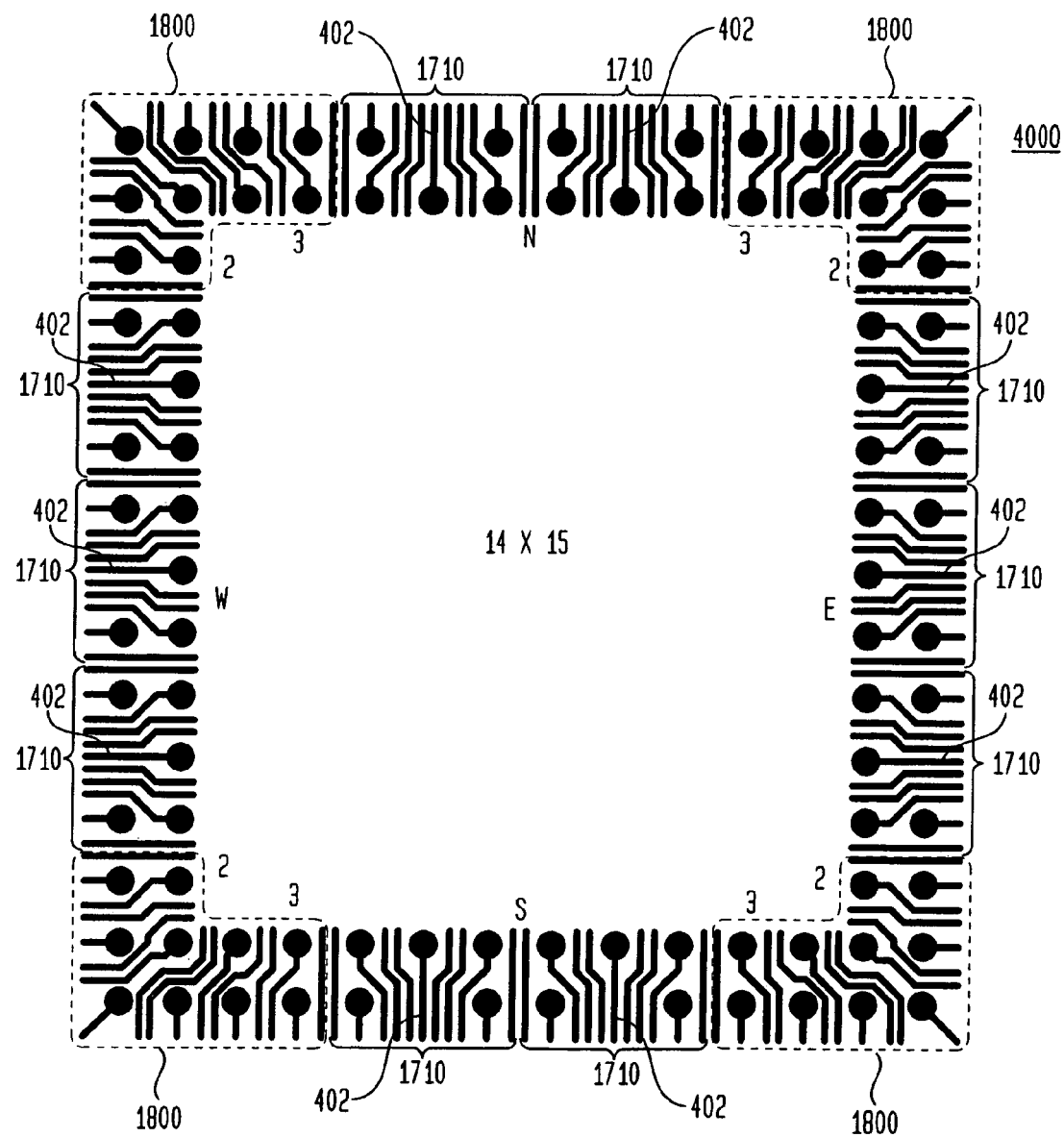

FIG. 40 shows an example 14×15 array/land pattern 4000, according to an embodiment of the present invention. Land pattern 4000 corresponds to rows 3754 and 3762 of Table 3700 shown in FIG. 37. As shown in FIG. 40, land pattern 4000 has a 3×2 or 2×3 corner arrangement 1800 (of FIG. 18) in all corners. As indicated in column 3742, a total number of zero routing channels are lost due to the corner pad arrangements. Two spaces 402 are present in each of the North and South edges, and three spaces 402 are present in each of the East and West edges of land pattern 4000.

Figure 41:
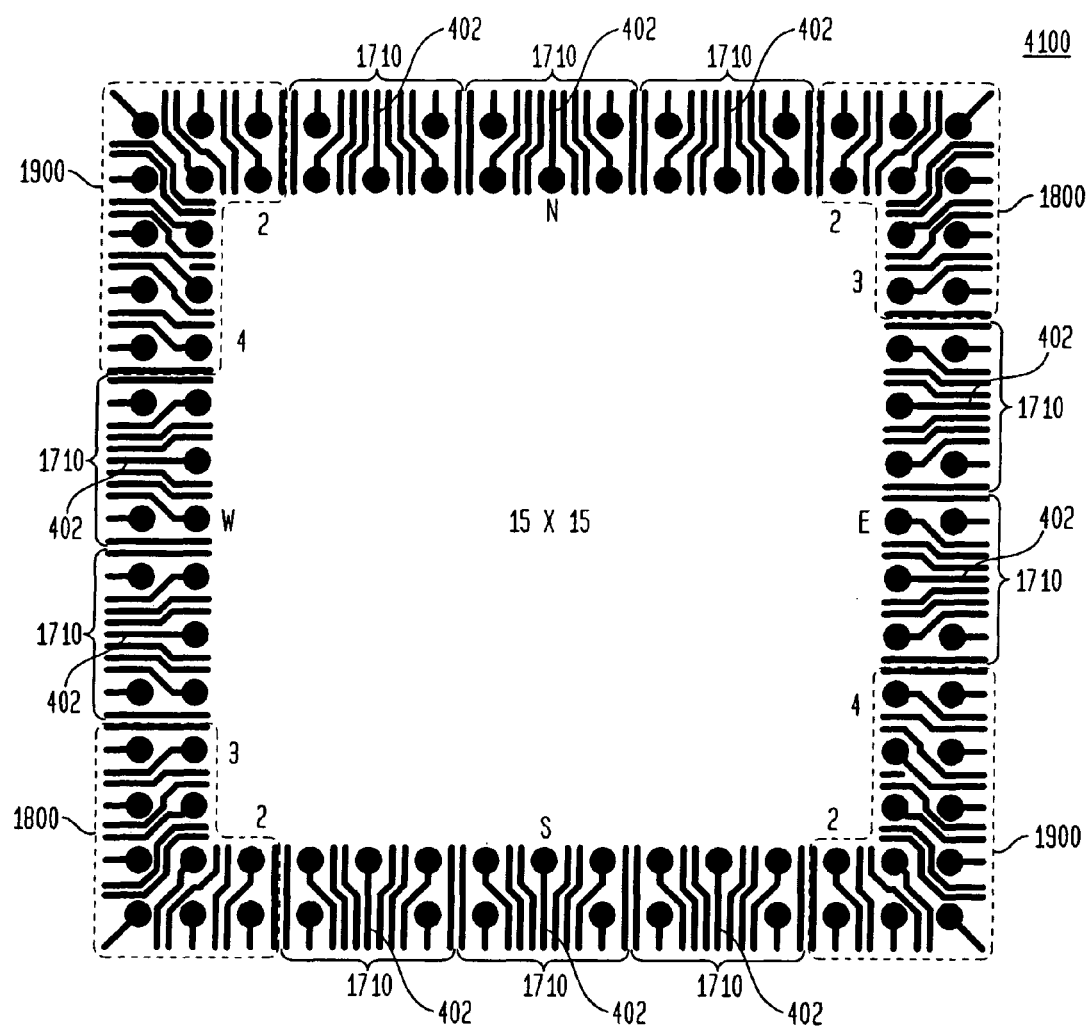

FIG. 41 shows an example 15×15 array/land pattern 4100, according to an embodiment of the present invention. Land pattern 4100 corresponds to row 3750 of Table 3700 shown in FIG. 37. As shown in FIG. 41, land pattern 4100 has a 2×3 corner arrangement 1800 (of FIG. 18) in each of the northeast and southwest corners, and a 2×4 corner arrangement 1900 (of FIG. 19) in each of the northwest and southeast corners. As indicated in column 3742, a total number of only two routing channels are lost due to the corner pad arrangements selected. Three spaces 402 are present in each of the edges of land pattern 4100.

Figure 42:
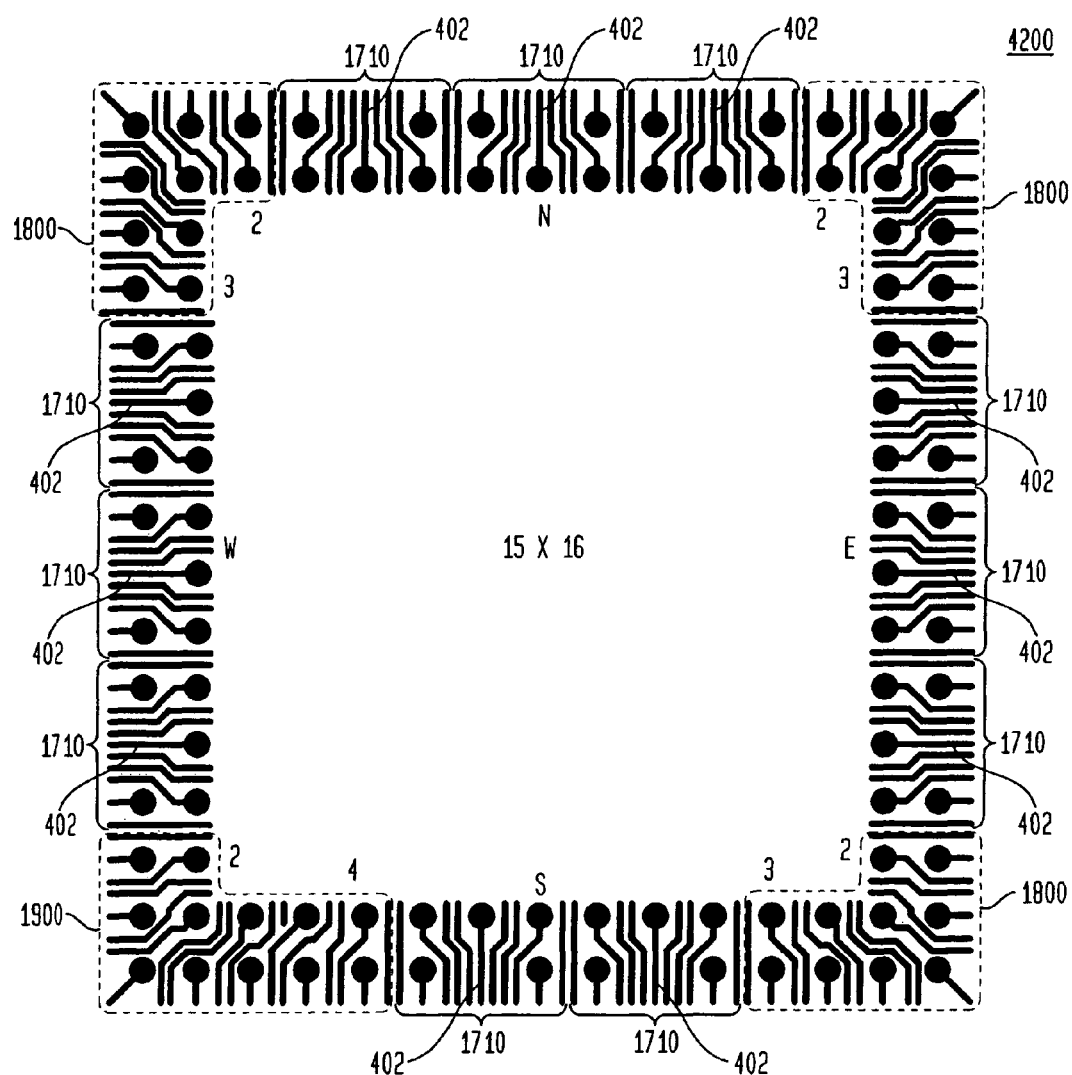

FIG. 42 shows an example 15×16 array/land pattern 4200, according to an embodiment of the present invention. Land pattern 4200 corresponds to rows 3752 and 3756 of Table 3700 shown in FIG. 37. As shown in FIG. 42, land pattern 4200 has a 3×2 or 2×3 corner arrangement 1800 (of FIG. 18) in the northwest, northeast, and southeast corners, and a 2×4 corner arrangement 1900 (of FIG. 19) in the southwest corner. As indicated in column 3742, a total number of only one routing channel is lost due to the corner pad arrangements selected. Three spaces 402 are present in each of the North, East, and West edges, and two spaces 402 are present in the South edge of land pattern 4200.

The configurations of the land patterns of FIGS. 36 and 38-42 can be extended to configure land patterns of any size that have similar characteristics. For example, by changing a length of a row and/or a column of a land pattern of one of FIGS. 36 and 38-42, another size land pattern can be created, having similar routing channel characteristics to the original land pattern. Adding a multiple of three rows and/or three columns to one of the land patterns of FIGS. 36 and 38-42 can create any size land pattern. The land pattern thus created will have the same corner pad arrangements as the original land pattern of FIGS. 36 and 38-42. Furthermore, by adding in multiples of three, the lengthened row/column will have a/an additional set(s) 1710 positioned therein, each having a space 402 that adds a known number of routing channels.

For example, assume that a 22×23 array/pattern is desired. The 22×23 array/land pattern can be created by enlarging one of the land patterns of FIGS. 36 and 38-42. A land pattern of FIGS. 36 and 38-42 is enlarged by multiples of three of rows and columns. The 13 by 14 array/land pattern of FIG. 38 is suitable for creating the 22×23 array/land pattern. This is because:

$$22 \text{ rows} = 13 \text{ rows} + 3 \times (3 \text{ rows})$$
$$23 \text{ columns} = 14 \text{ columns} + 3 \times (3 \text{ columns})$$

As shown above, a 22×23 array/land pattern is based upon a 13×14 array/land pattern, after adding multiples of 3 rows and 3 columns thereto.

Thus, row 3760 of Table 3700 shown in FIG. 37 can be referred to when creating a 22×23 array/land pattern. Corner pad arrangements for the 22×23 array/land pattern can be obtained (i.e., see columns 3714, 3716, 3718, and 3720), and lost routing channel information can be obtained (i.e., see column 3742). Furthermore, three sets 1710 are added to each edge to create additional routing channels.

Another way to determine the particular array/land pattern in Table 3700 on which to base a desired land pattern size upon is to generate a lookup key, which can be used to reference column 3702. The lookup key can be generated from a land pattern by concatenating a remainder of the number of rows divided by 3, to a remainder of the number of columns divided by three, as shown in Equation 7 below:

$$\text{Lookup key} = \text{remainder of} \atop ((\# \text{ of} \atop \text{rows})/3) \quad \text{concatenate} \quad \text{remainder of} \atop ((\# \text{ of} \atop \text{columns})/3) \qquad \text{Equation 7}$$

Thus, using the 22×23 array/land pattern example, the lookup key would be:

$$\text{Look up key} = \text{remainder of } (22/3) \text{ concatenate}$$
$$\text{remainder of } (23/3)$$
$$= 1 \text{ concatenate } 2$$
$$= 12$$

Column 3702 can then be referred to for the lookup key of "12," which appears in row 3760. Thus, again, the 22×23 array/land pattern can be based on the 13×14 array/land pattern of column 3760, an example of which is shown in FIG. 38. Other corner pad arrangements may be appropriate in some situations, although, in some embodiments, the corner pad arrangements shown are optimum.

Thus, in the manner described above, any size array/land pattern can be created from the array/land patterns of FIGS. 36 and 38-42. A Table 4300 is shown in FIGS. 43A and 43B, that is similar to Table 600 shown in FIGS. 6A and 6B, according to an embodiment of the present invention. Table 4300 contains information directed to numerous sizes of IC packages and land patterns that incorporate the corner pad arrangements shown in Table 3700 of FIG. 37. Thus, Table 4300 can be referred to when selecting/designing an array/land pattern that incorporates these corner pad arrangements. Table 4300 can be referred to by a user, manually, or can be incorporated in an automatic system. The columns of Table 4300 that are not included in Table 600 of FIGS. 6A and 6B are described in the following paragraphs:

Column 4302 shows a lookup key for each row that can be used to determine corner pad arrangements for the array/land pattern of that row. For example, the lookup key can be used to refer to column 3702 of Table 3700, shown in FIG. 37. The lookup key corresponds to the particular row of Table 3700 that contains the corner pad arrangements (i.e., columns 3714, 3716, 3718, and 3720) used for the array/land pattern. For example, row 4360 in Table 4300 corresponds to row 660 of Table 600 shown in FIG. 6A (i.e., corresponds to a 19×19 array/land pattern). As shown in FIG. 43A, column 4302 indicates a lookup value of 11 for row 4360. Referring to column 3702 of Table 3700, the lookup value of 11 is in row 3758, which corresponds to a 13×13 array/land pattern, an example of which is shown in FIG. 36.

Column 4304 shows the number of pads remaining in each of the North and South edges of the array/land pattern, after removal of peripheral pads or pins according to the present invention (i.e., replacing pads with spaces in the edges). For example, for row 4360, a 15 is entered in column 4304, indicating that 15 pads remain in the North and South edges of the array/land pattern. In other words, 19−15=4 spaces are present in these edges.

Column 4306 shows the number of pads remaining in each of the East and West edges of the array/land pattern, after removal of peripheral pads or pins according to the present invention (i.e., replacing pads with spaces in the edges). For example, for row 4360, a 15 is entered in column 4306, indicating that 15 pads remain in the East and West edges of the array/land pattern. In other words, 19−15=4 spaces are present in these edges.

Column 4308 shows, for each row of Table 4300, a resulting total number of pads or pins remaining for the entire array/land pattern, after removal of peripheral pads or pins according to the present invention. For example, for row 4360, a number of 345 remaining pads is entered in column 4306. A value in column 4306 may be calculated as follows:

$$\begin{aligned}\text{Value in column 4308} &= \text{value in column 608} - 2 \times \binom{\# \text{ of spaces}}{\text{in } NS \text{ rows}} + \binom{\# \text{ of spaces}}{\text{in } EW \text{ rows}} \\ &= 361 - 2 \times (4+4) \\ &= 345\end{aligned}$$

Note that the number of spaces in NS and EW rows can be calculated as follows:

$$\# \text{ of spaces in } NS \text{ rows} = \text{value in column 604} - \text{value in column 4304}$$
$$\# \text{ of spaces in } EW \text{ rows} = \text{value in column 606} - \text{value in column 4306}$$

Column 4310 shows a total number of externally available pads or pins for the entire land pattern or array after removal of pads or pins according to the present invention, and using the particular corner pad arrangements indicated in Table 3700 for the particular array/land pattern. For example, the value for column 4310 for a particular row can be calculated using Equation 6 described above. For example, for row 4360, the value in column 4306 (i.e., 248) can be calculated as follows:

$$\begin{aligned} &= \begin{array}{l} \text{number of routing} \\ \text{channels previously} \\ \text{present (e.g., value} \\ \text{in column 610)} \end{array} + \begin{array}{l} \text{number of added} \\ \text{routing channels} \\ \text{due to spaces} \\ (2 \times \# \text{ of spaces}) \end{array} - \begin{array}{l} \text{number of routing} \\ \text{channels lost due} \\ \text{to corner pad} \\ \text{arrangements} \\ \text{(e.g., Table 3700)} \end{array} \\ &= 216 + 2 \times 2 \times (4+4) - 0 \\ &= 248 \end{aligned}$$

Column 4312 shows a total number of internal or "orphaned", unavailable pads or pins for the entire land pattern or array after removal of pads or pins according to the present invention, and using the particular corner pad arrangements indicated in Table 3700 for the particular array/land pattern. For example, the value for column 4312 for a particular row can be calculated as:

Value in column 4312=value in column 4308–value in column 4310

For row 4360, the value for column 4312 is calculated as:

=345–248=97

Column 4314 shows a percentage of pads or pins that are internal or orphaned for the entire land pattern or array after removal of pads or pins according to the present invention, and using the particular corner pad arrangements indicated in Table 3700 for the particular array/land pattern. Thus, for each row, a value in column 4314 may be calculated as follows:

$$\text{value in column } 4314 = \frac{\text{value in column } 4312}{\text{value in column } 4310} \times 100$$

For row 4360, the value for column 4314 is calculated as:

$$\frac{97}{248} \times 100 = 28\%$$

Thus, note that as compared to row 660 of FIG. 6A, column 626 of Table 600, row 4360, column 4314 indicates an equal percentage. Table 600 of FIGS. 6A and 6B does not take into account corner pad arrangements, thus providing an approximation. If corner arrangements are used that have lost or unused routing channels, a value in column 4360 may have a higher percentage of internal or orphaned pads or pins when compared to a corresponding value in column 660 (i.e., where corner arrangements are considered to lose no routing channels).

In a further embodiment, power and/or ground may be taken into account when selecting corner pad arrangements. The number and location of routing channels for power and/or ground in a land pattern/array can be factored in when making this determination. This has a benefit when designing PCBs. For example, PCBs may be designed in various configurations, including: (a) having power and ground on multiple layers separate from other signals; (b) having power and ground routed on a bottom layer of a PCB, while signals are routed on a top layer of the PCB; (c) having power and other signals routed on the top layer while ground is routed on the bottom layer; and (d) having power, ground, and other signals all routed on the top layer (i.e., a single layer) of the PCB. Although (c) and (d) tend to be the most difficult configurations to design, the present invention provides for design of all these configurations.

For example, FIG. 45 shows a Table 4500 that provides information relating corner pad arrangements to power/ground channel distribution, according an embodiment of the present invention. Table 4500 is based on a design parameter where power/ground routing channels use an area equivalent to two signal routing channels, although in alternative embodiments, power/ground can use other numbers of signal routing channels. (Thus, in alternative embodiments, the contents/results of Table 4500 can be calculated with or without reference to Table 4500.) Table 4500 of FIG. 45 includes some columns similar to those of Table 37 of FIG. 37, which are numbered correspondingly.

Column pairs 4502, 4504, 4506, 4508, 4510, 4512, 4514, 4516, and 4518 of Table 4500 relate to different power/ground routing channel quantities in edges of land pattern/arrays. For each column pair, row 4520 indicates a number of power/ground in North and South (NS) and in East and West (EW) edges of a land/pattern array, as indicated by columns labeled NS and EW for each column pair. For example, column pair 4502 indicates zero power or ground channels in both of the NS and EW edges of a respective land pattern/array. In another example, column pair 4512 indicates one power or ground channel in each of the NS edges, and two power/ground channels in each of the EW edges of a respective land pattern/array.

In an embodiment, Table 4500 can be used to select a set of corner pad arrangements from the array/land patterns of FIGS. 36 and 38-42 for a particular land pattern/array having a particular configuration of power/ground channels. For example, for illustrative purposes, assume a 15×15 land pattern/array is desired, having two power channels in each of the North and South edges, and one power channel in each of the East and West edges. Column 4516 is thus referred to, as it corresponds to the two NS power/ground channels and one EW power/ground channel, as shown in row 4520. Row 4532 of column 4516 indicates "15" for NS edges and "15" for EW edges, and thus corresponds to the example, desired 15×15 land pattern/array. As shown for row 4532, in column 3702, a lookup key value of "12" is appropriate for the 15×15 land pattern/array, having the example power constraints. Furthermore, as indicated in column 3744 for row 4532, an appropriate set of corner pad arrangements for the example 15×15 land pattern/array is provided in FIG. 38, which shows 13×14 array/land pattern 3800. Thus, in the present example, the corner pad arrangements for 13×14 pad/pin land pattern/array 3800 of FIG. 38 can used for a 15×15 land pattern/array that requires two power channels in each of the North and South edges, and one power in each of the East and West edges. As shown in FIG. 38, two corners of 13×14 pad/pin land pattern/array 3800 use 2×3 corner pad arrangement 1800, and two corners use 3×3 corner pad arrangement 2000. These arrangement can be selected to design the corners of the example 15×15 land pattern/array. This process can be used for any sized land pattern/array, having any number of required power(s) and/or ground(s).

Although the largest number of powers/grounds shown in row 4520 for a particular NS or EW column is two, the information in column pairs 4502, 4504, 4506, 4508, 4510, 4512, 4514, 4516, and 4518 can be extended to numbers greater than two. Each entry in these columns extends to the value located therein, plus three multiplied by any integer:

$$\text{An entry in a NS or EW column covers a number of powers} = \text{value of entry in respective NS or EW column} + 3 \times N$$

where N=any integer greater than or equal to zero

For example, column pair 4506 has an entry of 0 in the NS column, and an entry of 2 in the EW column (i.e., 0, 2). Thus, according to the above equation, the NS and EW entries of column pair 4506 also cover power/ground numbers of: 0, 5 (0+3×0, 2+3×1); 3, 2 (0+3×1, 2+3×0); and 6, 8 (0+3×2, 2+3×2), for example. Thus, column pair 4506 can be consulted when designing land pattern/arrays having these required number of power/ground traces.

Thus, corner pad arrangements corresponding to various land pattern/array sizes can be calculated, or can be determined using Table 4500. Use of Table 4500 in this manner enables the multi- and single-layer routing configurations described above. Note that in alternative embodiments, corner pad arrangements other than those determined using Table 4500 can be used for particular land pattern/arrays.

Thus, in any of the manners describe above, arrays/land patterns can have selected corner pad arrangements to aid in signal routing. As described above, any corner pad arrangement can be used with any array/land pattern size, pursuant to the particular application. Furthermore, note that selected corner arrangements can be used in the single- and multi-layer embodiments of the present invention described above.

Figure 44A:
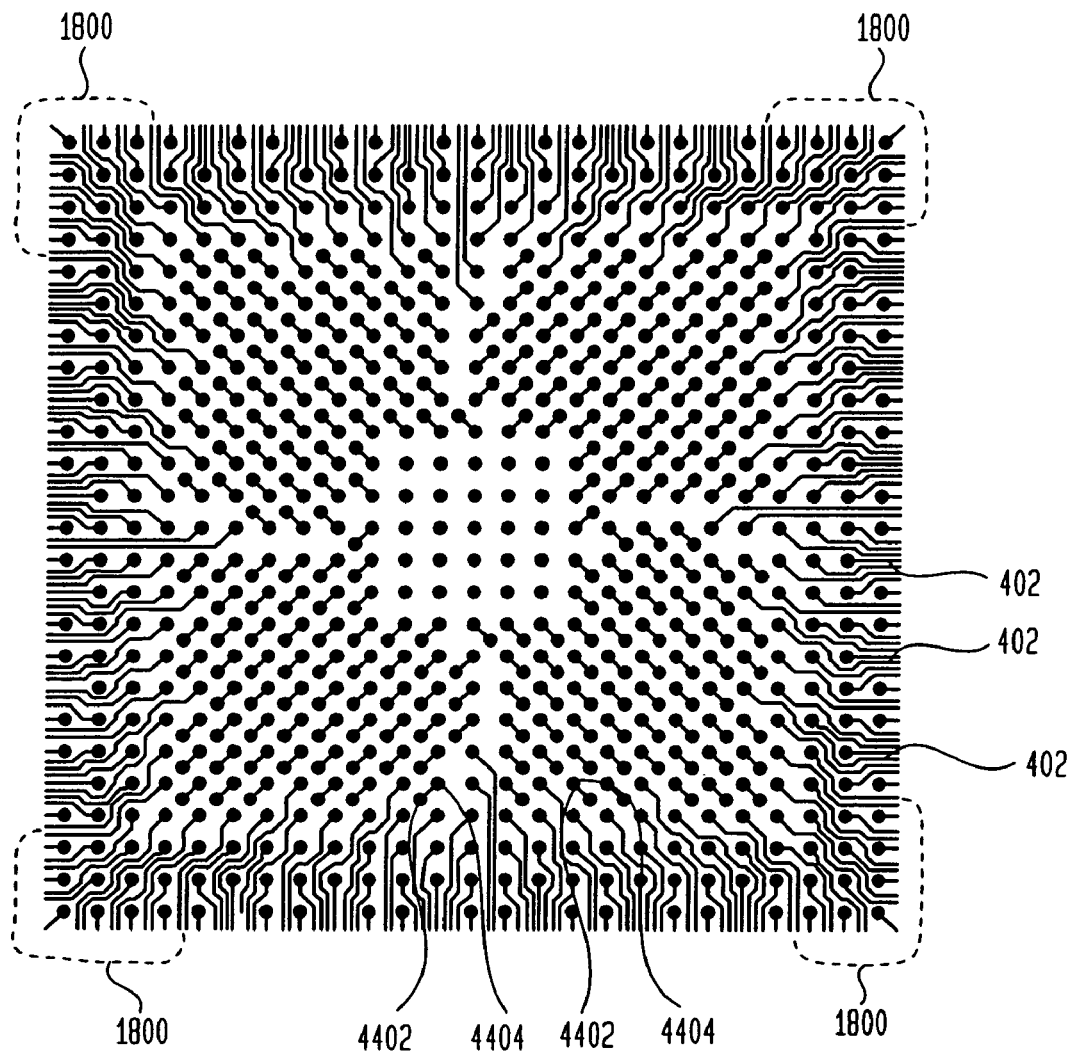
FIGS. 44A-44C show layers of a printed circuit board having routing channels on multiple layers, according to an embodiment of the present invention.
Figure 44B:
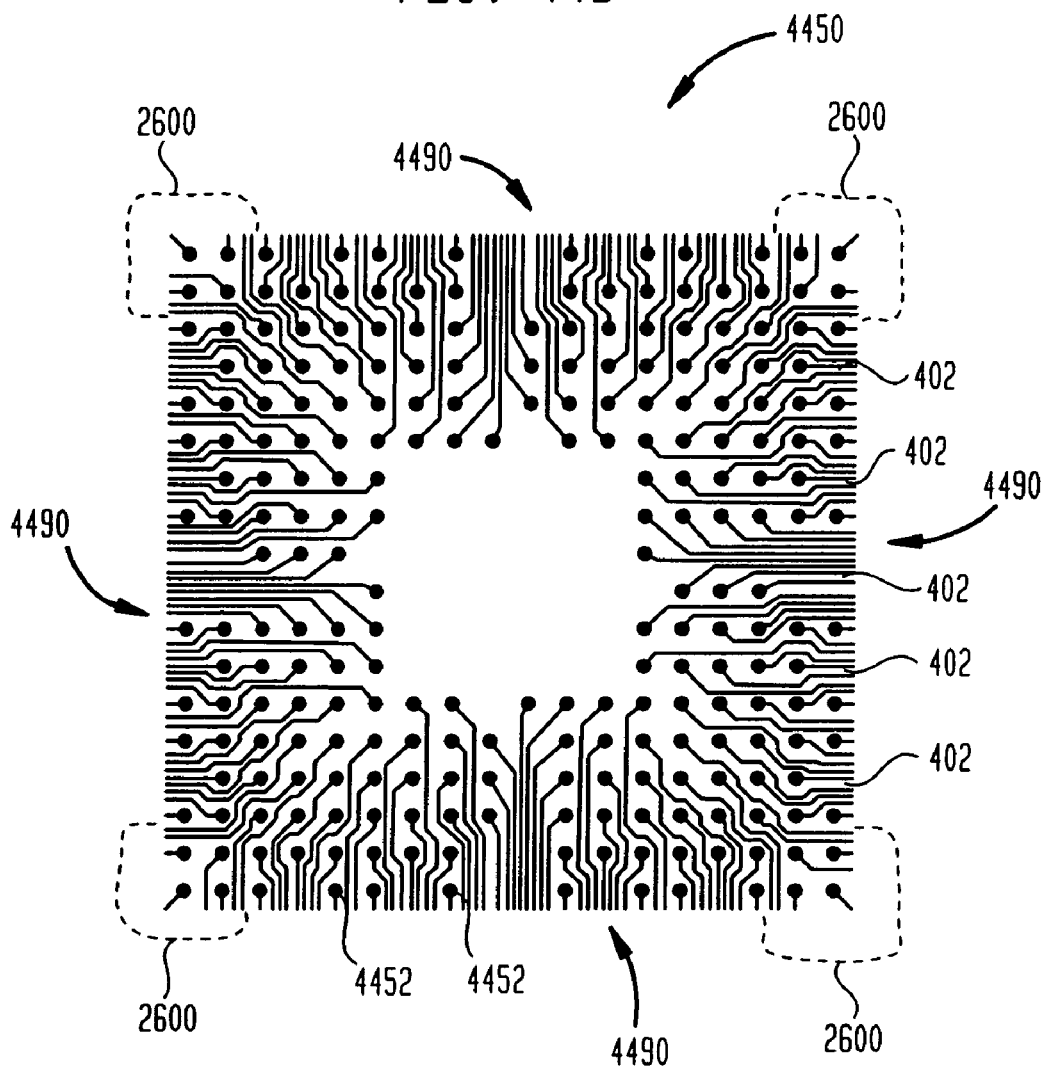
Figure 44C:
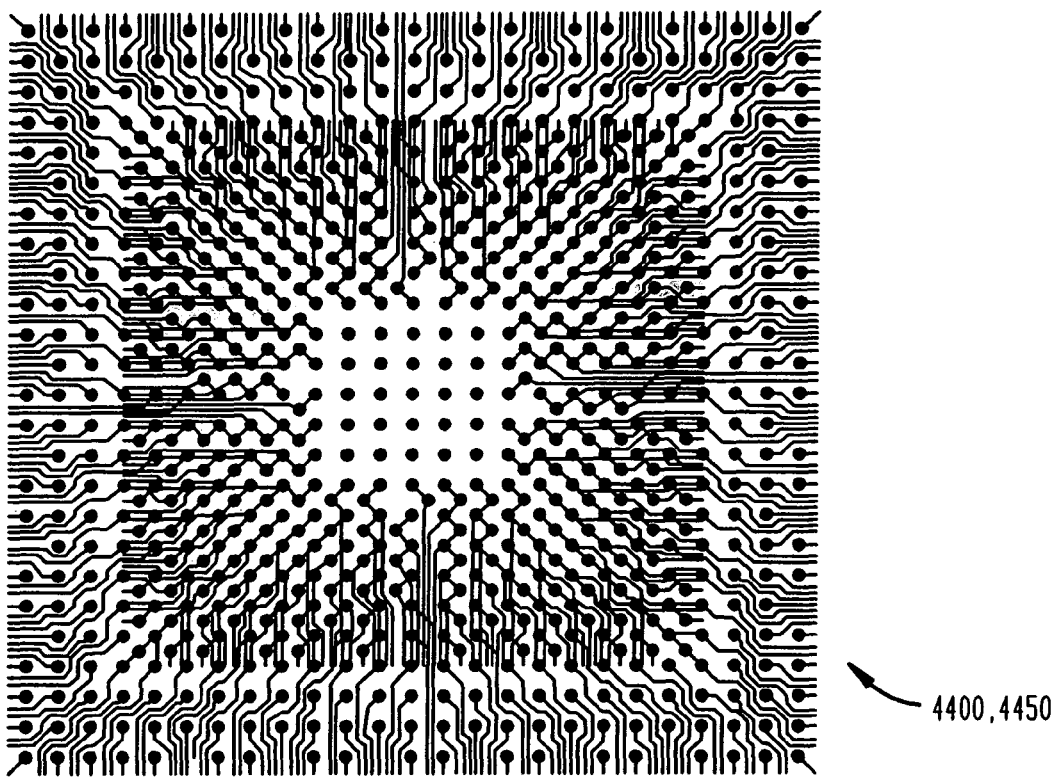

For example, FIGS. 44A-44C illustrate a multi-layer embodiment of the present invention, present in a printed circuit board. FIG. 44A shows a first layer of a PCB that has conductive features including a 25×25 land pattern 4400 and associated routing. FIG. 44B shows a second layer of the PCB that has conductive features including an 18×18 array 4450 of conductive vias/pads and associated routing. FIG. 44C shows the views of land pattern 4400 and array 4450 overlaid on each other. Although specific ball pitch, pad size, via size, trace width, and other size related data is shown in FIGS. 44A-44C, this data is provided for illustrative purposes, and is not limiting.

Land pattern 4400 of FIG. 44A is configured to mount an integrated circuit device, such as a ball grid array package. A plurality of conductive vias 4402 through the printed circuit board electrically couple a portion of the conductive pads 4404 of land pattern 4400 to corresponding conductive vias/pads 4452 of via array 4450 of the second layer.

As shown in FIGS. 44A and 44B, corner arrangements have been selected for land pattern 4400 and via array 4450. For each corner of land pattern 4400, a 2×3 corner arrangement 1800 has been selected. For each corner of via array 4450, a 1×1 corner arrangement 2600 has been selected. As described above with respect to FIG. 18, the 2×3 corner arrangements 1800 of land pattern 4400 suffer no lost or unusable routing channels. As described above with respect to FIG. 26, the 1×1 corner arrangements 2600 of via array 4450 each suffer from three lost or unusable routing channels 2672, 2674, and 2676. These lost or unusable routing channels are represented in FIG. 44B by missing routing channels in each corner of via array 4450.

Furthermore, as shown in FIGS. 44A and 44B, each perimeter edge of land pattern 4400 and via array 4450 is not fully populated with conductive vias/pads. Spaces 402 are created in each edge to create additional routing channels for signals from conductive pads within land pattern 4400 and via array 4450 to be routed external through the respective edges. In an embodiment, as shown in FIG. 44B, due to the positions of vias 4452 relative to pads 4404 in FIG. 44A, it appears that channels of spaces 4490 are formed through via array 4450. In other words, a North-South and East-West gap is formed through via array 4450. These gaps or channels of spaces 4490 can be used to supply additional routing channels, as shown in FIG. 44B.

Note that as shown in the example of FIGS. 44A and 44B, that all conductive pads of the ten most peripheral rows/columns of land pattern 4400 were successfully externally routed on one of the two layers. Thus, it is noted that in certain applications, such as field programmable gate array (FPGA) applications where internal/orphaned power/ground/test pins are not necessary, such a configuration can be very beneficial. As a result, a 20×20 integrated circuit package size can be formed that can have every pad/pin externally routed in the land pattern. In other words, for each side of the land pattern, 10 rows/columns can be completely routed, so that a 20×20 array size can be completely routed. Taking this further, integrated circuit packages can be designed having 20 pads/pins along one dimension (row or column), and having any length in pads/pins along the other dimension, where the entire integrated circuit package can still be completely routed. For example, such an integrated circuit package could have sizes such as 20×20, 20×30, 20×40, and any other 20×N size, and can have all pads/pins routed externally.

Conclusion

Thus, a user and/or computer system can use the above described processes, equations, and/or tables to design arrays/land patterns and via arrangements, according to the various embodiments of present invention. Thus, the present invention is applicable to any type of apparatus or system, manual or automatic, including being stored on a computer program product such as a computer storage device (e.g., hard drive, hard disc, floppy disc, CDROM, etc.). The present invention can be implemented in hardware, software, firmware, and any combination thereof.

While various embodiments of the present invention have been described above, it should be understood that they have been presented by way of example only, and not limitation. For example, in an embodiment, a second non-fully populated row or column of pads/pins may be placed adjacent to a first non-fully populated edge row or column of pads/pins to provide even more routing channels. Furthermore, the present invention allows for standard and for non-standard ball pitch distances in the peripheral rows and columns of pads/pins. It will be apparent to persons skilled in the relevant art(s) that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A ball grid array land pattern comprising:
a plurality of conductive pads arranged in an array of rows and columns,
wherein an edge of a perimeter of said array is not fully populated with conductive pads outside of a corner pad arrangement,
whereby spaces created in said edge by absence of respective conductive pads create additional routing channels to increase a total number of routing channels for signals from conductive pads within said array to be routed external to said array through said edge,
wherein said edge includes an outermost row including a first pattern having a first pad, a space, and a second pad arranged in series that repeats at least once, wherein each repeat of the first pattern in said outermost row is immediately adjacent to a prior instance of the first pattern in said outermost row without an intervening space between said each repeat, and
wherein a second row of said array immediately adjacent and parallel to said outermost row includes a second pattern having a third pad immediately adjacent to said first pad, a fourth pad immediately adjacent to said space, and a fifth pad immediately adjacent to said second pad, said second pattern repeating with said first pattern.

2. The land pattern of claim 1, wherein said corner pad arrangement includes an unusable routing channel to decrease said total number of routing channels for signals from conductive pads within said array to be routed external to said array through said edge.

3. The land pattern of claim 1, wherein said outermost row includes a plurality of serially aligned conductive pads having a number of S spaces therebetween, wherein said number of S spaces is calculated according to $$S=INT((E-(M+N))/3),$$

where:
E=a number of pads in said outermost row, if fully populated;
M=a number of pads along said outermost row in a selected pad arrangement for a corner at a first end of said edge;
N=a number of pads along said outermost row in a selected pad arrangement for a corner at a second end of said edge; and
INT is an INTEGER function, rounded down.

4. The land pattern of claim 1, wherein a ratio of conductive pads in said outermost row to a number of said spaces in said outermost row is at least two to one (2:1).

5. The land pattern of claim 4, wherein one out of every three pad positions in said outermost row outside of the corner pad arrangement is a space.

6. The land pattern of claim 1, wherein a first corner portion of the land pattern has a first pad arrangement, a second corner portion of the land pattern has a second pad arrangement, a third corner portion of the land pattern has a third pad arrangement, and a fourth corner portion of the land pattern has a fourth pad arrangement.

7. A ball grid array land pattern comprising:
a plurality of conductive pads arranged in an array of rows and columns,
wherein an edge includes an outermost row including a first pattern having a first pad, a space created by absence of a corresponding conductive pad, and a second pad arranged in series that repeats at least once, wherein each repeat of the first pattern in said outermost row is immediately adjacent to a prior instance of the first pattern in said outermost row without an intervening space between said each repeat,
wherein a second row of said array immediately adjacent and parallel to said outermost row includes a second pattern having a third pad immediately adjacent to said first pad, a fourth pad immediately adjacent to said space, and a fifth pad immediately adjacent to said second pad, said second pattern repeating with said first pattern.

8. The land pattern of claim 7, wherein said array includes a corner pad arrangement having an unusable routing channel to reduce a number of routing channels for signals from conductive pads in said array to be routed external to said array through said edge.

9. The land pattern of claim 7, wherein said outermost row includes a plurality of serially aligned conductive pads having a number of S spaces therebetween, wherein said number of S spaces is calculated according to $$S=INT((E-(M+N))/3),$$

where:
E=a number of pads in said outermost row, if fully populated;
M=a number of pads along said outermost row in a selected pad arrangement for a corner at a first end of said edge;
N=a number of pads along said outermost row in a selected pad arrangement for a corner at a second end of said edge; and
INT is an INTEGER function, rounded down.

10. The land pattern of claim 7, wherein a ratio of conductive pads in said outermost row to a number of spaces in said outermost row is at least two to one (2:1).

11. The land pattern of claim 10, wherein one out of every three pad positions in said outermost row outside of corner portions of the land pattern is a space.

12. The land pattern of claim 7, wherein a first corner portion of the land pattern has a first pad arrangement, a second corner portion of the land pattern has a second pad arrangement, a third corner portion of the land pattern has a third pad arrangement, and a fourth corner portion of the land pattern has a fourth pad arrangement.

13. A ball grid array land pattern comprising:
a plurality of conductive pads arranged in an array of rows and columns, said array including an array portion between a first corner pad arrangement and a second corner pad arrangement, said array portion having an edge including an outermost row and a second row immediately adjacent and parallel to said outermost row,
wherein said outermost row includes a first pattern having a first pad, a space created by absence of a corresponding conductive pad, and a second pad arranged in series that repeats at least once, wherein each repeat of the first pattern in said outermost row is immediately adjacent to a prior instance of the first pattern in said outermost row without an intervening space between said each repeat,
wherein said second row includes a second pattern having a third pad immediately adjacent to said first pad, a fourth pad immediately adjacent to said space, and a fifth pad immediately adjacent to said second pad, said second pattern repeating with said first pattern.

14. The land pattern of claim 13, wherein at least one of the first and second corner pad arrangements includes an unusable routing channel to decrease a number of routing channels for signals from conductive pads in said array to be routed external to said array through said edge.

15. The land pattern of claim 13, wherein said outermost row includes a plurality of serially aligned conductive pads having a number of S spaces therebetween, wherein said number of S spaces is calculated according to $$S = INT(E/3),$$

where:
E=a number of pads in said outermost row, if fully populated; and
INT is an INTEGER function, rounded down.

16. The land pattern of claim 13, wherein a ratio of conductive pads in said outermost row to a number of spaces in said outermost row is at least two to one (2:1).

17. The land pattern of claim 16, wherein one out of every three pad positions in said outermost row is a space.

18. The land pattern of claim 13, wherein a first corner portion of the land pattern has said first corner pad arrangement, a second corner portion of the land pattern has said second corner pad arrangement, a third corner portion of the land pattern has a third corner pad arrangement, and a fourth corner portion of the land pattern has a fourth corner pad arrangement.

* * * * *